US006323509B1

United States Patent
Kusunoki

(10) Patent No.: US 6,323,509 B1
(45) Date of Patent: Nov. 27, 2001

(54) POWER SEMICONDUCTOR DEVICE INCLUDING A FREE WHEELING DIODE AND METHOD OF MANUFACTURING FOR SAME

(75) Inventor: Shigeru Kusunoki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/334,598

(22) Filed: Jun. 17, 1999

(30) Foreign Application Priority Data

Jan. 7, 1999 (JP) .................................................. 11-001713

(51) Int. Cl.⁷ .................... H01L 29/74; H01L 31/111; H01L 29/76; H01L 29/94; H01L 31/062
(52) U.S. Cl. ........................ 257/146; 257/140; 257/337; 257/341; 257/330
(58) Field of Search ...................... 257/327, 339, 257/341, 337, 329, 330, 331, 334, 140, 146, 168, 173, 149

(56) References Cited

U.S. PATENT DOCUMENTS

| | | | |
|---|---|---|---|
| 4,961,099 | 10/1990 | Roggwiller | 257/149 |
| 5,017,992 | 5/1991 | Roggwiller | 257/149 |
| 5,883,402 | * | 3/1999 | Omura et al. | 257/146 |

FOREIGN PATENT DOCUMENTS 58-219763    12/1983   (JP) ........................................ 257/146

* cited by examiner

Primary Examiner—Steven Loke
(74) Attorney, Agent, or Firm—Oblon, Spivak, McClelland, Maier & Neustadt, P.C.

(57) ABSTRACT

An emitter-side structure (2) is formed at an upper main surface of a silicon substrate (1), and an n-type buffer layer (3) is formed at a lower main surface thereof. A p-type collector layer (4) is formed in a main surface of the n-type buffer layer (3), and an n-type cathode region (6) is selectively formed in spaced apart relation with the p-type collector layer (4). A collector electrode (5p) of metal is formed in contact with the p-type collector layer (4), and a cathode electrode (5n) of metal is formed in contact with the n-type cathode region (6) and part of the n-type buffer layer (3). A diode (13) serving as a current suppressing device is connected between the cathode electrode (5n) and a collector terminal (c). A power semiconductor device including an IGBT and a free wheeling diode is reduced in size, and prevents device breakdown due to current concentration during the operation of the free wheeling diode incorporated in the IGBT.

9 Claims, 43 Drawing Sheets

US 6,323,509 B1

POWER SEMICONDUCTOR DEVICE INCLUDING A FREE WHEELING DIODE AND METHOD OF MANUFACTURING FOR SAME

BACKGROUND OF THE INVENTION

1. Field of the Invention

The present invention relates to a power semiconductor device and a method of manufacturing the same. More particularly, the invention relates to a power semiconductor device for use in an inverter and a method of manufacturing the same.

2. Description of the Background Art

In recent years, motors have gone inverter-driven, for example, in the field of air conditioning in terms of energy saving, and an increasing number of power semiconductor devices for inverters have been produced.

There is an increasing need for such power semiconductor devices not only to reduce power dissipation but also to reduce size and costs in terms of space saving.

A background art power semiconductor device is described below with reference to FIGS. 38 through 43. FIG. 38 is a circuit diagram of a three-phase inverter IV.

As illustrated in FIG. 38, the three-phase inverter IV comprises three inverters IV1 to IV3. The inverter IV1 includes IGBTs (insulated gate bipolar transistors, which are in some cases referred to simply as transistors hereinafter) Q1L and Q1U connected in series between a power supply line P providing a power supply voltage VDD and a power supply line N connected to a ground potential, and free wheeling diodes D1L and D1U connected in inverse-parallel with the transistors Q1L and Q1U, respectively. A connection node between the transistors Q1L and Q1U is connected to a first end of a load LU.

The inverter IV2 is similar in construction to the inverter IV1. Specifically, the inverter IV2 includes transistors Q2L and Q2U connected in series between the power supply lines P and N, and free wheeling diodes D2L and D2U connected in inverseparallel with the transistors Q2L and Q2U, respectively. A connection node between the transistors Q2L and Q2U is connected to a first end of a load LW.

Likewise, the inverter IV3 includes transistors Q3L and Q3U connected in series between the power supply lines P and N, and free wheeling diodes D3L and D3U connected in inverse-parallel with the transistors Q3L and Q3U, respectively. A connection node between the transistors Q3L and Q3U is connected to a first end of a load LV. The loads LU, LV and LW have respective second ends connected together.

In part of the inverter IV1 shown in FIG. 38 which is comprised of the transistor Q1L and the diode D1L, the reference characters E, C and G designate the emitter, collector and gate terminals of the transistor Q1L, respectively. The diode D1L has an anode terminal connected to the emitter terminal E and a cathode terminal connected to the collector terminal C.

A cross-sectional structure of the transistor Q1L and the diode D1L is described with reference to FIG. 39. In the description below, it is assumed that the transistor Q1L is of an n-channel type and the diode D1L is a diode having a p-type anode formed on an n-type semiconductor substrate.

As illustrated in FIG. 39, the transistor Q1L includes a p-type base region 8 formed in an upper main surface of an n-type silicon substrate 1T, and a plurality of trench-type gate electrodes 11 arranged in parallel and each extending through the p-type base region 8 in the direction of the depth thereof. A plurality of p-type semiconductor regions 12 containing a p-type impurity of a relatively high concentration are selectively formed in the surface of the p-type base region 8 in such a manner that each lies between adjacent two of the gate electrodes 11. The p-type semiconductor regions 12 are provided for the purpose of making a satisfactory electric connection between the p-type base region 8 and emitter electrodes 19.

A plurality of n-type emitter regions 9 containing an n-type impurity of a relatively high concentration are formed on the opposite sides of the respective p-type semiconductor regions 12. The n-type emitter regions 9 are designed to contact respective gate insulation films (not shown) formed on the surface of the gate electrodes 11. The silicon substrate 1T serves herein as an n-type base layer of the IGBT.

The emitter electrodes 19 formed partially on the surface of the n-type emitter regions 9 are electrically connected to the emitter terminal E. The gate electrodes 11 are electrically connected to the gate terminal G. A plurality of parallel-connected IGBT structures constitute the transistor Q1L A region in which the p-type base region 8, the n-type emitter regions 9 and the gate electrodes 11 are formed is referred to hereinafter as a cell region 2TC.

A plurality of p-type semiconductor regions 28 at a floating potential are arranged concentrically so as to surround the cell region 2TC, to define an electric field relieving ring region 2TG. The structure of the cell region 2TC and the electric field relieving ring region 2TG is generically referred to as an emitter-side structure 2.

An n-type buffer layer 3a is formed on a lower main surface of the silicon substrate 1T. A p-type collector layer 4 is formed on the surface of the n-type buffer layer 3a, and a collector electrode 5a of metal is formed on the surface of the p-type collector layer 4.

FIG. 40 is a plan view of the transistor Q1L as viewed from above the emitter electrode. As illustrated in FIG. 40, the transistor Q1L is formed on a rectangular board, and is configured such that the rectangular electric field relieving ring region 2TG surrounds the rectangular cell region 2TC. An n-type semiconductor region 27 at a floating potential is formed to surround the electric field relieving ring region 2TG.

In the cell region 2TC, a plurality of gate lines GL are arranged in parallel, and are connected at their respective ends to a gate ring region GR defining the outer periphery of the cell region 2TC. All of the gate lines GL are at a common potential. A gate pad GP is partially provided for electric connection between the gate lines GL and the exterior.

The spaces between the gate lines GL are covered with the emitter electrodes 19, and an upper emitter electrode 190 for making electric connections between the emitter electrodes 19 covers the emitter electrodes 19. For purposes of illustration, the upper emitter electrode 190 is shown with parts broken away in FIG. 40.

The cross-section of the transistor Q1L shown in FIG. 39 is a cross-section taken along the line A—A of FIG. 40. The gate electrodes 11 shown in FIG. 39 are only some of a plurality of gate electrodes 11 arranged longitudinally of the gate lines GL and each extending perpendicularly to the length of the gate lines GL.

Referring again to FIG. 39, the diode D1L includes a p-type anode layer 29 formed in an upper main surface of an n-type silicon substrate 1D. A anode electrode not shown is formed on the surface of the anode layer 29, and is electrically connected to the emitter terminal E. A region in which the anode layer 29 and the anode electrode are formed is referred to as an anode region 2DA.

A plurality of p-type semiconductor regions 28 at a floating potential are arranged concentrically so as to surround the anode region 2DA, to define an electric field relieving ring region 2DG. The structure of the anode region 2DA and the electric field relieving ring region 2DG is generically referred to as an anode-side structure 2D.

An n-type buffer layer 3b is formed on a lower main surface of the silicon substrate 1D. An n-type semiconductor layer 6 containing an n-type impurity of a relatively high concentration is formed on the surface of the n-type buffer layer 3b, and a cathode electrode 5b of metal is formed on the surface of the n-type semiconductor layer 6. The cathode electrode 5b is electrically connected to the collector terminal C.

The n-type semiconductor layer 6 is a layer for providing an ohmic contact between the cathode electrode 5b and the n-type buffer layer 3b. The silicon substrate 1D is a layer corresponding to an "i" (intrinsic) layer of the pin diode.

FIG. 41 is a plan view of the diode D1L as viewed form above the anode electrode. As illustrated in FIG. 41, the diode D1L is formed on a rectangular board, and is configured such that the rectangular electric field relieving ring region 2DG surrounds the rectangular anode region 2DA. An n-type semiconductor region 27 at a floating potential is formed to surround the electric field relieving ring region 2DG.

The cross-section of the diode D1L shown in FIG. 39 is a cross-section taken along the line B—B of FIG. 41. The anode layer 29 shown in FIG. 39 is only part of the actual anode layer 29.

As stated above, an arrangement having two devices arranged in parallel, i.e., the IGBT and the free wheeling diode which are formed separately has been employed to provide the three-phase inverter IV. Such an arrangement is disadvantageous in the increased module area of the three-phase inverter.

To overcome the disadvantage, an arrangement has been developed in which a free wheeling diode is incorporated in an IGBT. The arrangement in which the free wheeling diode is incorporated in the IGBT is discussed below with reference to FIGS. 42 and 43.

FIG. 42 is a cross-sectional view of an IGBT 90 with a free wheeling diode incorporated therein. The IGBT 90 is similar in basic construction to the transistor Q1L described with reference to FIG. 39. Like reference characters are used to designate parts identical with those of FIG. 39, and a repetition of description will be avoided. An emitter-side structure 2 shown in FIG. 42 corresponds to the emitter-side structure 2 of FIG. 39, and both of them are substantially identical. The silicon substrate is shown in FIG. 39 is referred to hereinafter as an n-type base layer 1.

The IGBT 90 includes an n-type buffer layer 3; a p-type collector layer 4 selectively formed in a main surface of the n-type buffer layer 3 in corresponding relation to a region in which the p-type base region 8 is formed (i.e., the cell region 2TC shown in FIG. 39); an n-type cathode region 6 selectively formed so as to surround the p-type collector layer 4 in spaced apart relation to the p-type collector layer 4; and a collector electrode 5 of metal in contact with the n-type buffer layer 3, the p-type collector layer 4 and the n-type cathode region 6.

Two current paths (a) and (b) shown in FIG. 42 are described in detail with reference to FIG. 43.

FIG. 43 shows part of the plurality of IGBT structures which includes two gate electrodes 11. The gate insulation films 10 which are not shown in FIGS. 39 and 42 are shown in FIG. 43. The gate insulation films 10 are formed to surround the respective gate electrodes 11. Application of a predetermined potential to the gate electrodes 11 inverts the conductivity type of part of the p-type base region 8 adjacent to the gate insulation films 10 to form a channel between the n-type emitter regions 9 and the n-type base layer 1.

As illustrated in FIG. 43, the current path (a) includes the emitter electrode 19, the p-type semiconductor region 12, the p-type base region 8, the n-type base layer 1, the n-type buffer layer 3, the n-type cathode region 6, and the collector electrode 5. The current path (b) includes the collector electrode 5, the p-type collector layer 4, the n-type buffer layer 3, the n-type base layer 1, the p-type base region 8, the n-type emitter region 9, and the emitter electrode 19.

Thus, two IGBT structures are arranged in parallel along the current path (b), and a free-wheeling diode parasitic upon the IGBT is present along the current path (a). Although the structure for constituting the current path (a) and the structure for constituting the current path (b) are shown separately for purposes of illustration in FIG. 43, both of the structures are common for the most part.

The operation of the IGBT 90 is described below. When a negative voltage is applied to the collector terminal C, a pn junction comprised of the p-type collector layer 4 and the n-type buffer layer 3 does not allow current to flow along the current path (b), but current flows along the current path (a) to bring about a diode operation.

However since the collector electrode 5, the n-type buffer layer 3, the n-type base layer 1 and the emitter-side structure 2 are common to the current paths (a) and (b), when a positive voltage is applied to the collector terminal C, a current path (c) extending from the collector electrode 5 through the n-type cathode region 6 to the n-type buffer layer 3 is formed to increase the potential of the n-type buffer layer 3, making it difficult for a voltage Vx between the n-type buffer layer 3 and the p-type collector layer 4 to reach a voltage high enough to cause conductivity modulation. As a result, the IGBT so constructed does not act as an IGBT but acts as a MOS field effect transistor (MOS transistor).

To avoid such an erroneous action, it is necessary to decrease the area of the n-type cathode region 6 and part of the n-type buffer layer 3 which constitute the free wheeling diode and to increase the area of the p-type collector layer 4, thereby decreasing a current ix flowing through a resistor Rx.

However, the decrease in the area of the n-type cathode region 6 (and the part of the n-type buffer layer 3) increases a forward voltage Vf of the free wheeling diode during the operation of the constituents of the current path (a), i.e., the free wheeling diode, and causes an on-state current and a recovery current of the free wheeling diode to concentrate on the n-type cathode region 6 (and the part of the n-type buffer layer 3) to increase a current density, which might result in device breakdown.

The background art inverter has been constructed such that two separately formed devices, i.e. the IGBT and the free wheeling diode, are arranged in parallel or such that the free wheeling diode is incorporated in the IGBT. The former has the disadvantage of increasing the module area of the inverter. The latter is disadvantageous in that turning on the IGBT requires as small the area of the n-type cathode region 6 as possible for suppression of the increase in potential of the n-type buffer layer 3, resulting in a strong likelihood of the device breakdown due to current concentration during the operation of the free wheeling diode.

SUMMARY OF THE INVENTION

According to a first aspect of the present invention, a power semiconductor device comprises: a first semiconductor layer of a first conductivity type; an assembly of units including a first semiconductor region of a second conductivity type selectively formed in a first main surface of the first semiconductor layer, a second semiconductor region of the first conductivity type selectively formed in a surface of the first semiconductor region, a gate insulation film formed in contact with at least the surface of the first semiconductor region between the second semiconductor region and the first semiconductor layer, and a gate electrode formed on the gate insulation film; a first main electrode formed in contact with at least the second semiconductor region; a second semiconductor layer of the second conductivity type selectively formed in a second main surface of the first semiconductor layer in corresponding relation to a region in which the assembly of units is formed; a second main electrode formed in contact with a surface of the second semiconductor layer; and a current suppressing device for suppressing a main current flowing into the first semiconductor layer around the second semiconductor layer under a predetermined condition when a voltage is applied to the gate electrode so as to form a channel in the first semiconductor region.

Preferably, according to a second aspect of the present invention, in the power semiconductor device of the first aspect, the current suppressing device includes a pn junction diode, the pn junction diode including a second conductivity type semiconductor layer electrically connected to the first semiconductor layer around the second semiconductor layer, and a first conductivity type semiconductor layer electrically connected to the second main electrode. The predetermined condition includes a condition that a voltage applied to the second main electrode is greater than a voltage applied to the first main electrode.

Preferably, according to a third aspect of the present invention, in the power semiconductor device of the second aspect, the pn junction diode includes: a second conductivity type semiconductor layer formed on a region in which the first semiconductor layer around the second semiconductor layer is formed; and a first conductivity type semiconductor layer formed on at least the second conductivity type semiconductor layer.

Preferably, according to a fourth aspect of the present invention, in the power semiconductor device of the first aspect, the current suppressing device includes a Schottky diode, the Schottky diode including: a semiconductor layer of the second conductivity type formed on a metal electrode formed on the first semiconductor layer around the second semiconductor layer; and a metal layer formed in contact with the second main electrode and the semiconductor layer, the metal layer being made of a material for Schottky connection to the semiconductor layer. The predetermined condition includes a condition that a voltage applied to the second main electrode is greater than a voltage applied to the first main electrode.

Preferably, according to a fifth aspect of the present invention, in the power semiconductor device of the first aspect, the current suppressing device includes a Schottky diode, the Schottky diode including: a semiconductor layer of the second conductivity type formed on a metal electrode formed on the first semiconductor layer around the second semiconductor layer; and a metal layer, the metal layer being used also as the second main electrode, the metal layer being formed in contact with the second semiconductor layer and the semiconductor layer, the metal layer being made of a material for ohmic connection to the second semiconductor layer and for Schottky connection to the semiconductor layer. The predetermined condition includes a condition that a voltage applied to the second main electrode is greater than a voltage applied to the first main electrode.

Preferably, according to a sixth aspect of the present invention, in the power semiconductor device of the fifth aspect, the semiconductor layer is made of a semiconductor material having a greater electron affinity than silicon.

Preferably, according to a seventh aspect of the present invention, in the power semiconductor device of the first aspect, the current suppressing device includes a MOS transistor, the MOS transistor including a gate electrode, a first main electrode electrically connected to the first semiconductor layer around the second semiconductor layer, and a second main electrode electrically connected to the second main electrode. A voltage applied to the gate electrode and a voltage applied to the gate electrode of the MOS transistor complementarily turn on the gate electrode and the gate electrode of the MOS transistor.

Preferably, according to an eighth aspect of the present invention, the power semiconductor device of the first aspect further comprises: a first lifetime setting region formed in a region extending in a direction of the thickness of the first semiconductor layer from a region in which the first semiconductor layer around the second semiconductor layer is formed; and a second lifetime setting region formed in the first semiconductor layer adjacent the second semiconductor layer in corresponding relation to a region in which the second semiconductor layer is formed, wherein a carrier lifetime in the first and second lifetime setting regions is shorter than a carrier lifetime in the first semiconductor layer.

Preferably, according to a ninth aspect of the present invention, in the power semiconductor device of the eighth aspect, the carrier lifetime in the second lifetime setting region is shorter than that in the first lifetime setting region.

According to a tenth aspect of the present invention, a power semiconductor device comprises: a first semiconductor layer of a first conductivity type; a first assembly of units including a first semiconductor region of a second conductivity type selectively formed in a first main surface of the first semiconductor layer, a second semiconductor region of the first conductivity type selectively formed in a surface of the first semiconductor region, a first gate insulation film formed in contact with at least the surface of the first semiconductor region between the second semiconductor region and the first semiconductor layer, and a first gate electrode formed on the first gate insulation film; a second assembly of units including a third semiconductor region of the second conductivity type selectively formed in a second main surface of the first semiconductor layer, a fourth semiconductor region of the first conductivity type selectively formed in a surface of the third semiconductor region, a second gate insulation film formed in contact with at least the surface of the third semiconductor region between the fourth semiconductor region and the first semiconductor layer, and a second gate electrode formed on the second gate insulation film; a first main electrode formed in contact with at least the second semiconductor region; and a second main electrode formed in contact with at least the fourth semiconductor region.

Preferably, according to an eleventh aspect of the present invention, the power semiconductor device of the tenth aspect further comprises a lifetime setting region positioned closer to the second assembly of units than the middle of the thickness of the first semiconductor layer and having a width corresponding to at least the width of a region in which the first and second assemblies of units are formed, wherein a carrier lifetime in the lifetime setting region is shorter than a carrier lifetime in the first semiconductor layer.

Preferably, according to a twelfth aspect of the present invention, in the power semiconductor device of the eleventh aspect, the first semiconductor layer is divided into a first part closer to the first assembly of units and a second part closer to the second assembly of units, and the first and second parts are different from each other in at least one of crystal plane orientation and crystal axis orientation. The lifetime setting region serves as a boundary region between the first and second parts of the first semiconductor layer.

Preferably, according to a thirteenth aspect of the present invention, in the power semiconductor device of the tenth aspect, the first semiconductor layer is divided into a first part extending from a predetermined position closer to the second assembly of units than the middle of the thickness of the first semiconductor layer to the second assembly of units and a second part closer to the first assembly of units, and a carrier lifetime in the first part is shorter than a carrier lifetime in the second part.

Preferably, according to a fourteenth aspect of the present invention, the power semiconductor device of the tenth aspect further comprises one of a metal layer and a third semiconductor layer of the first conductivity type which are positioned closer to the second assembly of units than the middle of the thickness of the first semiconductor layer and which have a width corresponding to at least the width of a region in which the first and second assemblies of units are formed, the third semiconductor layer being higher in concentration than the first semiconductor layer.

According to a fifteenth aspect of the present invention, a power semiconductor device comprises: a first conductivity type semiconductor layer; a second conductivity type semiconductor layer selectively formed in a first main surface of the first conductivity type semiconductor layer; first electric field relieving means for relieving an electric field in the first conductivity type semiconductor layer around the second conductivity type semiconductor layer; an electrode layer selectively formed on a second main surface of the first conductivity type semiconductor layer; and second electric field relieving means for relieving an electric field in the first conductivity type semiconductor layer outside the electrode layer.

Preferably, according to a sixteenth aspect of the present invention, the power semiconductor device of the fifteenth aspect further comprises: a first semiconductor region of a first conductivity type selectively formed in the first main surface of the first conductivity type semiconductor layer outside the first electric field relieving means; a second semiconductor region of the first conductivity type selectively formed in the second main surface of the first conductivity type semiconductor layer outside the second electric field relieving means; and a third semiconductor region of the first conductivity type selectively formed on a side surface of the first conductivity type semiconductor layer.

Preferably, according to a seventeenth aspect of the present invention, in the power semiconductor device of the sixteenth aspect, the first electric field relieving means includes a plurality of first ring regions of a second conductivity type arranged concentrically in ring-like form in the first main surface of the first conductivity type semiconductor layer. The second electric field relieving means includes a plurality of second ring regions of the second conductivity type arranged concentrically in ring-like form in the second main surface of the first conductivity type semiconductor layer. The plurality of first ring regions and the plurality of second ring regions are spaced at outwardly increasing intervals.

An eighteenth aspect of the present invention is intended for a method of manufacturing a power semiconductor device. According to the present invention, the method comprises the steps of: (a) forming a first assembly of units, the step (a) including the steps of preparing a first semiconductor substrate of a first conductivity type, selectively forming a first semiconductor region of a second conductivity type in a first main surface of the first semiconductor substrate, selectively forming a second semiconductor region of the first conductivity type in a surface of the first semiconductor region, forming a first gate insulation film in contact with at least the surface of the first semiconductor region between the second semiconductor region and the first semiconductor substrate, and forming a first gate electrode on the first gate insulation film; (b) forming a second assembly of units, the step (b) including the steps of preparing a second semiconductor substrate of the first conductivity type, selectively forming a third semiconductor region of the second conductivity type in a first main surface of the second semiconductor substrate, selectively forming a fourth semiconductor region of the first conductivity type in a surface of the third semiconductor region, forming a second gate insulation film in contact with at least the surface of the third semiconductor region between the fourth semiconductor region and the second semiconductor substrate, and forming a second gate electrode on the second gate insulation film; and (c) joining a second main surface of the first semiconductor substrate and a second main surface of the second semiconductor substrate together by a bonding technique.

A nineteenth aspect of the present invention is also intended for a method of manufacturing a power semiconductor device. According to the present invention, the method comprises the steps of: (a) preparing a first semiconductor substrate of a first conductivity type, selectively forming a second conductivity type semiconductor layer in a first main surface of the first semiconductor substrate, and forming first electric field relieving means for relieving an electric field in the first semiconductor substrate around the second conductivity type semiconductor layer; (b) preparing a second semiconductor substrate of the first conductivity type, and forming second electric field relieving means for relieving an electric field in the second semiconductor substrate outside an electrode layer to be formed on a first main surface of the second semiconductor substrate; and (c) joining a second main surface of the first semiconductor substrate and a second main surface of the second semiconductor substrate together by a bonding technique.

In accordance with the first aspect of the present invention, the power semiconductor device comprises the current suppressing device for suppressing the main current flowing into the first semiconductor layer around the second semiconductor layer under the predetermined condition. The power semiconductor device designed to incorporate therein a free wheeling diode including the first semiconductor region and the first semiconductor layer can suppress the main current flowing from the second main electrode into the first semiconductor layer during the operation of an IGBT including the gate electrode, the gate insulation film, the second semiconductor region, the first semiconductor region, the first semiconductor layer and the second semiconductor layer, to prevent the increase in potential of the first semiconductor layer for the operation of the IGBT. Further, the connection of the current suppressing device eliminates the need to reduce the area of the first semiconductor layer around the second semiconductor layer, thereby preventing device breakdown due to current concentration during the operation of the free wheeling diode.

In accordance with the second aspect of the present invention, the power semiconductor device uses the pn junction diode as the current suppressing device. This suppresses the main current flowing from the second main electrode into the first semiconductor layer when the voltage applied to the second main electrode is greater than the voltage applied to the first main electrode during the operation of the IGBT, to prevent the increase in the potential of the first semiconductor layer for the operation of the IGBT.

In accordance with the third aspect of the present invention, the power semiconductor device employs the incorporated pn junction diode to reduce a device area as compared with a power semiconductor device employing a separately provided diode.

In accordance with the fourth aspect of the present invention, the power semiconductor device uses the Schottky diode as the current suppressing device, to require the semiconductor layers the number of which is less by one than that employing the pn junction diode. This simplifies a method of manufacturing the power semiconductor device and reduces manufacturing costs.

In the power semiconductor device in accordance with the fifth aspect of the present invention, the second main electrode is used also as the metal layer of the Schottky diode. This further simplifies the construction and the manufacturing method thereof and further reduces the manufacturing costs.

In the power semiconductor device in accordance with the sixth aspect of the present invention, the semiconductor layer of the Schottky diode is made of the semiconductor material having a greater electron affinity than silicon to ensure the Schottky connection to the metal layer.

In accordance with the seventh aspect of the present invention, the power semiconductor device uses the MOS transistor as the current suppressing device and makes the setting so that the gate electrode and the gate electrode of the MOS transistor operate complementarily. Thus, the power semiconductor device can suppress the main current flowing from the second main electrode into the first semiconductor layer when the voltage which turns on the gate electrode is applied thereto, to prevent the increase in the potential of the first semiconductor layer for operation of the IGBT.

In the power semiconductor device in accordance with the eighth aspect of the present invention, the first lifetime setting region is a region on which the current paths of the free wheeling diode of the respective units are concentrated, and the second lifetime setting region is a region included in the current paths of the IGBT of the respective units. Therefore, the total power consumption is optimized which is the sum of the power consumption during the IGBT operation and the power consumption during the diode operation.

In the semiconductor device according to the ninth aspect of the present invention, a substantially optimum carrier lifetime distribution may be set independently for the IGBT and the free wheeling diode incorporated therein.

In accordance with the tenth aspect of the present invention, the power, semiconductor device may have a structure incorporating therein the IGBT and the free wheeling diode by applying complementary signals to the first and second gate electrodes, and allows the completely independent operations of the IGBT and the free wheeling diode. This eliminates the problem that the presence of the free wheeling diode does not cause the IGBT operation but causes the MOS transistor operation.

In the power semiconductor device in accordance with the eleventh aspect of the present invention, the presence of the lifetime setting region having a shorter carrier lifetime than the first semiconductor layer suppresses the injection of holes from the collector during the operation of the IGBT to reduce energy dissipation caused by switching.

In accordance with the twelfth aspect of the present invention, the power semiconductor device achieves a simple and convenient structure for providing the lifetime setting region.

In the power semiconductor device in accordance with the thirteenth aspect of the present invention, when the power semiconductor device acts as the IGBT, the presence of the part of the first semiconductor layer which is closer to the second assembly of units and has a shorter carrier lifetime suppresses the injection of holes from the collector during the IGBT operation, to reduce the energy dissipation caused by switching.

In the power semiconductor device in accordance with the fourteenth aspect of the present invention, when the power semiconductor device acts as the IGBT, the presence of the metal layer or the third semiconductor layer decreases an on-state voltage.

In the power semiconductor device in accordance with the fifteenth aspect of the present invention, the presence of the second electric field relieving means decreases, the voltage applied to the first electric field relieving means to reduce the size of the region in which the first electric field relieving means is formed. This accomplishes the reduction in size and costs of the power semiconductor device.

In the power semiconductor device in accordance with the sixteenth aspect of the present invention, the presence of the first to third semiconductor regions completely prevents a depletion layer from extending to the side surface of the substrate.

In accordance with the seventeenth aspect of the present invention, the power semiconductor device can efficiently relieve the electric field.

In accordance with the eighteenth aspect of the present invention, the method provides the power semiconductor device of the twelfth aspect in simple and reliable manner.

In accordance with the nineteenth aspect of the present invention, the method provides the power semiconductor device of the fifteenth aspect in simple and reliable manner.

It is therefore an object of the present invention to provide a power semiconductor device including an IGBT and a free wheeling diode, which is reduced in size and which prevents device breakdown due to current concentration during the operation of the free wheeling diode incorporated in the IGBT.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Preferred Embodiment>

<A-1. Device Construction>

Figure 1:
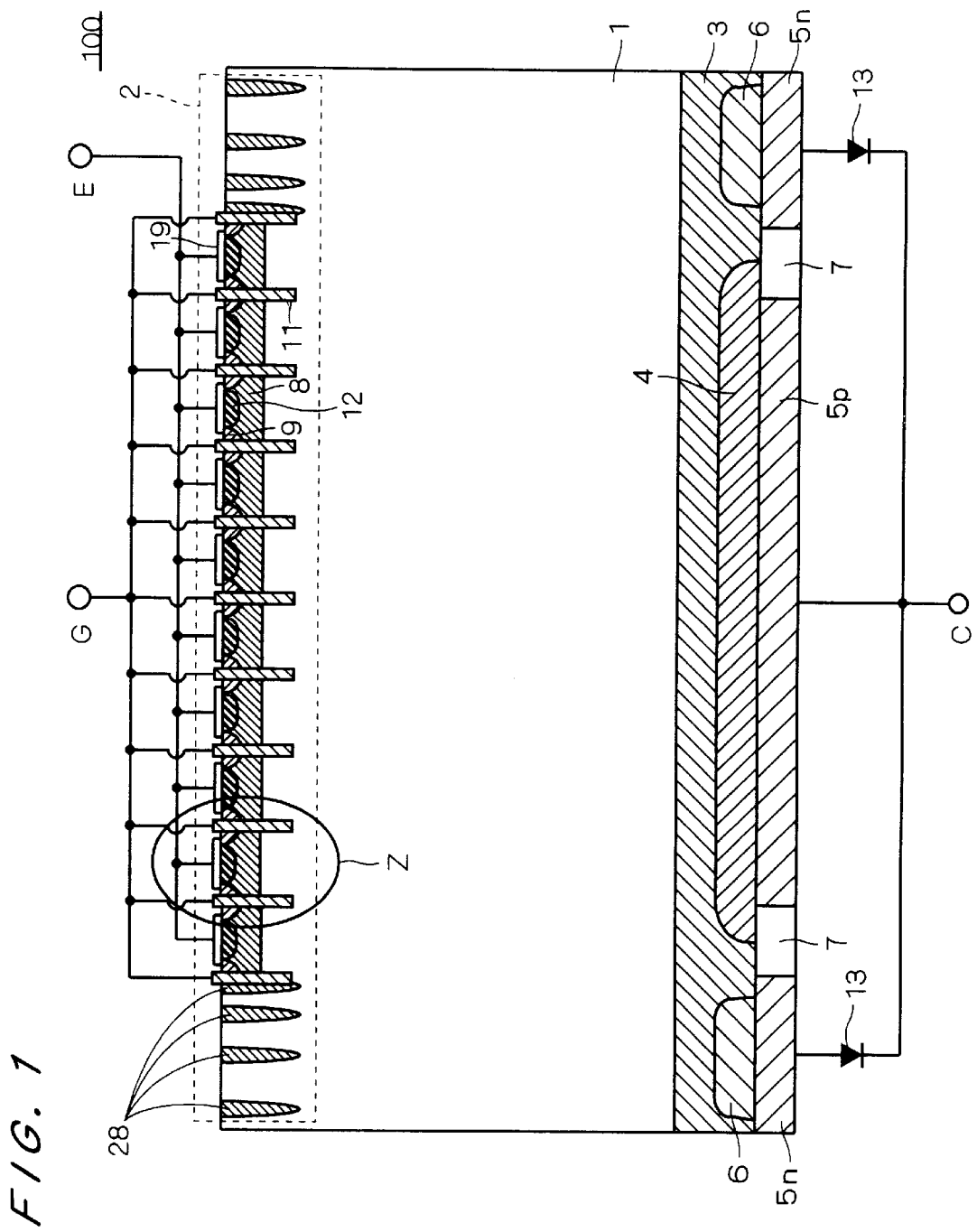
FIG. 1 illustrates a power semiconductor device according to a first preferred, embodiment of the present invention.
Figure 2:
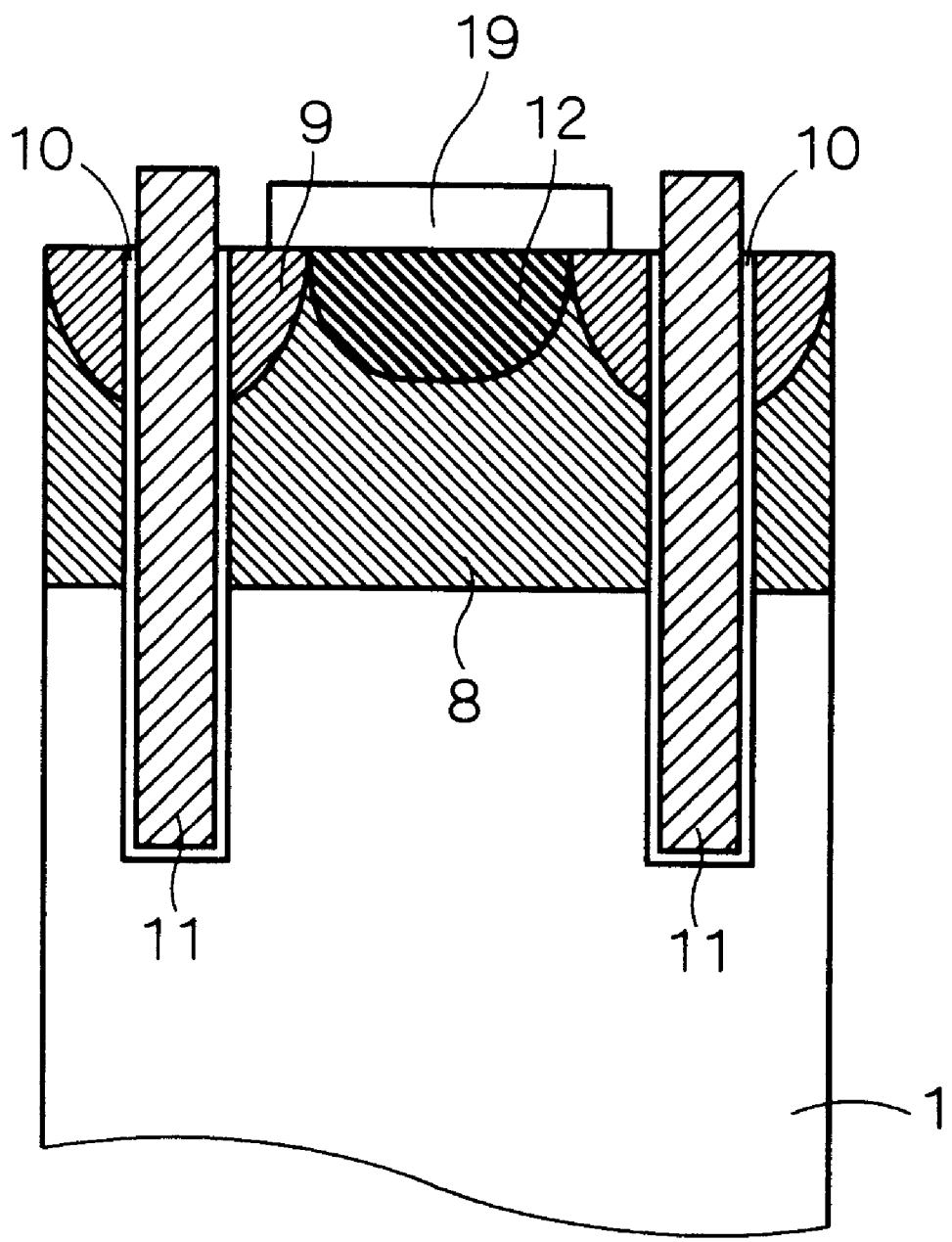
FIG. 2 is a detail view of the power semiconductor device according to the first preferred embodiment of the present invention.

A power semiconductor device according to a first preferred embodiment of the present invention will now be described with reference to FIGS. 1 through 4. FIG. 1 is an overall view in cross-section of an IGBT 100 with a free wheeling diode incorporated therein. FIG. 2 is a detail view of a region Z shown in FIG. 1.

The IGBT 100 is of an n-channel type and, as shown in FIGS. 1 and 2, comprises: a p-type base region 8 formed in an upper main surface of an n-type silicon substrate 1 (also referred to as an n-type base layer 1) and having an impurity concentration on the order of $1 \times 10^{16}$ to $1 \times 10^{19}/\text{cm}^3$; a plurality of trench-type gate electrodes 11 arranged in parallel and each extending through the p-type base region 8 in the direction of the depth thereof; a gate insulation film 10 formed around each of the gate electrodes 11; and a plurality of p-type semiconductor regions 12 containing a p-type impurity of a relatively high concentration (on the order of $1 \times 10^{19}$ to $1 \times 10^{21}/\text{cm}^3$) and selectively formed in the surface of the p-type base region 8 in such a manner that each lies between adjacent two of the gate electrodes 11. The p-type semiconductor regions 12 are provided for the purpose of making a satisfactory electric connection between the p-type base region 8 and emitter electrodes 19 to be described later.

A plurality of n-type emitter regions 9 containing an n-type impurity of a relatively high concentration (on the order of $1 \times 10^{18}$ to $1 \times 10^{21}/\text{cm}^3$) are formed on the opposite sides of the respective p-type semiconductor regions 12. The n-type emitter regions 9 are designed to contact the respective gate insulation films 10 formed on the surface of the gate electrodes 11. The silicon substrate 1 serves as an n-type base layer of the IGBT.

A plurality of emitter electrodes 19 are formed on the surface of the n-type emitter regions 9 and are electrically connected to an emitter terminal E. The gate electrodes 11 are electrically connected to a gate terminal G. A plurality of IGBT structures connected in parallel constitute the IGBT 100.

A plurality of p-type semiconductor regions 28 at a floating potential and containing a p-type impurity of a concentration on the order of $1 \times 10^{17}$ to $1 \times 10^{20}/\text{cm}^3$ are arranged concentrically to surround the p-type base region 8.

A group of structures including the p-type base region 8, the n-type emitter regions 9, the gate electrodes 11 and the p-type semiconductor regions 28 are generically referred to as an emitter-side structure 2 (an assembly of units).

An n-type buffer layer 3 having an impurity concentration on the order of $1 \times 10^{17}$ to $1 \times 10^{19}/\text{cm}^3$ is formed on a lower main surface of the silicon substrate 1. A p-type collector layer 4 having an impurity concentration on the order of $1 \times 10^{17}$ to $1 \times 10^{21}/\text{cm}^3$ is selectively formed in a main surface of the n-type buffer layer 3 in substantially corresponding relation to a region wherein the p-type base region 8 is formed. An n-type cathode region 6 having an impurity concentration on the order of $1 \times 10^{17}$ to $1 \times 10^{21}/\text{cm}^3$ is selectively formed to surround the p-type collector layer 4 in spaced apart relation to the p-type collector layer 4. The p-type collector layer 4 and the n-type cathode region 6 are spaced apart from the silicon substrate 1.

A collector electrode 5p of metal is formed in contact with the p-type collector layer 4. A cathode electrode 5n of metal (i.e., a cathode electrode of the free wheeling diode incorporated in the IGBT) is formed in contact with the n-type cathode region 6 and part of the n-type buffer layer 3. An insulation layer 7 is formed between the collector electrode 5p and the cathode electrode 5n.

A diode 13 serving as a current suppressing device is connected between the cathode electrode 5n and a collector terminal C, and has an anode connected to the cathode electrode 5n and a cathode connected to the collector terminal C.

<A-2. Operation>

The operation of the IGBT 100 is described hereinafter.

First, when a negative voltage (which means a negative voltage relative to a voltage applied to the emitter terminal) is applied to the collector terminal C, current flows from the emitter terminal E through the emitter electrodes 19, the p-type semiconductor regions 12, the p-type base region 8, the n-type base layer 1, the n-type buffer layer 3, the n-type cathode region 6, the cathode electrode 5n and the externally connected diode 13 to the collector terminal C.

In other words, when the negative voltage is applied to the collector terminal C, the incorporated diode (free wheeling diode) including the p-type semiconductor regions 12, the p-type base region 8, the n-type base layer 1, the n-type buffer layer 3 and the n-type cathode region 6, and the diode 13 externally connected in series through the cathode electrode 5n are forward biased to operate using the emitter terminal E as an anode terminal and the collector terminal C as a cathode terminal.

When the negative voltage applied to the collector terminal C increases to exceed the breakdown voltage of a pn junction formed by the p-type collector layer 4 and the n-type buffer layer 3, which is known as a breakdown reverse voltage, or when a leakage current flows through the pn junction, there is a current flow also along a path extending through the n-type buffer layer 3, the p-type collector layer 4 and the collector electrode 5p to the collector terminal C.

On the other hand, when a positive voltage (which means a positive voltage relative to the voltage applied to the emitter terminal) is applied to the collector terminal C and the voltage at the gate terminal G is an off-state potential, voltage is held by the pn junction between the p-type base region 8 and the n-type base layer 1, and current is cut off by a depletion layer.

When the voltage at the gate terminal G is changed to an on-state voltage with the positive voltage applied to the collector terminal C, current flows from the collector terminal C through the collector electrode 5p, the p-type collector layer 4, the n-type buffer layer 3, the n-type base layer 1, the channel in the p-type base region 8, the n-type emitter regions 9 and the emitter electrodes 19 to the emitter terminal E.

Figure 43:
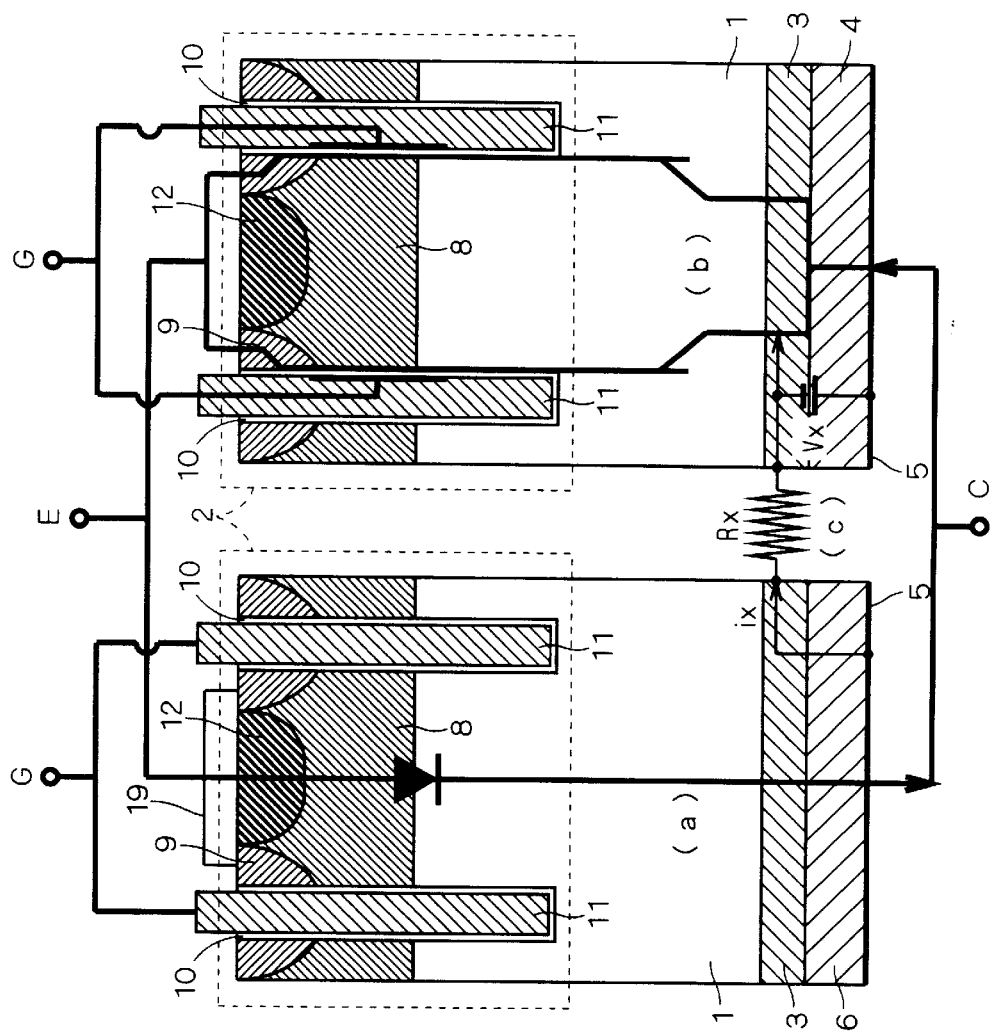
FIG. 43 illustrates the detailed operation of the background art power semiconductor device.

With the positive potential applied to the collector terminal C, the current path extending from the cathode electrode 5n through the n-type cathode region 6 to the n-type buffer layer 3 (i.e. the current ix shown in FIG. 43) is cut off by the externally connected diode 13. Therefore, if the voltage applied to the collector terminal C is lower than that for the background art power semiconductor device, the voltage between the n-type buffer layer 3 and the p-type collector layer 4 (i.e. the voltage Vx shown in FIG. 43) is high enough to cause conductivity modulation.

Therefore, when the positive voltage is applied to the collector terminal C, the GBT is prevented from acting as a MOS field effect transistor (MOS transistor) and may be operated at a low on-state voltage.

The externally connected diode 13 suppresses a current flow through the cathode electrode 5n when the positive voltage is applied to the collector terminal C, and a high voltage is not applied to the diode 13 in operation. Specifically, when the positive voltage is applied to the collector terminal C, a forward voltage is applied to the p-type collector layer 4 of the IGBT 100 to cause the voltage of the n-type buffer layer 3 to approximately equal the applied voltage. Therefore, the breakdown voltage of the diode 13 is required to be equivalent to the difference between the applied voltage and the voltage of the n-type buffer layer 3.

Consequently, the decrease in forward voltage and the increase in current density are achieved to reduce the chip area of the diode 13.

Although two diodes 13 are shown as provided in FIG. 1, the single diode 13 is sufficient in practice since the n-type cathode region 6 is formed to surround the p-type collector layer 4 when viewed in plan view.

Figure 3:
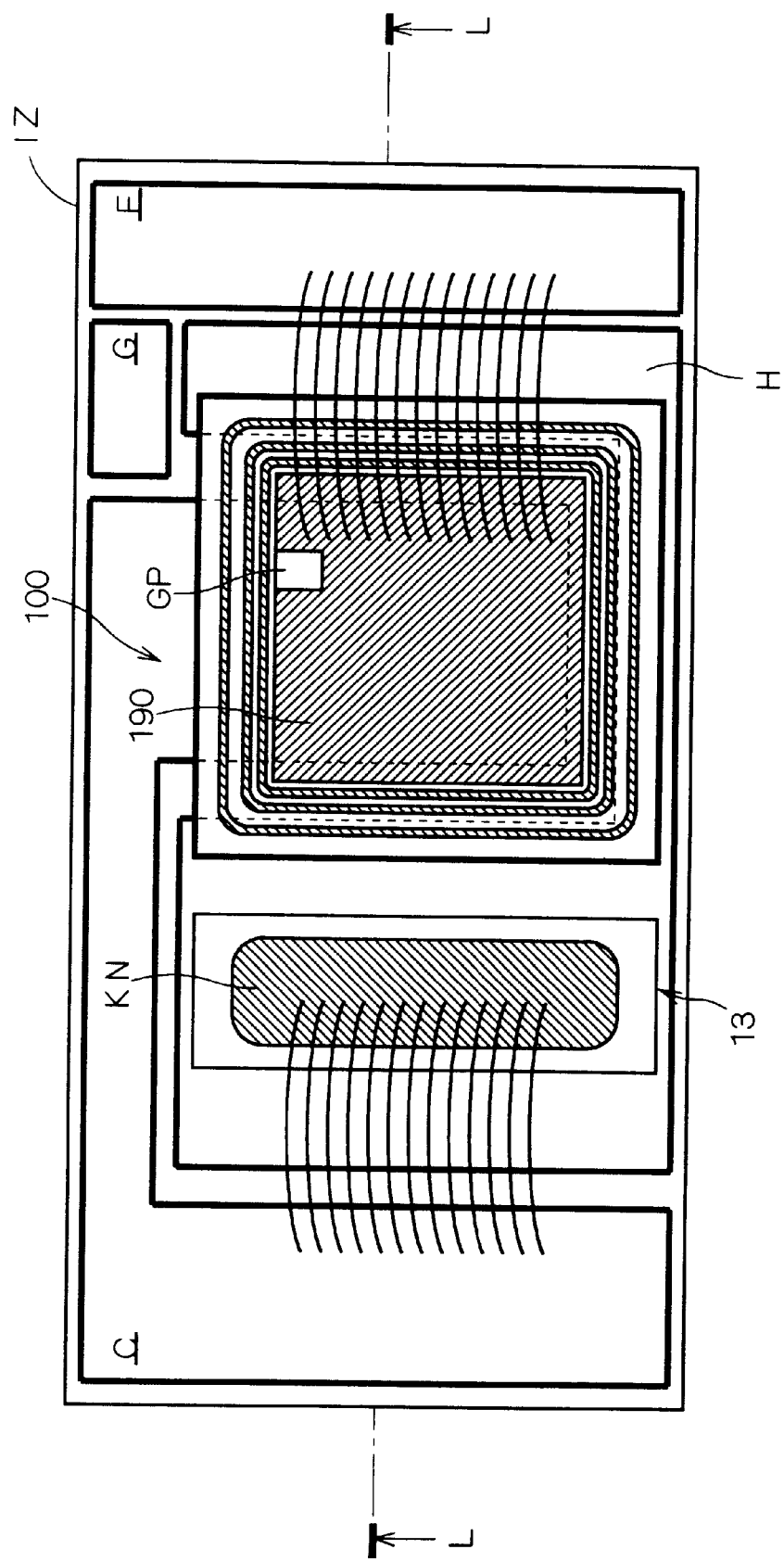
FIGS. 3 and 4 are outside views of the power semiconductor device according to the first preferred embodiment of the present invention.
Figure 4:
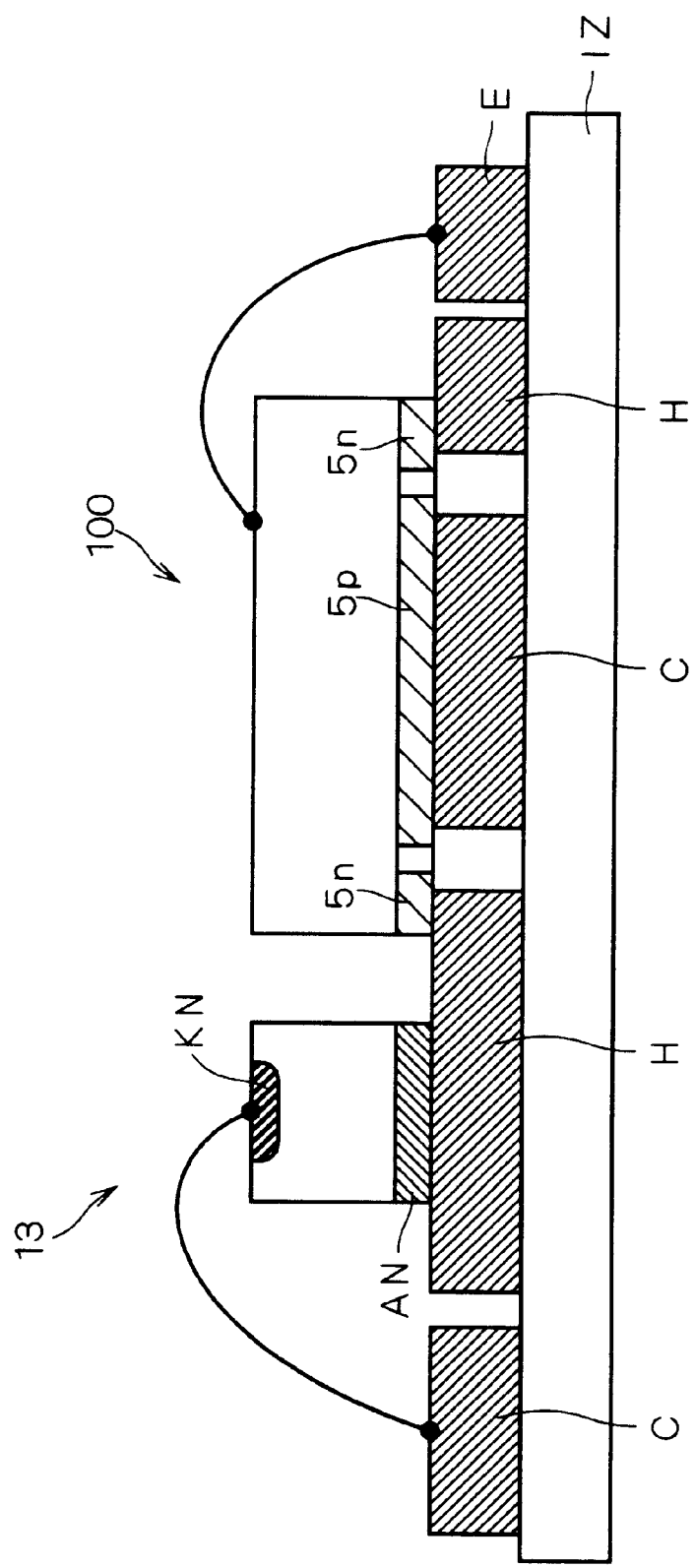

FIGS. 3 and 4 are outside views of the IGBT 100 with the diode 13 externally connected thereto.

FIG. 3 shows the IGBT 100 with the externally connected diode 13 as viewed from outside the emitter. FIG. 4 is a cross-sectional view taken along the line L—L of FIG. 3, and shows only principal constituents in cross-section.

As illustrated in FIGS. 3 and 4, the collector terminal C, the emitter terminal E, the gate terminal G and a diode connection terminal H which are made of metal are patterned on an insulative board IZ. The IGBT 100 is disposed, with the collector electrode 5p and the cathode electrode 5n placed on the collector terminal C and the diode connection terminal H, respectively.

The diode 13 is disposed, with an anode layer AN thereof placed on the diode connection terminal H. The diode 13 has a cathode layer KN electrically connected to the collector terminal C by wire bonding.

The IGBT 100 has a gate pad GP electrically connected to the gate terminal G, and an upper emitter electrode 190 electrically connected to the emitter terminal E by wire bonding.

<A-3. Characteristic Effect>

As described hereinabove, the IGBT 100 according to the first preferred embodiment of the present invention includes the low-breakdown-voltage small-area current suppressing diode 13 externally connected between the cathode electrode 5n and the collector terminal C to prevent a current flow from the cathode electrode 5n through the n-type cathode region 6 to the n-type buffer layer 3 when the positive voltage is applied to the collector terminal although the IGBT 100 has the free wheeling diode incorporated therein. This prevents the increase in potential of the n-type buffer layer 3, to allow the operation as the IGBT. The connection of the current suppressing diode 13 eliminates the need to decrease the area of the n-type cathode region 6, thereby preventing device breakdown due to current concentration during the operation of the free wheeling diode.

When the IGBT 100 and the diode 13 are employed for an inverter in the form, of a module, the reduced size of the diode 13 may decrease the area of the module.

When the IGBT with the free wheeling diode incorporated therein is employed for the inverter, carriers at turn-off of the diode remain in the n-type base layer 1 at turn-on of the IGBT to shorten the time required to generate carriers, thereby shortening the time required to turn on the IGBT. This increases the operating speed and decreases switching power dissipation. The same is true for turn-on of the diode.

<A-4. Modification>

As above described, the diode 13 is externally connected to the IGBT 100 according to the first preferred embodiment. Alternatively, a MOS transistor 130 which receives a signal complementary to a signal at the gate of the IGBT 100 may be externally connected, in place of the diode 13, to the IGBT 100 as illustrated in FIG. 5.

Figure 5:
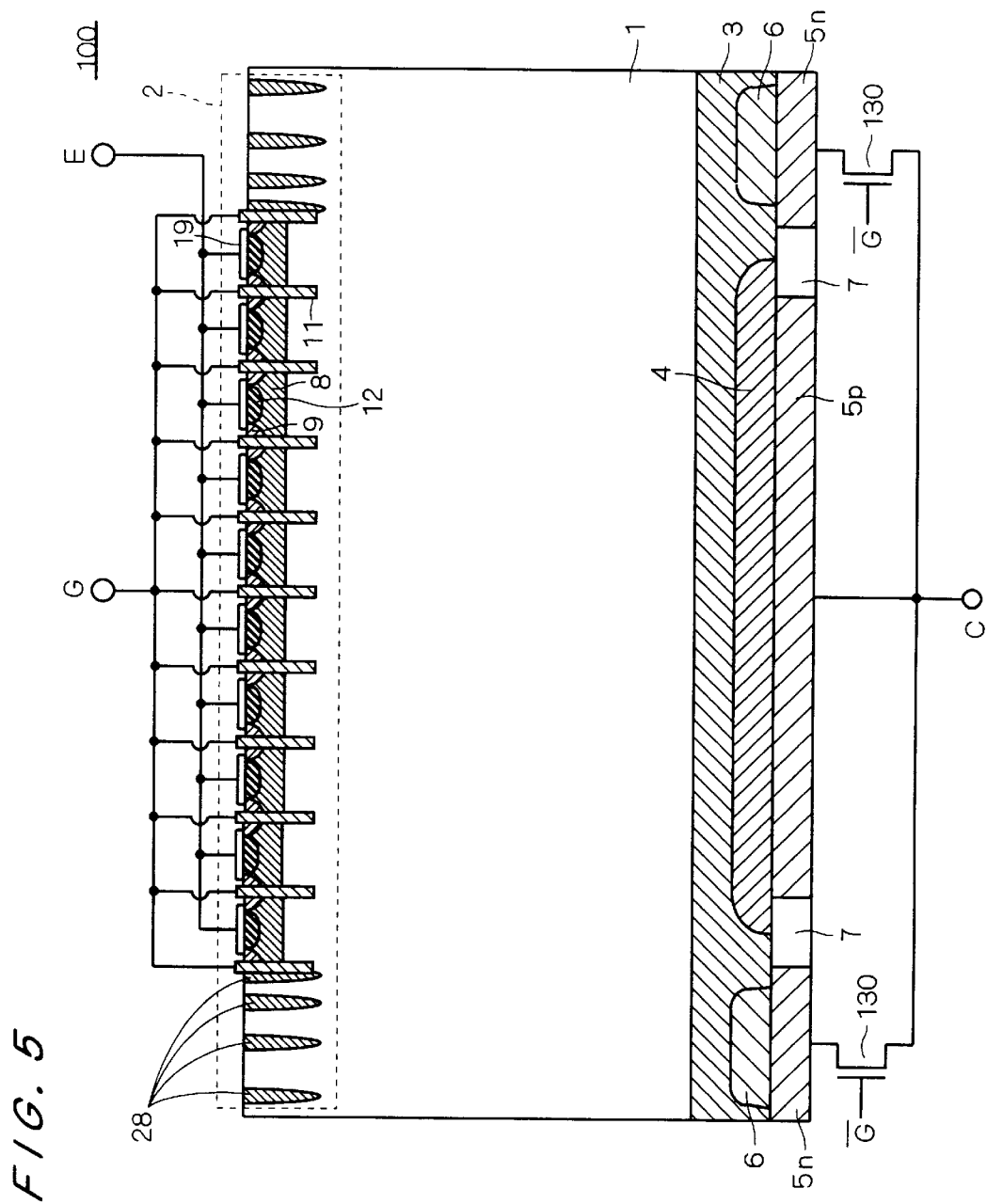
FIG. 5 illustrates a first modification of the power semiconductor device according to the first preferred embodiment of the present invention.

FIG. 5 shows the n-type MOS transistor 130 serving as a current suppressing transistor and connected between the cathode electrode 5n and the collector terminal C. The gate of the n-type MOS transistor 130 receives the inversion G of the signal at the gate terminal G of the IGBT 100. The n-type MOS transistor 130 does not conduct when a voltage which turns on the gate (i.e. which forms a channel in the p-type base region 8) is applied to the gate terminal G. Then, the current path extending from the cathode electrode 5n through the n-type cathode region 6 to the n-type buffer layer 3 is not formed. Thus, the IGBT 100 is not prevented from turning on.

<B. Second Preferred Embodiment>

<B-1. Device Construction>

Figure 6:
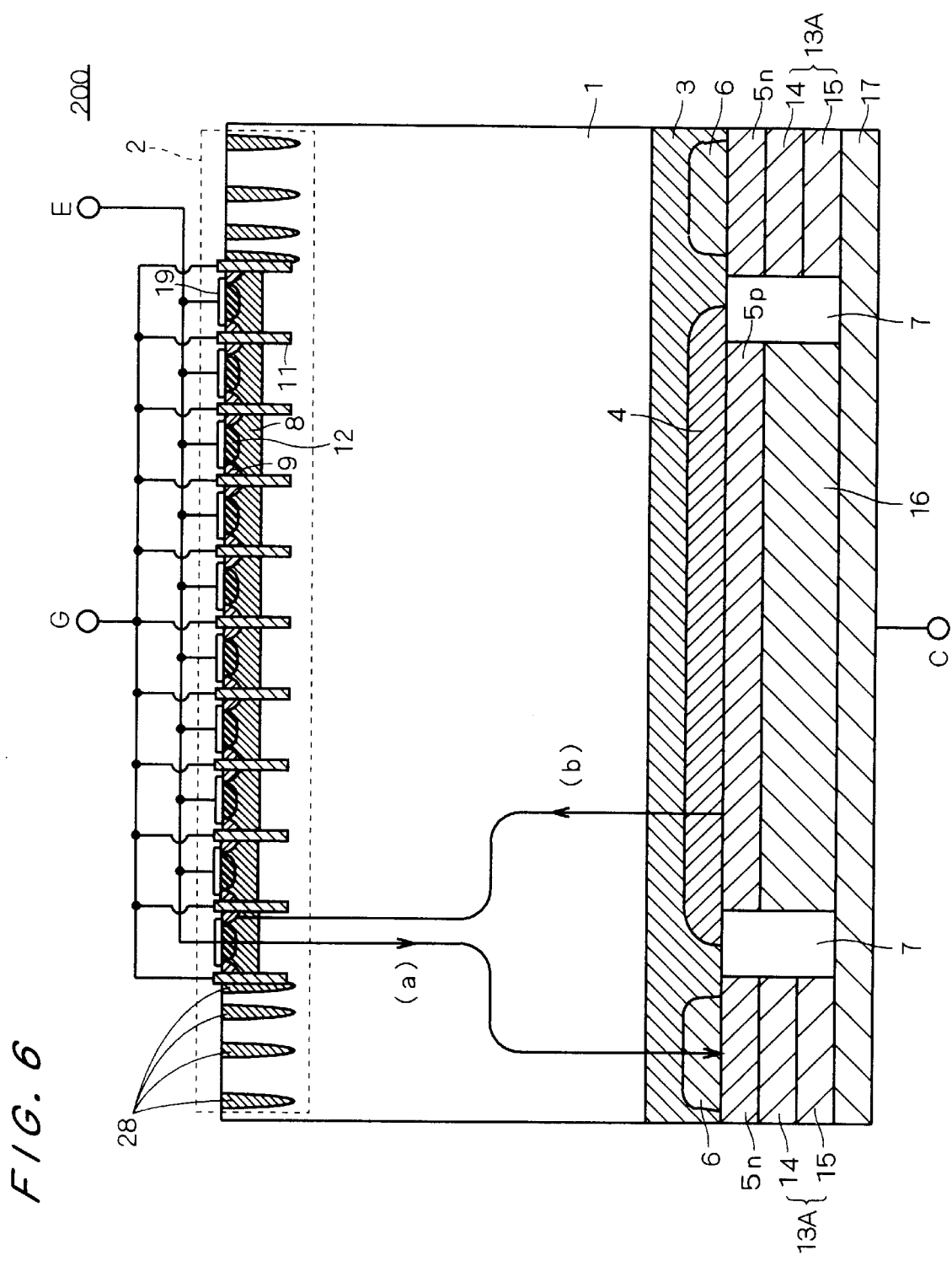
FIG. 6 illustrates a second modification of the power semiconductor device according to the first preferred embodiment of the present invention.

The power semiconductor device according to a second preferred embodiment of the present invention will now be described with reference to FIGS. 6 through 9. FIG. 6 is a cross-sectional view of an IGBT 200 with a free wheeling diode incorporated therein. Like reference characters are used in FIG. 6 to designate parts identical with those of the IGBT 100 described with reference to FIG. 1, and a repetition of description will be avoided.

The IGBT 200 comprises the n-type buffer layer 3 formed on the lower main surface of the silicon substrate 1; the p-type collector layer 4 selectively formed in the main surface of the n-type buffer layer 3 in substantially corresponding relation to the region wherein the p-type base region 8 is formed; and the n-type cathode region 6 selectively formed to surround the p-type collector layer 4 in spaced apart relation to the p-type collector layer 4. The p-type collector layers 4 and the n-type cathode region 6 are spaced apart from the silicon substrate 1. The IGBT 200 further comprises the collector electrode 5p of metal in contact with the p-type collector layer 4, and the cathode electrode 5n of metal in contact with the n-type cathode region 6 and part of the n-type buffer layer 3.

The IGBT 200 further comprises an anode region 14 containing a p-type impurity of a concentration on the order of $1\times10^{15}$ to $1\times10^{18}/cm^3$ and ohmic-connected to the cathode electrode 5n (i.e. the cathode electrode of the free wheeling diode incorporated in the IGBT), and a cathode region 15 containing an n-type impurity of a concentration on the order of $1\times10^{18}$ to $1\times10^{21}/cm^3$ and ohmic-connected to the anode region 14. The anode region 14 and the cathode region 15 constitute a current suppressing diode 13A connected in series with the cathode electrode 5n.

A low-resistance conductive layer 16 made of a metal material is ohmic-connected to the collector electrode 5p. The insulation layer 7 is formed between a multi-layer structure comprised of the collector electrode 5p and the low-resistance conductive layer 16 and a multi-layer structure comprised of the cathode electrode 5n, the anode region 14 and the cathode region 15.

An outermost collector electrode 17 is formed to cover the insulation layer 7 and is ohmic-connected to the low-resistance conductive layer 16 and the cathode region 15 of the current suppressing diode. The outermost collector electrode 17 is connected to the collector terminal C.

<B-2. Operation>

The IGBT 200 is fundamentally similar in operation to the IGBT 100 shown in FIG. 1, but differs from the IGBT 100 in that, although the IGBT 100 has the current suppressing diode 13 externally connected thereto, the IGBT 200 incorporates therein the current suppressing diode 13A comprised of the anode region 14 and the cathode region 15 in addition to the free wheeling diode. Hence, when the collector terminal C is at a negative potential, the current which has flown through the diode 13 externally connected to the IGBT 100 flows through the diode 13A incorporated in the IGBT 200.

The presence of the diode 13A prevents current from flowing from the cathode electrode 5n through the n-type cathode region 6 to the n-type buffer layer 3 when a positive voltage is applied to the collector terminal C. This prevents the increase in potential of the n-type buffer layer 3, to allow the operation as the IGBT.

<B-3. Method of Manufacturing>

Figure 7:
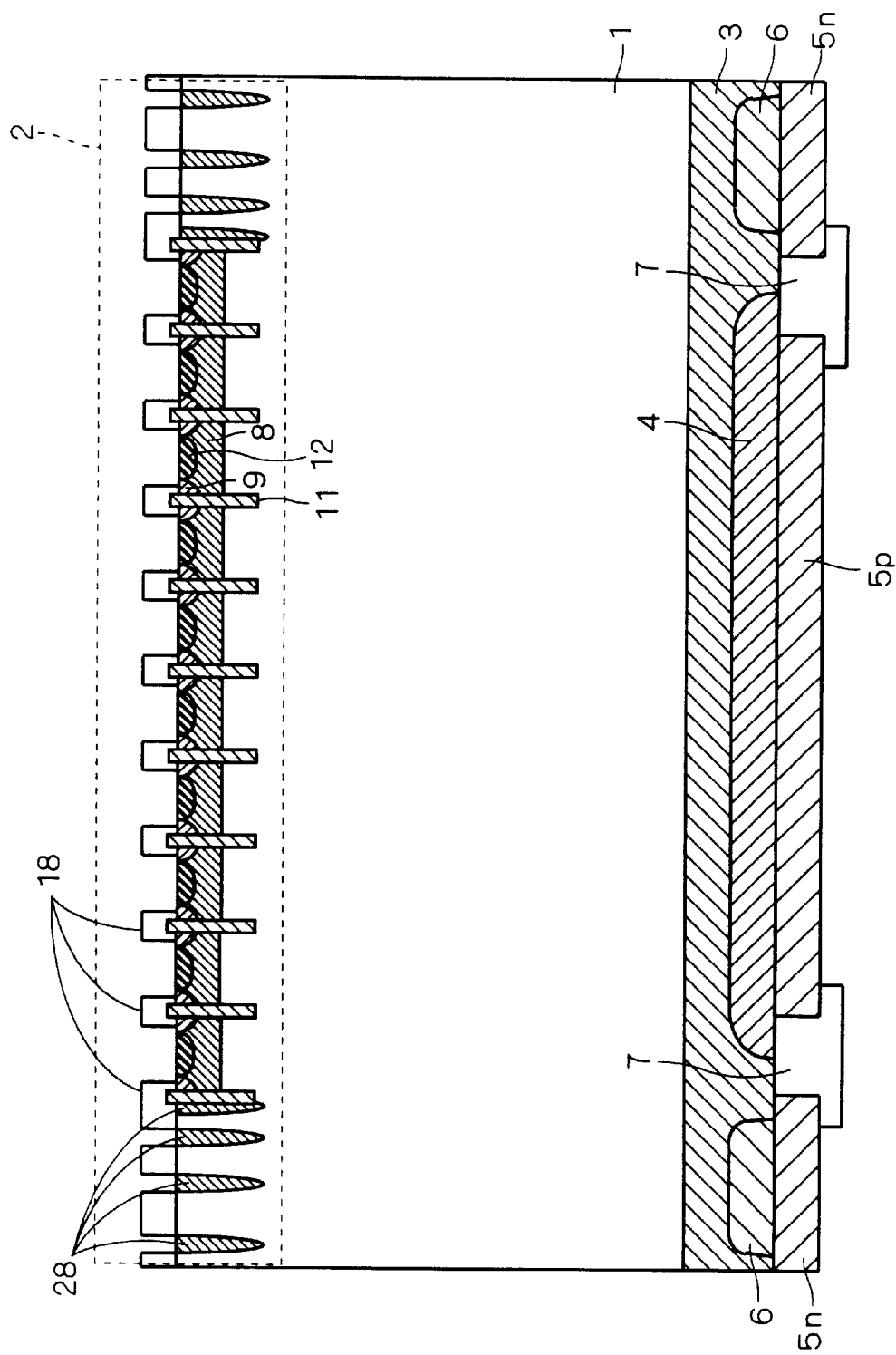
FIGS. 7 through 9 illustrate a method of manufacturing the power semiconductor device according to a second preferred embodiment of the present invention.

A method of manufacturing an IGBT 200A which is substantially similar in construction to the IGBT 200 of FIG. 6 will be described with reference to FIGS. 7 through 9 which sequentially show the manufacturing steps.

Initially, the n-type silicon substrate 1 having an impurity concentration on the order of $1\times10^{13}$ to $1\times10^{15}/cm^3$ is prepared. Referring to FIG. 7, the emitter-side structure 2 including the p-type base region 8, the n-type emitter regions 9, the gate electrodes 11 and the p-type semiconductor regions 28 is formed at the upper main surface of the n-type silicon substrate 1. An individual interlayer insulation film 18 is formed to cover an upper part of each of the gate electrodes 11 which protrudes from the upper main surface of the n-type silicon substrate 1. The interlayer insulation films 18 provide electrical isolation between the gate electrodes 11 and the emitter electrodes to be formed later, respectively. The method of manufacturing the emitter-side structure 2 is identical with that for the background art IGBT or power MOS transistor, and the description thereon will be omitted herein.

The n-type buffer layer 3 is formed on the lower main surface of the n-type silicon substrate 1. The p-type collector layer 4 is selectively formed in the main surface of the n-type buffer layer 3 in substantially corresponding relation to the region wherein the p-type base region 8 is formed, The n-type cathode region 6 is selectively formed to surround the p-type collector layer 4 in spaced apart relation to the p-type collector layer 4. The n-type buffer layer 3, the p-type collector layer 4, and the n-type cathode region 6 are formed by the conventional semiconductor manufacturing process such as ion implantation.

A conductive layer made of a high-melting-point metal, e.g. aluminum and molybdenum, is formed by sputtering and the like so as to cover the n-type buffer layer 3, the p-type collector layer 4 and the n-type cathode region 6. Then, the conductive layer is patterned by photolithography and etching into the collector electrode 5p in contact with the p-type collector layer 4 and the cathode electrode 5n in contact with the n-type cathode region 6 and part of the n-type buffer layer 3.

An insulation film such as a silicon oxide film is formed to cover the collector electrode 5p and the cathode electrode 5n. Photolithography and etching are performed on the insulation film to form the insulation layer 7 filling the space between the collector electrode 5p and the cathode electrode 5n.

Figure 8:
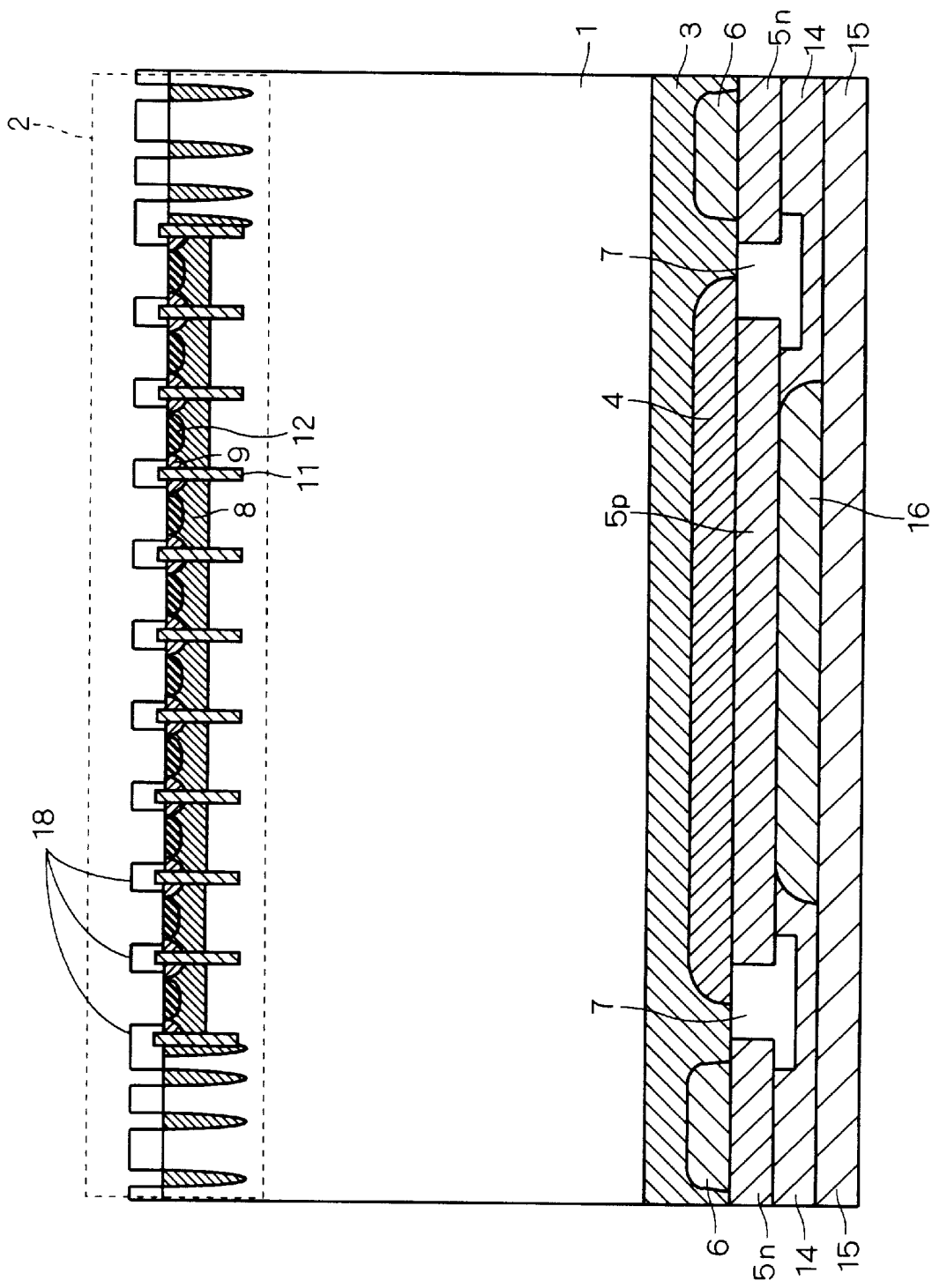

With reference to FIG. 8, a p-type semiconductor layer of a low concentration is formed to cover the collector electrode 5p, the cathode electrode 5n and the insulation layer 7. The p-type semiconductor layer is patterned by photolithography and etching into the anode region 14 in contact with the cathode electrode 5n, the insulation layer 7 and part of the collector electrode 5p. An n-type semiconductor layer containing an n-type impurity of a high concentration is formed on a portion which is not covered with the anode region 14 to provide the low-resistance conductive layer 16.

The anode region 14 and the low-resistance conductive layer 16 may be formed by heavily doping with an n-type impurity a portion wherein the low-resistance conductive layer 16 is to be formed by ion implantation after the formation of the p-type semiconductor layer.

Thereafter, an n-type semiconductor layer containing an n-type impurity of a high concentration is formed in contact with the anode region 14 and the low-resistance conductive layer 16 to provide the cathode region 15. This allows the simultaneous formation of the conductive layer to be connected to the collector terminal C in parallel with the current suppressing diode.

Figure 9:
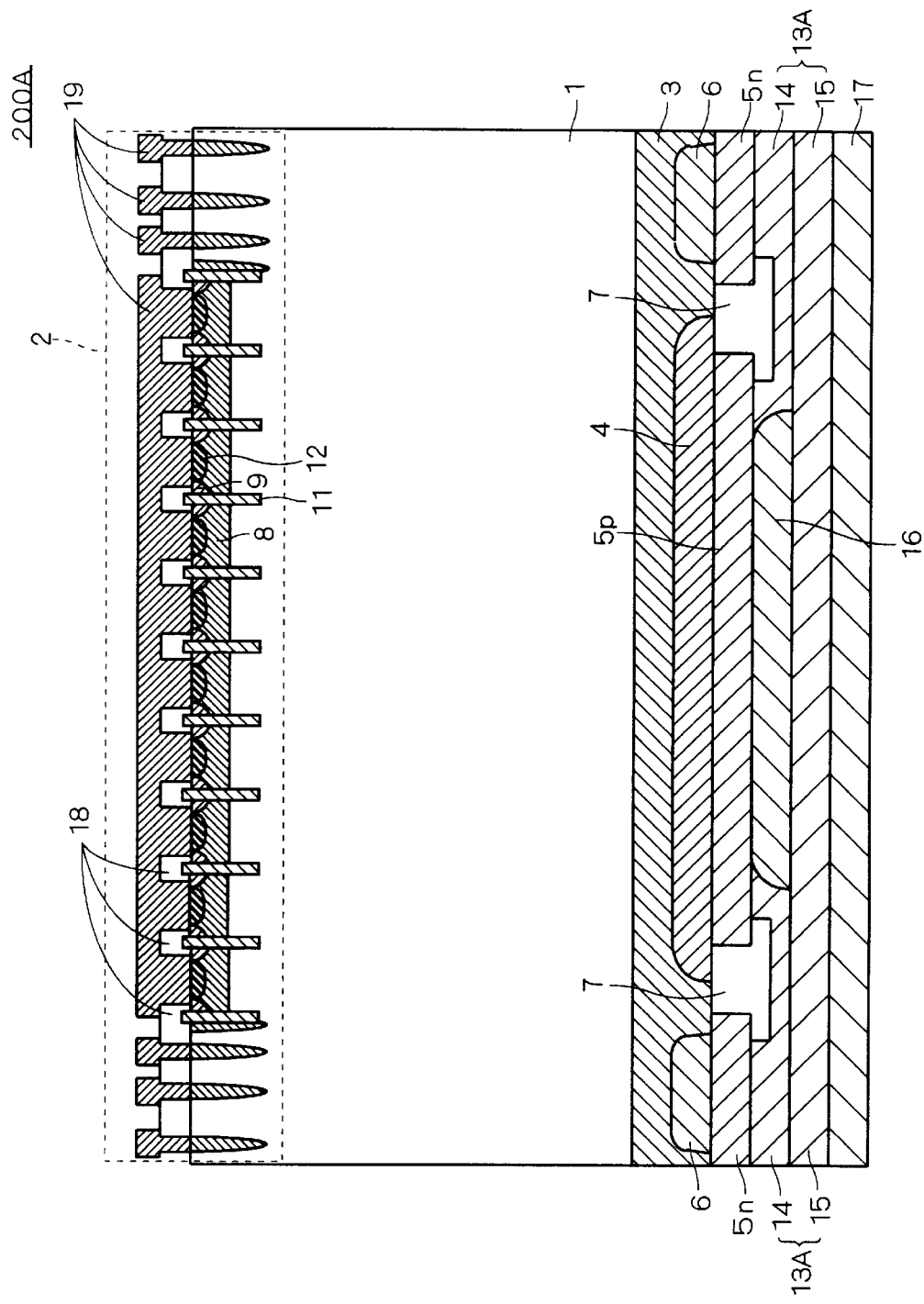

Finally, the outermost collector electrode 17 including, for example, a multilayer film containing gold is formed on the cathode region 15, as illustrated in FIG. 9. The emitter electrode 19 made of, for example, an alloy of aluminum is formed in contact with the surface of the n-type emitter regions 9. This provides the IGBT 200A.

Significant differences between the IGBT 200 and the IGBT 200A exist in that the cathode region 15 of the IGBT 200A is also in contact with the low-resistance conductive layer 16 and the insulation layer 7 of the IGBT 200A does not extend to the outermost collector electrode 17, and that the low-resistance conductive layer 16 of the IGBT 200 is made of a metal material whereas the low-resistance conductive layer 16 of the IGBT 200A is made of the high-concentration n-type semiconductor layer. However, since the collector electrode 5p and the cathode electrode 5n may be isolated from each other by the pn junction of the high-concentration n-type semiconductor layer and the anode region 14, the IGBTs 200 and 200A are substantially identical in construction.

<B-4. Characteristic Effect>

As described hereinabove, the IGBT 200 and the IGBT 200A according to the second preferred embodiment of the present invention incorporate therein the current suppressing diode in addition to the free wheeling diode to eliminate the need to separately provide the externally connected current suppressing diode in the module. Therefore, when the IGBTs 200 and 200A are constructed in the form of a module for inverter applications, the module area is further reduced.

<C. Third Preferred Embodiment>

<C-1. Device Construction>

Figure 10:
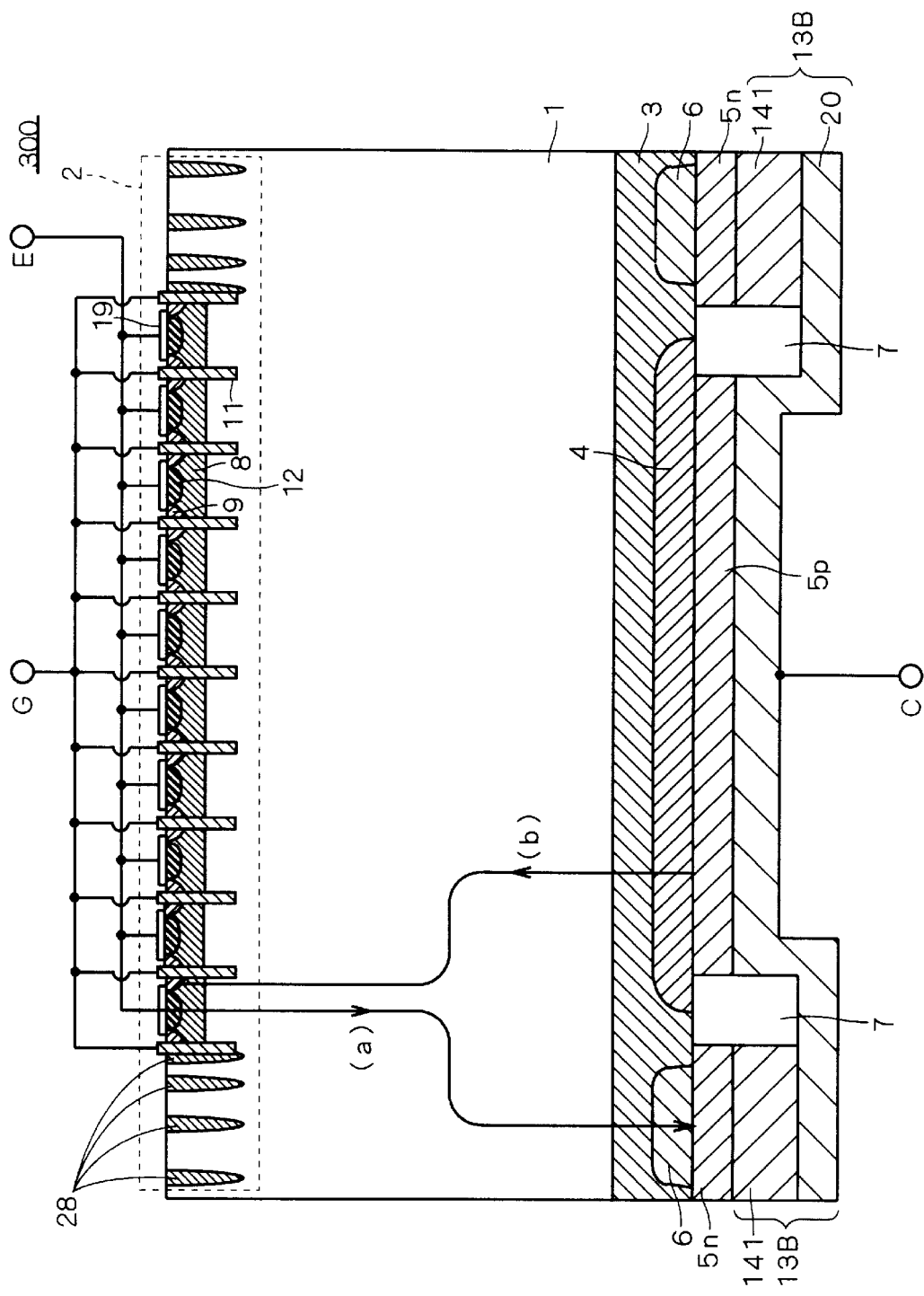
FIG. 10 illustrates the power semiconductor device according to a third preferred embodiment of the present invention.

The power semiconductor device according to a third preferred embodiment of the present invention will now be described with reference to FIGS. 10 through 12. FIG. 10 is a cross-sectional view of an IGBT 300 with a free wheeling diode incorporated therein. Like reference characters are used in FIG. 10 to designate parts identical with those of the IGBT 100 described with reference to FIG. 1, and a repetition of description will be avoided.

The IGBT 300 comprises the n-type buffer layer 3 formed on the lower main surface of the silicon substrate 1; the p-type collector layer 4 selectively formed in the main surface of the n-type buffer layer 3 in substantially corresponding relation to the region wherein the p-type base region 8 is formed; the n-type cathode region 6 selectively formed to surround the p-type collector layer 4 in spaced apart relation to the p-type collector layer 4; and the collector electrode 5p made of, for example, an alloy of aluminum for ohmic connection to the p-type collector layer 4.

The cathode electrode 5n (the cathode electrode of the free wheeling diode incorporated in the IGBT) made of, for example, an alloy of aluminum is formed for ohmic connection to the n-type cathode region 6 and part of the n-type buffer layer 3. A p-type anode region 141 containing a p-type impurity of a high concentration (on the order of $1 \times 10^{17}/$cm$^3$) is formed in contact with the cathode electrode 5n. An outermost electrode 20 of metal is formed in contact with the collector electrode 5p and the p-type anode region 141.

The outermost electrode 20 is made of a metal material such as nickel (Ni), titanium (Ti) and palladium (Pd) for Schottky connection to the p-type anode region 141.

The insulation layer 7 is formed between the collector electrode 5p and the cathode electrode 5n. The outermost electrode 20 is connected to the collector terminal C.

<C-2. Operation>

The IGBT 300 is fundamentally similar in operation to the IGBT 200 shown in FIG. 6, but differs from the IGBT 200 in that, although the current suppressing diode 13A of the IGBT 200 is a pn junction diode formed by the junction of the p-type anode region 14 and the n-type cathode region 15, the current suppressing diode of the IGBT 300 is a Schottky diode 13B formed by a Schottky connection between the p-type anode region 141 and the outermost electrode 20.

The Schottky diode serving as the current suppressing diode has a greater voltage drop than the pn junction diode when the cathode area is the same. Therefore, the cathode area of the Schottky diode 13B is greater than that of the diode 13A shown in FIG. 6.

<C-3. Characteristic Effect>

As above described, the IGBT 300 according to the third preferred embodiment of the present invention employs the Schottky diode as the current suppressing diode to reduce the number of semiconductor layers by one, thereby simplifying the manufacturing method and reducing manufacturing costs.

<C-4. First Modification>

Figure 11:
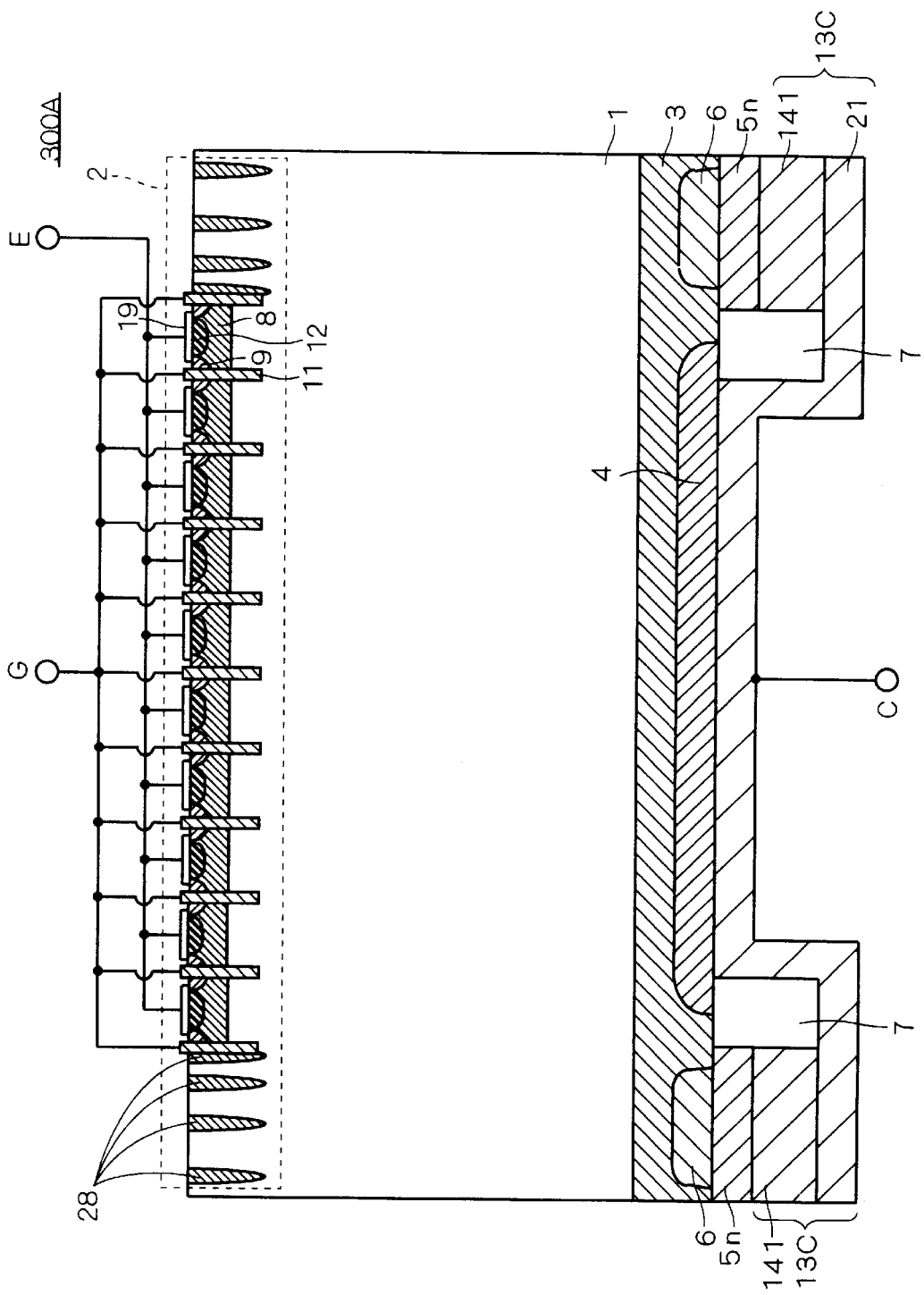
FIGS. 11 and 12 illustrate modifications of the power semiconductor device according to the third preferred embodiment of the present invention.

The arrangement employing the Schottky diode as the current suppressing diode is not limited to the IGBT 300 shown in FIG. 10 but may be an IGBT 300A shown in FIG. 11.

The IGBT 300A shown in FIG. 11 comprises an outermost electrode 21 made of a metal material such as nickel (Ni), titanium (Ti) and palladium (Pd) for ohmic connection to the p-type collector layer 4 and for Schottky connection to the p-type an ode region 141. The Schottky connection between the p-type anode region 141 and the outermost electrode 21 constitutes a Schottky diode 13C. The insulation layer 7 is formed between the cathode electrode 5n and the outermost electrode 21. Like reference characters are used to designate parts identical with those of the IGBT 300 shown in FIG. 10.

Such an arrangement eliminates the need to form the collector electrode 5p provided in the IGBT 300 to further simplify the construction and the manufacturing method, thereby further reducing the manufacturing costs.

<C-5. Second Modification>

Figure 12:
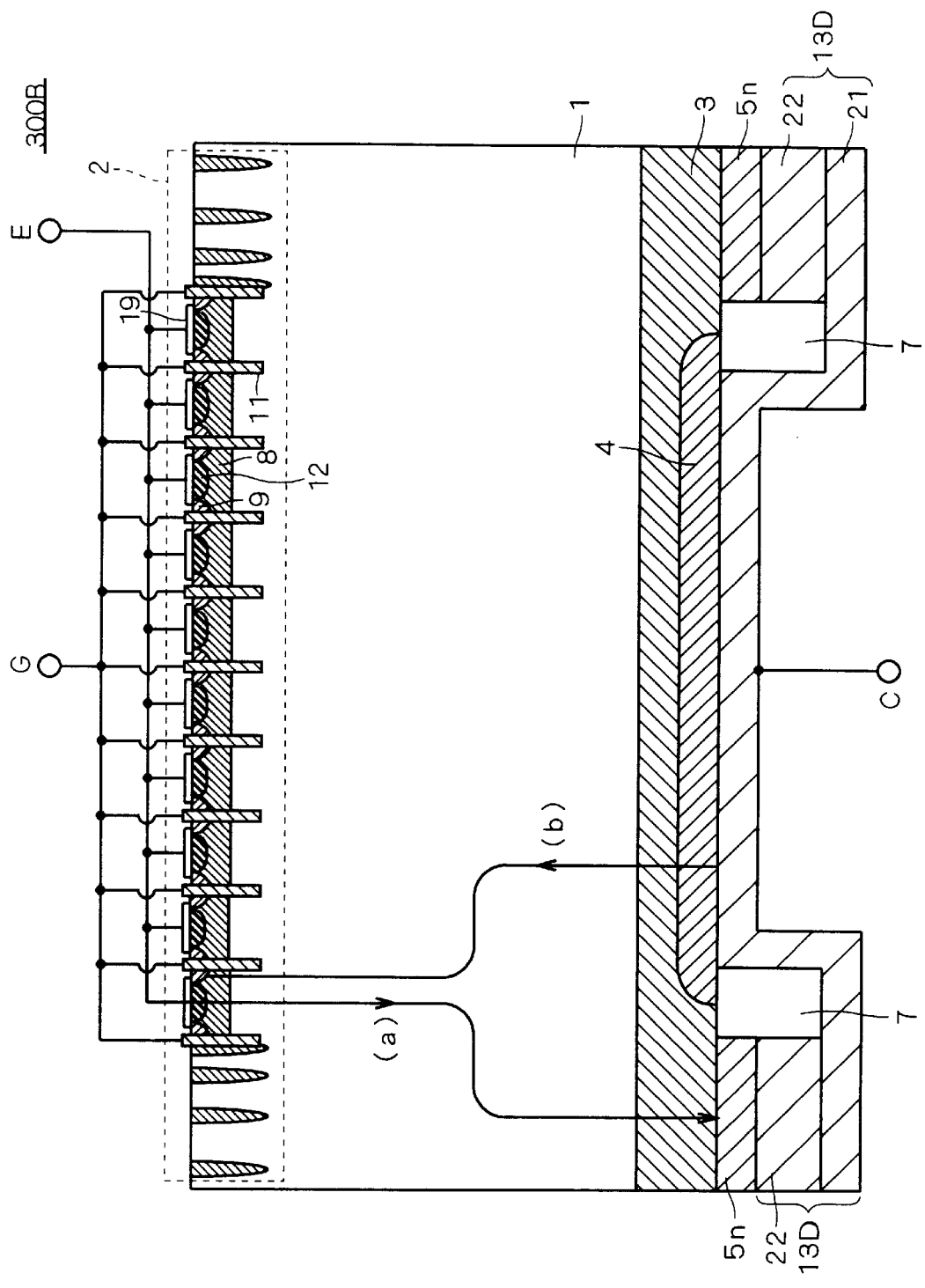

The arrangement employing the Schottky diode as the current suppressing diode is not limited to the IGBT 300 shown in FIG. 10 but may be an IGBT 300B shown in FIG. 12.

The IGBT 300B shown in FIG. 12 comprises the n-type buffer layer 3 on the lower main surface of the silicon substrate 1, and the p-type collector layer 4 selectively formed in the main surface of the n-type buffer layer 3 in substantially corresponding relation to the region wherein the p-type base region 8 is formed.

The cathode electrode 5n made of, for example, an alloy of aluminum is formed for ohmic connection to the main surface of the n-type buffer layer 3 around the p-type collector layer 4. A p-type anode region 22 is formed in contact with the cathode electrode 5n. The p-type anode region 22 is made of a semiconductor material different from that of the p-type collector layer 4, e.g. a semiconductor material having a greater electron affinity than silicon, such as germanium (Ge), PbS, InAs, InS and PbTe, and contains a p-type impurity of a high concentration (on the order of $1 \times 10^{17}/cm^3$). The outermost electrode 21 of metal is formed in contact with the p-type collector layer 4 and the p-type anode region 22. The insulation layer 7 is formed between the cathode electrode 5n and the outermost electrode 21.

The outermost electrode 21 is made of a metal material such as nickel (Ni), titanium (Ti) and palladium (Pd) for ohmic connection to the p-type collector layer 4 and for Schottky connection to the p-type anode region 22. The Schottky connection between the p-type anode region 22 and the outermost electrode 21 constitutes a Schottky diode 13D. Like reference characters are used to designate parts identical with those of the IGBT 300 shown in FIG. 10.

The p-type anode region 22 is made of the semiconductor material different from that of the p-type collector layer 4, i.e. a semiconductor material having the greater electron affinity than silicon, to ensure the Schottky connection between the outermost electrode 21 and the p-type anode region 22.

<D. Fourth Preferred Embodiment>
<D-1. Device Construction>

Figure 13:
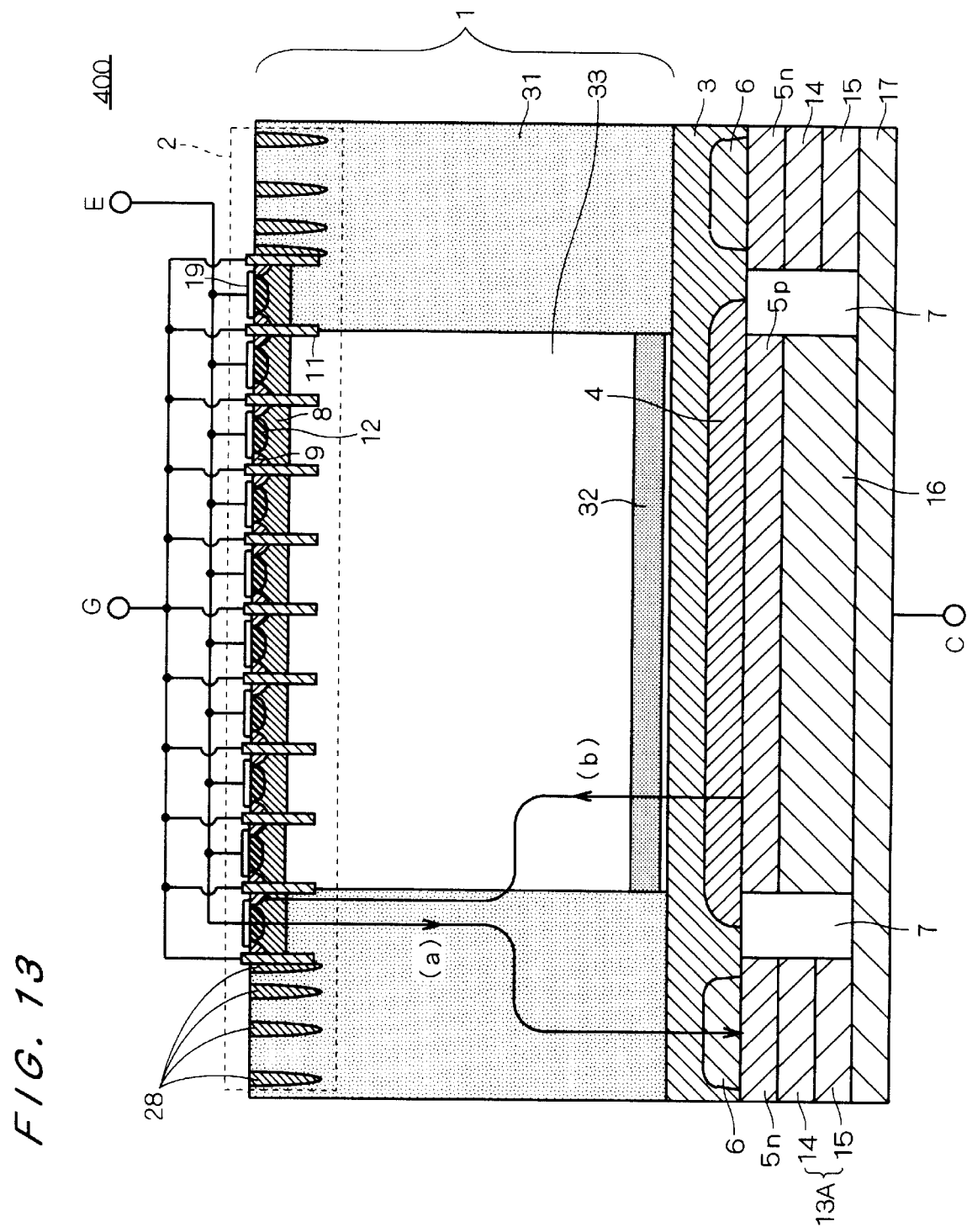
FIG. 13 illustrates the power semiconductor device according to a fourth preferred embodiment of the present invention.

The power semiconductor device according to a fourth preferred embodiment of the present invention will now be described with reference to FIG. 13. FIG. 13 is a cross-sectional view of an IGBT 400 with a free wheeling diode incorporated therein. Like reference characters are used in FIG. 13 to designate parts identical with those of the IGBT 200 described with reference to FIG. 2, and a repetition of description will be avoided.

The IGBT 400 has a peripheral region 31 (first lifetime setting region) including the p-type semiconductor regions 28 in the silicon substrate 1, a region 32 (second lifetime setting region) adjacent the n-type buffer layer 3 at the lower main surface of the silicon substrate 1 and corresponding to a region wherein the p-type collector layer 4 is formed, and a central region 33 of the silicon substrate 1. The IGBT 400 is designed such that the peripheral region 31, the region 32 and the central region 33 are different in carrier lifetime.

The carrier lifetime in the peripheral region 31 of the silicon substrate 1 on which the current paths of the free wheeling diode are concentrated is about 1 μsec. The carrier lifetime in the region 32 is about 0.1 μsec. The carrier lifetime in the central region 33 is about 10 to 100 μsec.

The control of the carrier lifetime is achieved by injecting a particle beam such as protons, helium and an electron beam into the silicon substrate 1 to locally generate crystal defects adjacent the range position of the injected particles to use the crystal defects as the recombination centers of minority carriers. For the injection, the particle beam is passed through a mask made of a material such as stainless steel and silicon Such a mask adjusts the acceleration energy to control the range position, and controls a dose to control the amount of crystal defects to be generated.

For the formation of the peripheral region 31, for example, an electron beam having a light mass is injected at a dose of $1 \times 10^{14}/cm^2$ to $1 \times 10^{15}/cm^2$, using a mask made of a material such as stainless steel and silicon and positioned over the central part of the silicon substrate 1.

For the formation of the region 32, protons and helium having a heavy mass are injected, using a mask made of a material such as stainless steel and silicon and positioned over the peripheral part of the silicon substrate 1. For example, protons are injected at a dose of $1 \times 10^{11}/cm^2$ to $1 \times 10^{12}/cm^2$.

The carrier lifetime in the central region 33 is the inherent carrier lifetime of the silicon substrate 1.

<D-2. Operation>

The IGBT 400 is fundamentally similar in operation to the IGBT 200 shown in FIG. 6, but differs from the IGBT 200 in that the carrier lifetime is changed in the peripheral region 31 on which the current paths of the free wheeling diode are concentrated and in the region 32 adjacent the n-type buffer layer 3.

In general, IGBTs employ the technique of shortening a collector-side carrier lifetime to decrease a carrier density in the n-type base layer to suppress the switching power dissipation per pulse. This increases the on-state voltage and steady-state power dissipation of the IGBT. Since the switching power dissipation relative to total power consumption is approximately proportional to an operating frequency and the steady-state power dissipation relative to the total power consumption are substantially constant with respect to the operating frequency, the collector-side carrier lifetime is set so as to minimize power consumption, based on the operating frequency.

On the other hand, when an IGBT turns on, power dissipation due to the recovery of a pin diode, i.e. a free wheeling diode, and the steady-state power dissipation in the pin diode are determined by a carrier distribution in an "i" layer of the pin diode, i.e., a carrier lifetime distribution. An optimum carrier lifetime distribution at a certain operating frequency is generally different from a distribution which minimizes the power consumption of the IGBT.

In the IGBT 400, the carrier lifetime distribution is changed in the peripheral region 31 on which the current paths of the free wheeling diode are concentrated and in the region 32 adjacent the n-type buffer layer 3 wherein the current paths of the IGBT are formed. The respective carrier lifetime distributions in both of the regions 31 and 32 are set to an optimum carrier lifetime distribution which minimizes the power consumption of the free wheeling diode and the IGBT.

Therefore, the power consumption during the operation of the IGBT and the free wheeling diode is reduced.

<D-3. Characteristic Effect>

As above described, the IGBT 400 according to the fourth preferred embodiment of the present invention is allowed to independently set the carrier lifetime distribution substantially optimum for the IGBT and the free wheeling diode incorporated therein, to optimize the total power consumption made up of the power consumption during the IGBT operation and the power consumption during the diode operation.

The IGBT 400, similar to the IGBT 200 described with reference to FIG. 6, incorporates therein the current suppressing diode in addition to the free wheeling diode to eliminate the need to separately provide the externally connected current suppressing diode in the module. Therefore, when the IGBT 400 is constructed in the form of a module for inverter applications, the module area is further reduced.

The changes in carrier lifetime in the peripheral region on which the current paths of the free wheeling diode are concentrated and in the region in which the current paths of the IGBT are formed may be also applied to the IGBT 100 shown in FIG. 1, and the IGBTs 300, 300A and 300B shown in FIGS. 10 through 12.

<E. Fifth Preferred Embodiment>

<E-1. Device Construction>

Figure 14:
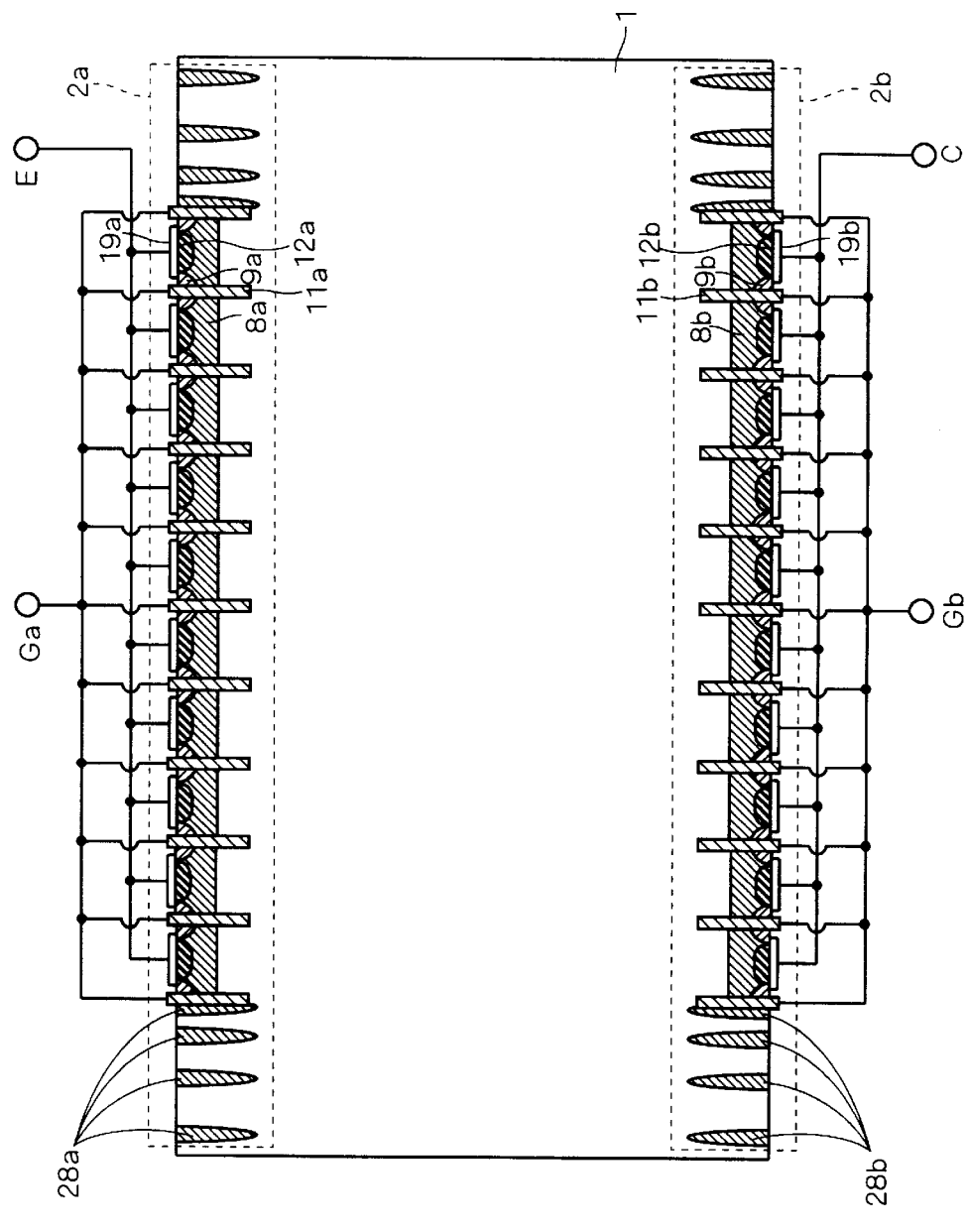
FIG. 14 illustrates the power semiconductor device according to a fifth preferred embodiment of the present invention.

The power semiconductor device according to a fifth preferred embodiment of the present invention will now be described with reference to FIGS. 14 through 25. FIG. 14 is a cross-sectional view of an IGBT 500 with a MOS transistor as a current suppressing device incorporated therein.

Referring to FIG. 14, the IGBT 500 has source-side structures 2a and 2b similar to the emitter-side structure 2 of the IGBT 100 shown in FIG. 1 at the upper and lower main surfaces of the silicon substrate 1, respectively.

More specifically, a p-type base region 8a is formed in the upper main surface of the n-type silicon substrate 1, and a plurality of trench-type gate electrodes 11a are arranged in parallel and each extend through the p-type base region 8a in the direction of the depth thereof A plurality of p-type semiconductor regions 12a containing a p-type impurity of a relatively high concentration are selectively formed in the surface of the p-type base region 8a in such a manner that each lies between adjacent two of the gate electrodes 11a. The p-type semiconductor regions 12a are provided for the purpose of making a satisfactory electric connection between the p-type base region 8a and source electrodes 19a.

A plurality of n-type source regions 9a containing an n-type impurity of a relatively high concentration are formed on the opposite sides of the respective p-type semiconductor regions 12a. The n-type source regions 9a are designed to contact the respective gate insulation films (not shown) formed on the surface of the gate electrodes 11a. The silicon substrate 1 serves as a drain layer of the MOS transistor.

A plurality of source electrodes 19a are formed on the surface of the n-type source regions 9a and are electrically connected to the emitter terminal E. The gate electrodes 11a are electrically connected to a gate terminal Ga. A plurality of p-type semiconductor regions 28a (first electric field relieving means) at a floating potential are arranged concentrically to surround the p-type base region 8a.

A group of structures including the p-type base region 8a, the n-type source regions 9a, the gate electrodes 11a and the p-type semiconductor regions 28a are similar in construction to MOS transistors with the drain layer removed therefrom and generically referred to as the source-side structure 2a (a first assembly of units) since the structures are provided in plurality.

The source-side structure 2b (a second assembly of units) is similar to the source-side structure 2a. More specifically, the source-side structure 2b comprises p-type base region 8b corresponding to the p-type base region 8a, a plurality of n-type source regions 9b corresponding to the n-type source regions 9a, a plurality of gate electrodes 11b corresponding to the gate electrode 11a, and a plurality of p-type semiconductor regions 28b (second electric field relieving means) corresponding to the p-type semiconductor regions 28a. A plurality of source electrodes 19b are electrically connected to the collector terminal C, and the gate electrodes 11b are electrically connected to a gate terminal Gb.

<E-2. Operation>

The operation of the IGBT 500 will now be described.

When a voltage which turns on the gate is applied to both the gate terminals Ga and Gb, the IGBT 500 acts as in-series connected MOS transistors independently of whether the voltage at the collector terminal C is positive or negative.

Figure 15:
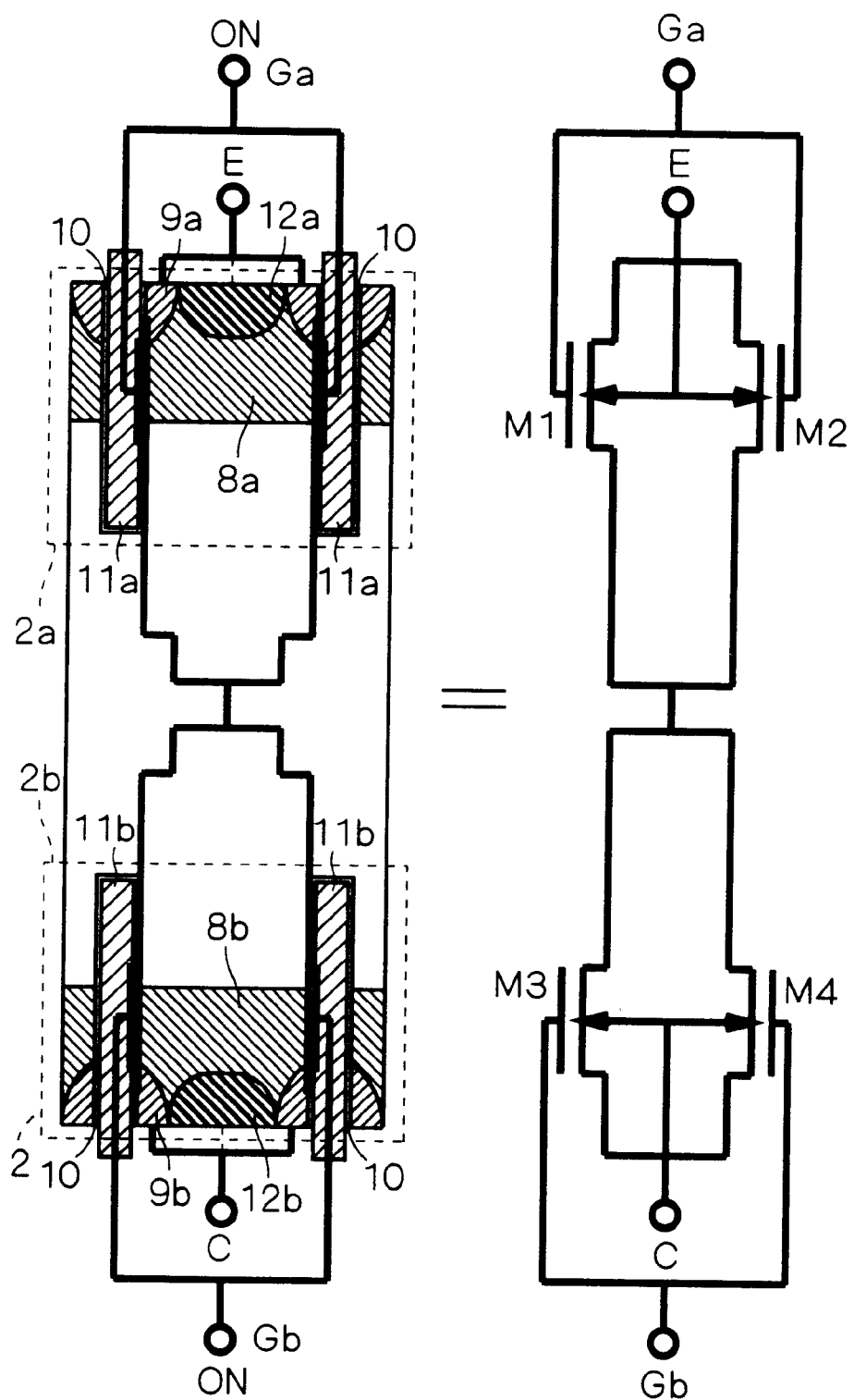
FIGS. 15 and 16 illustrate the operation of the power semiconductor device according to the fifth preferred embodiment of the present invention.

FIG. 15 shows an equivalent circuit in this state. Part of the IGBT 500 which includes a pair of gate electrodes 11a and a pair of gate electrodes 11b in the source-side structures 2a and 2b is shown in FIG. 15. In the arrangement of FIG. 15, a pair of MOS transistors M1 and M2 connected in parallel are formed in the source-side structure 2a, and a pair of transistors M3 and M4 connected in parallel are formed in the source-side structure 2b. Hence, the direction of current may be reversed depending on whether the voltage at the collector terminal C is positive or negative.

Similarly, when a voltage which turns off the gate is applied to both the gate terminals Ga and Gb, the IGBT 500 is placed in a state similar to the off state of the IGBT independently of whether the voltage at the collector terminal C is positive or negative.

On the other hand, when a positive voltage is applied to the collector terminal C (or a negative voltage is applied to the emitter terminal E) with the gate terminal Ga in the on-state and the gate terminal Gb in the off-state, the IGBT 500 acts as an IGBT which is on. When a negative voltage is applied to the collector terminal C (or a positive voltage is applied to the emitter terminal E) with the gate terminal Ga in the on state and the gate terminal Gb in the off state, a reverse voltage is applied to the source-side structure 2b constituting a diode, and no current flows through the IGBT 500.

Conversely, when a positive voltage is applied to the collector terminal C (or a negative voltage is applied to the emitter terminal E) with the gate terminal Ga in the off state and the gate terminal Gb in the on state, a reverse voltage is applied to the source-side structure 2a constituting a diode, and no current flows through the IGBT 500. When a negative voltage is applied to the collector terminal C (or a positive voltage is applied to the emitter terminal E) with the gate terminal Ga in the off state and the gate terminal Gb in the on state, the IGBT 500 acts as an IGBT which is on but current flows in the opposite direction from the current flowing when the gate terminal Ga is on. Then, the source-side structure 2a acts as a free wheeling diode.

Thus, complementary signals applied to the gate terminals Ga and Gb cause the IGBT 500 to act as an IGBT with a reverse-connected free wheeling diode incorporated therein in a manner described with respect to the first to fourth preferred embodiments.

The application of the complementary signals to the gate terminals Ga and Gb causes the IGBT and the free wheeling diode to act completely independently. This eliminates the problem that the IGBT 500 does not act as an IGBT but acts as a MOS transistor because of the presence of the free wheeling diode.

Figure 16:
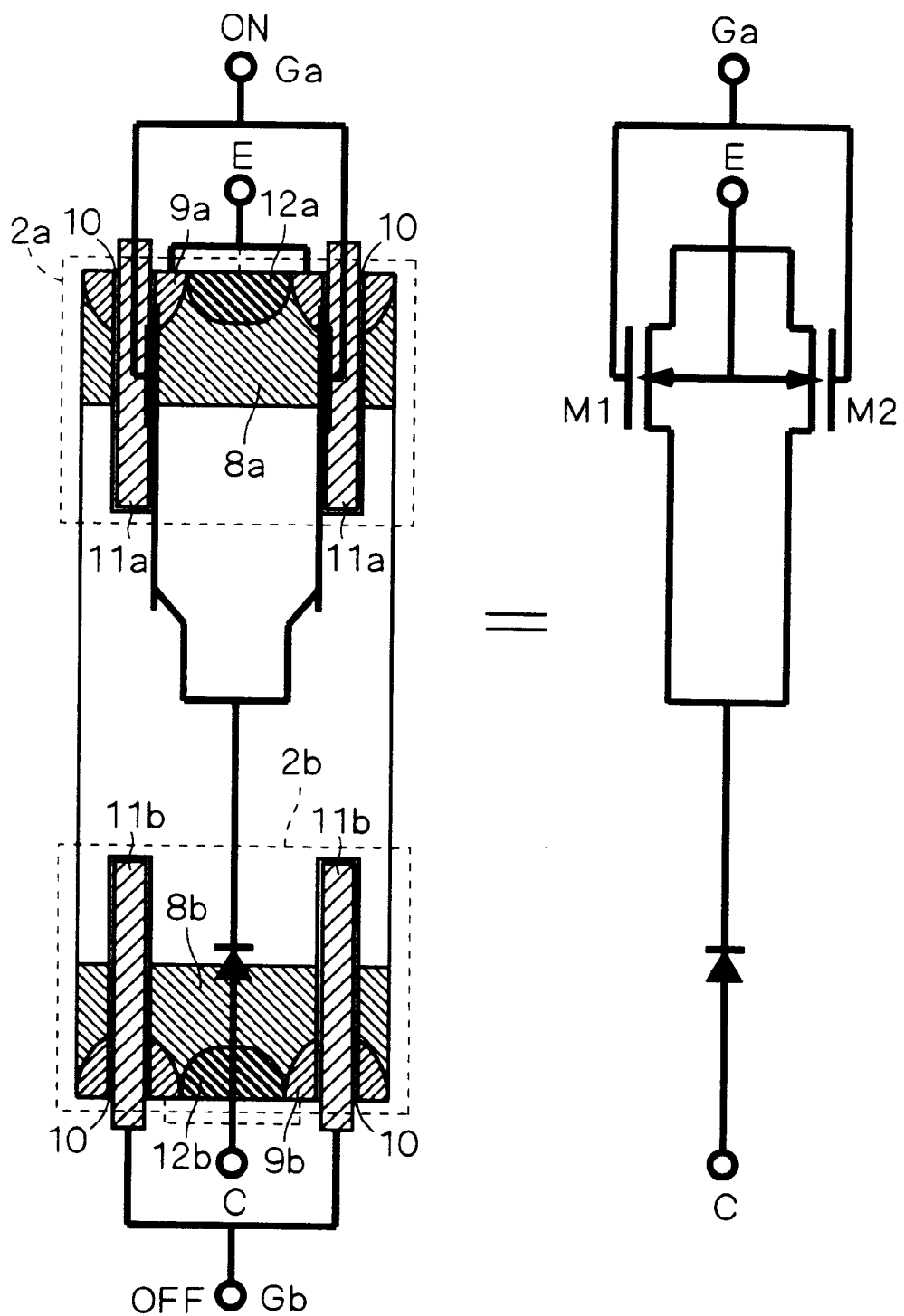

FIG. 16 shows an equivalent circuit when the IGBT is on. Part of the IGBT 500 which includes a pair of gate electrodes 11a and a pair of gate electrodes 11b in the source-side structures 2a and 2b is shown in FIG. 16. In the arrangement of FIG. 16, the pair of MOS transistors M1 and M2 connected in parallel are formed in the source-side structure 2a, and a diode D10 connected in a forward direction in series with the pair of MOS transistors M1 and M2 is formed in the source-side structure 2b.

<E-3. Method of Manufacturing>

A method of manufacturing the IGBT 500 will be described with reference to FIGS. 17 through 22 which sequentially show the manufacturing steps.

Figure 17:
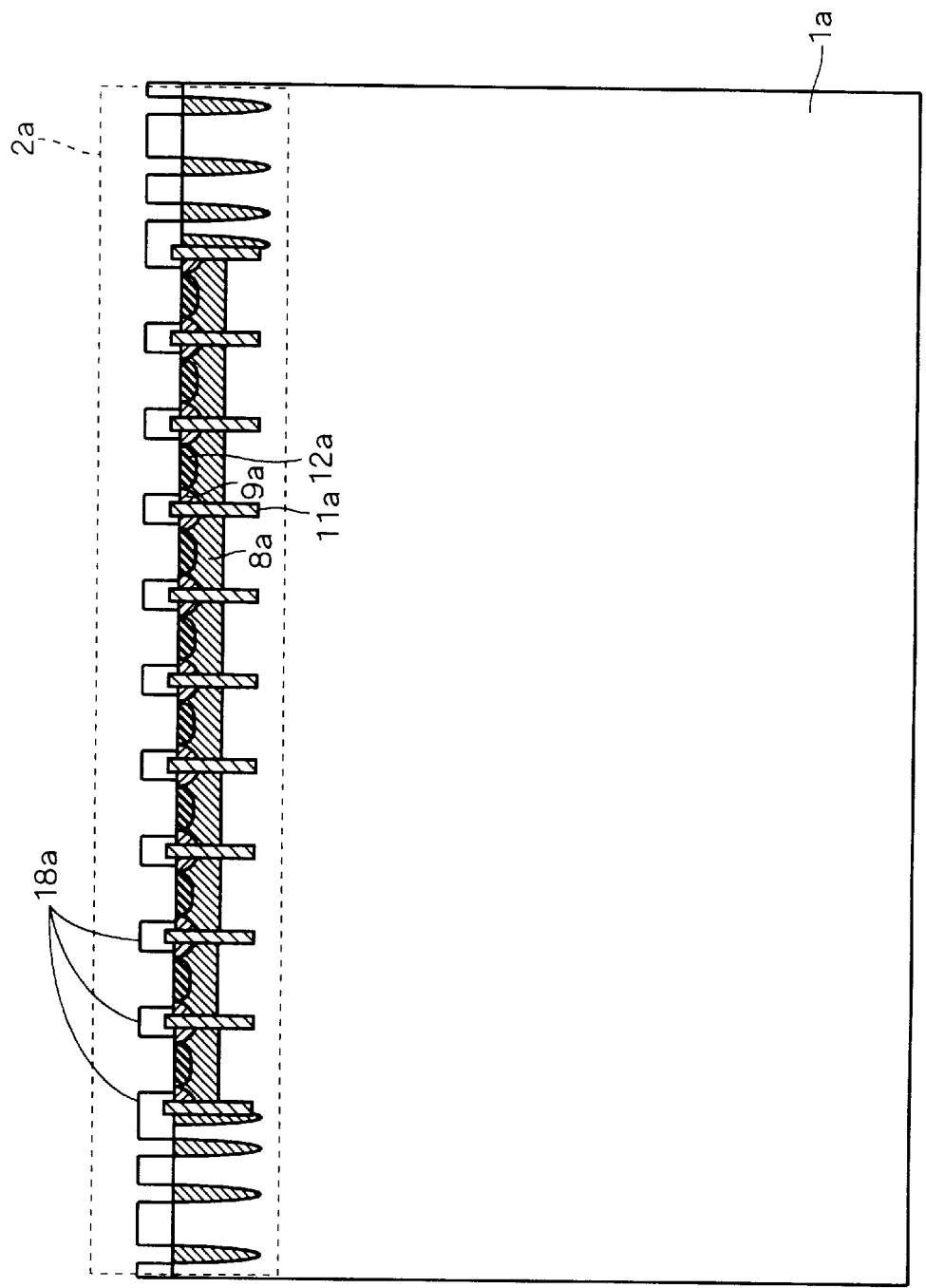
FIGS. 17 through 22 illustrate a method of manufacturing the power semiconductor device according to the fifth preferred embodiment of the present invention.
Figure 18:
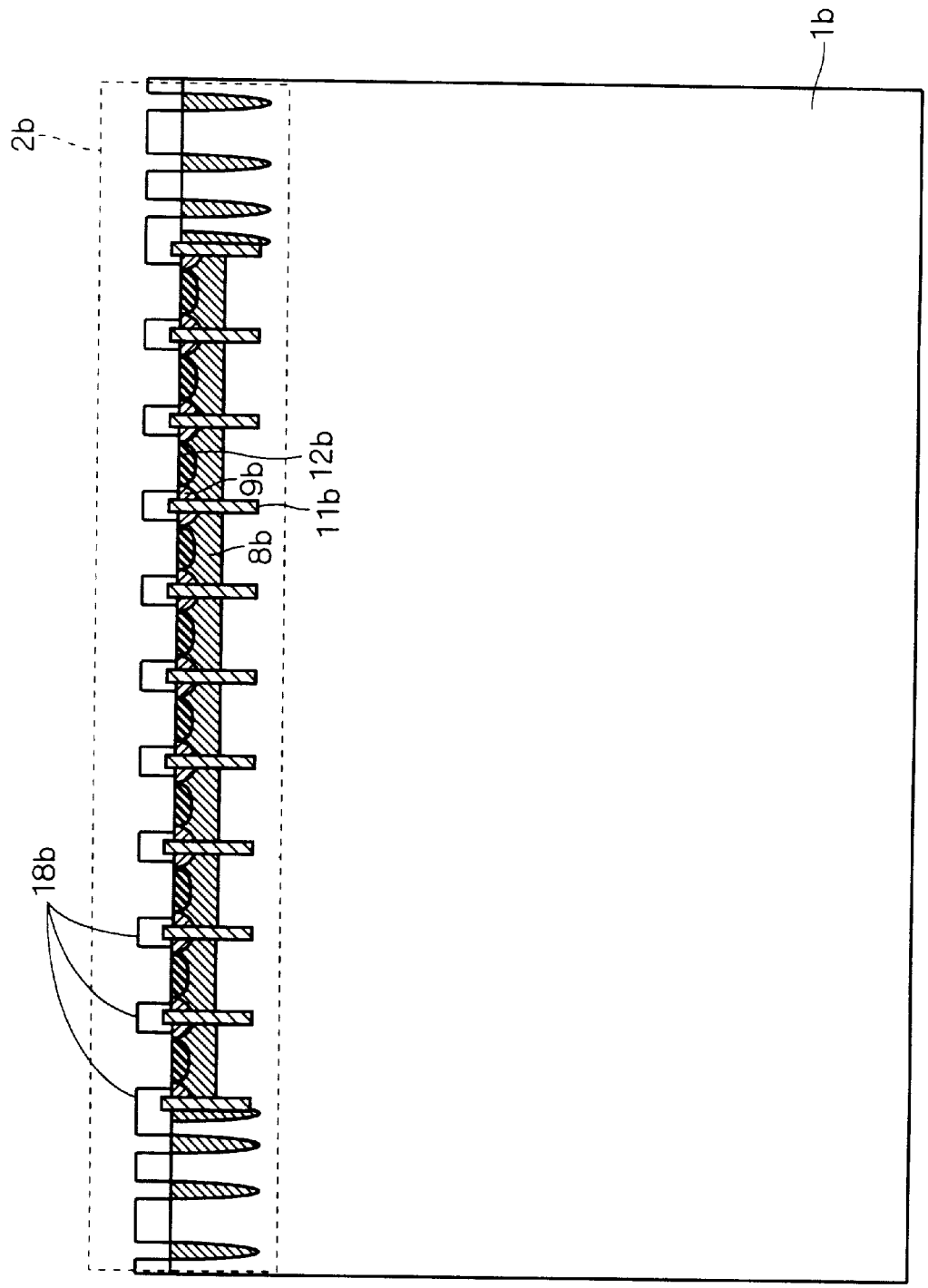

Initially, as illustrated in FIGS. 17 and 18, n-type silicon substrates 1a and 1b having an impurity concentration on the order of $1 \times 10^{13}$ to $1 \times 10^{15}/cm^3$ are prepared. The source-side structures 2a and 2b are formed at respective. one main surfaces of the n-type silicon substrates 1a and 1b. Individual interlayer insulation films; 18a and 18b are formed to cover an upper part of the gate electrodes 11a and 11b which protrudes from the upper main surface of the n-type silicon substrates 1a and 1b. The method of manufacturing the source-side structures 2a and 2b is identical with that for the background art IGBT or power MOS transistor, and the description thereon is omitted herein.

Figure 19:
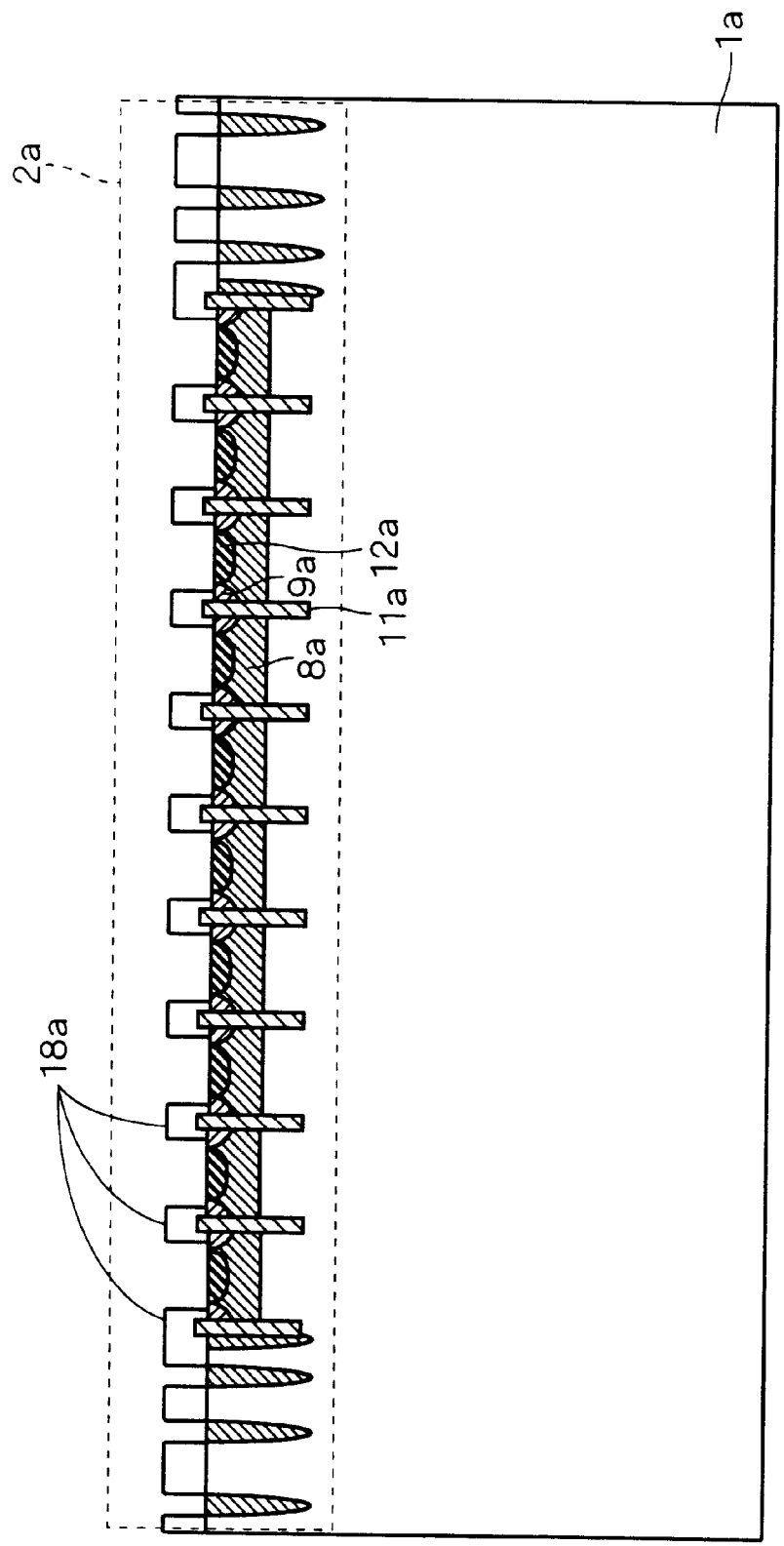
Figure 20:
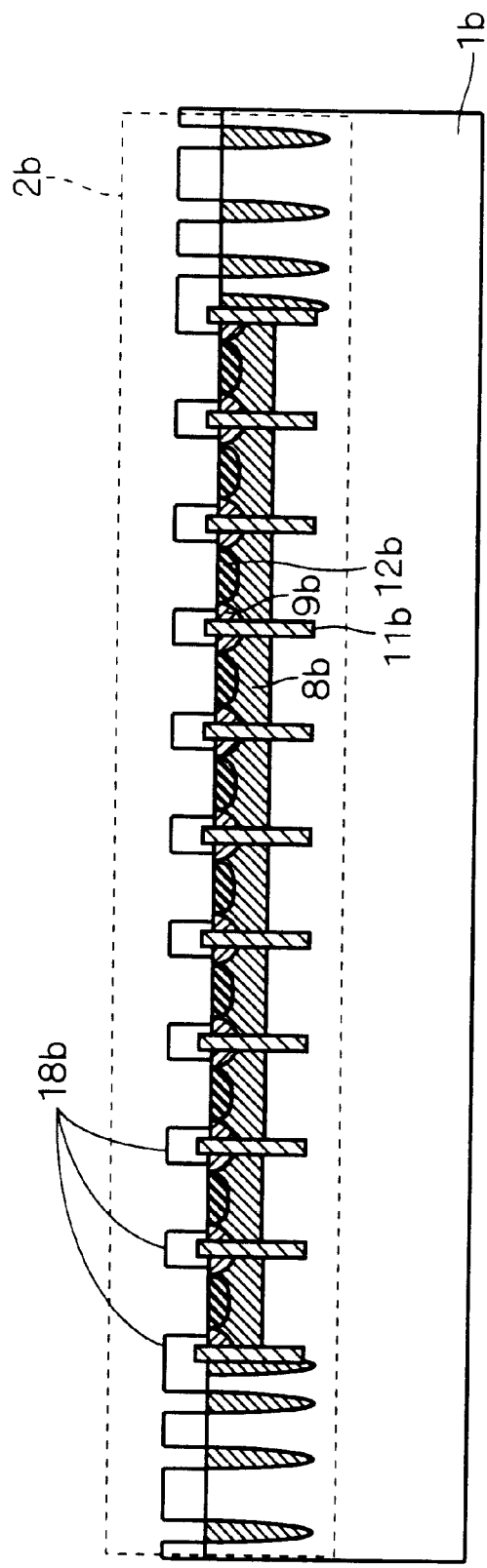

As illustrated in FIGS. 19 and 20, a drain-side surface of the silicon substrates 1a and 1b is polished to a predetermined thickness.

Figure 21:
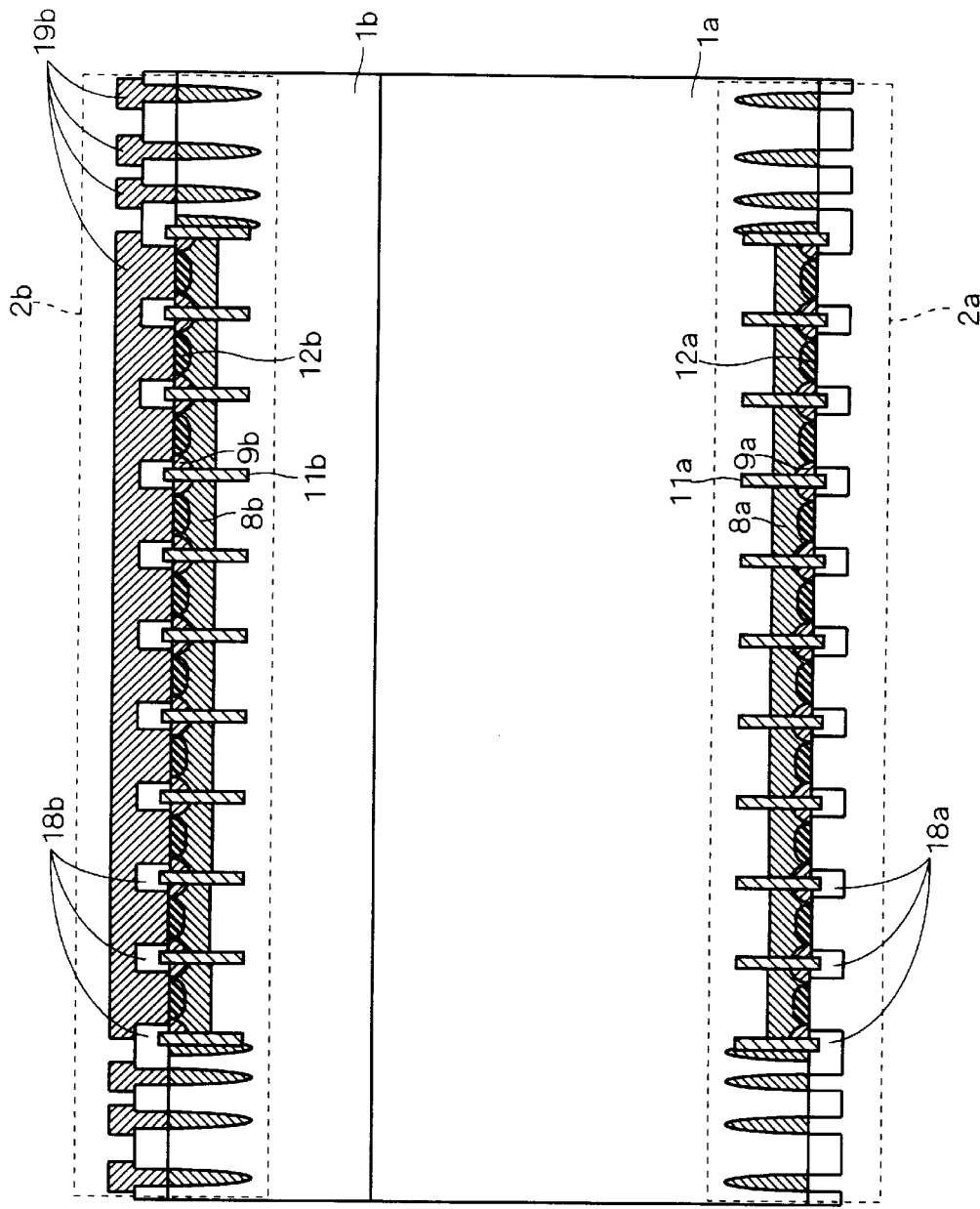

Then, as shown in FIG. 21, the polished silicon substrates 1a and 1b are joined together by the wafer bonding technique. The source electrodes 19b made of, for example, an alloy of aluminum are formed in contact with the surface of the n-type source regions 9b.

Figure 22:
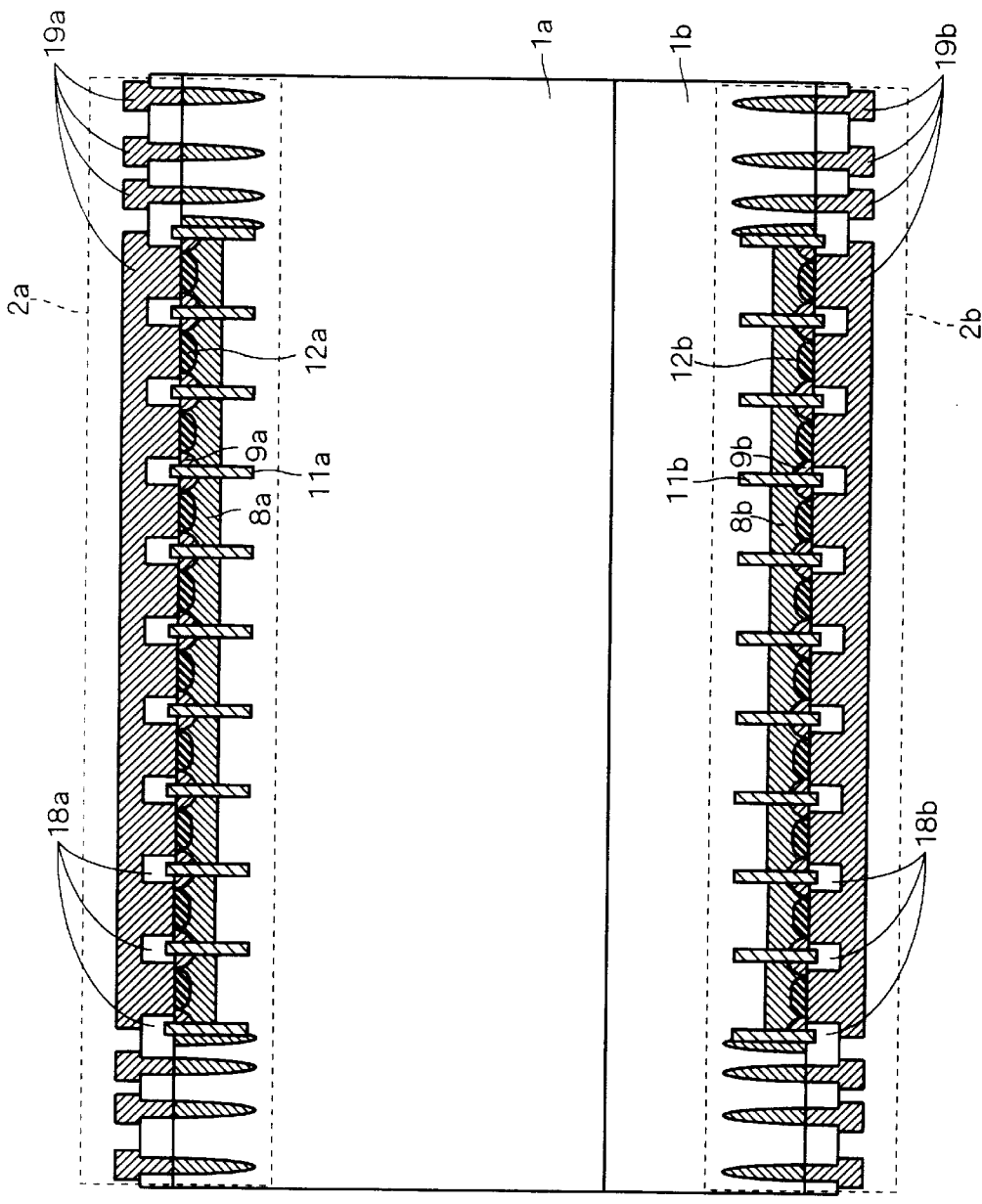

Finally, as shown FIG. 22, the source electrodes 19a made of, for example, an alloy of aluminum are formed in contact with the surface of the n-type source regions 9a. This completes the IGBT 500.

Although the wafer bonding technique is used in the above description, a conventional method of manufacturing a semiconductor device may be used to alternately produce the source-side structures 2a and 2b at the upper and lower main surfaces of a single silicon substrate.

<E-4. Characteristic Effect>

As above described, the application of the complementary signals to the gate terminals Ga and Gb allows the IGBT 500 according to the fifth preferred embodiment of the present invention to produce effects basically similar to those of the second preferred embodiment.

Additionally, current may flow in opposite directions from the source-side structures 2a and 2b. Therefore, the IGBT 500 may be also used as an alternative to a triac.

More specifically, with the positive voltage applied to the collector terminal C, turning on the gate terminal Ga and turning off the gate terminal Gb cause current to flow from the source-side structure 2b to the source-side structure 2a, and turning off the gate terminal Ga and turning on the gate terminal Gb cause no current to flow.

With the negative voltage applied to the collector terminal C, turning off the gate terminal Ga and turning on the gate terminal Gb cause current to flow from the source-side structure 2a to the source-side structure 2b, and turning on the gate terminal Ga and turning off the gate terminal Gb cause no current to flow.

Further, the IGBT 500 which has a collector-emitter breakdown voltage not less than a power supply voltage in opposite directions is less susceptible to breakdown if an abnormal voltage is applied.

Furthermore, a monitoring emitter region may be formed in the emitter region to switch the two gate terminals between on and off based on a monitor current given from the monitoring emitter region, thereby causing the IGBT 500 to perform a diode operation or a MOS transistor operation.

For example, when the IGBT switches from on to off with signals which are on and off applied respectively to the gate terminals Ga and Gb, an on-signal may be applied to the gate terminal Gb one μsec before turn-off to attenuate hole current in the semiconductor substrate 1, and thereafter the gate terminals Ga and Gb are turned off. This reduces switching power dissipation.

Although the steady-state power dissipation increases during the one-μsec on state of the gate terminal Gb, the total power dissipation may be reduced by setting a higher driving capability of the MOS transistor relative to the rated current.

Furthermore, the IGBT 500 may be operated as a diode, an IGBT or a MOS transistor with opposite polarities depending on how to apply the gate signal and the collector-emitter voltage. Therefore, the inverter circuit may be changed to a converter circuit.

<E-5. First Modification>

Figure 23:
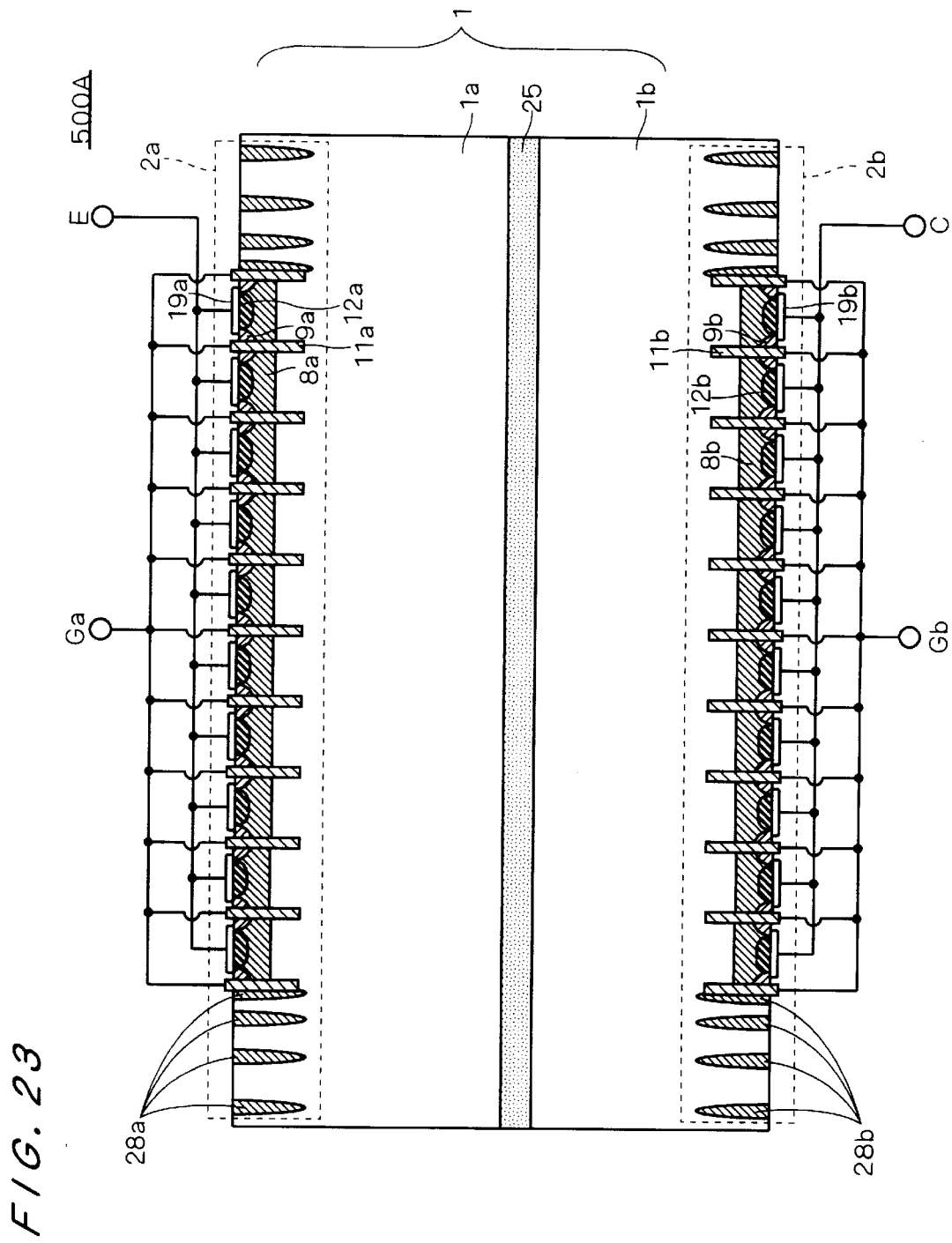
FIGS. 23 through 25 illustrate modifications of the power semiconductor device according to the fifth preferred embodiment of the present invention.

The above described IGBT 500 may be modified into an IGBT 500A shown in FIG. 23.

Specifically, the IGBT 500A has a short-lifetime region 25 having a short lifetime and extending parallel to the main surfaces in corresponding relation to at least regions where the p-type base regions 8a and 8b are formed, the short-lifetime region 25 being positioned closer to the source-side structure 2b than the middle of the thickness of the silicon substrate 1. For purposes of convenience, the short-lifetime region 25 shall divide the silicon substrate 1 into two parts: the substrate 1a which is closer to the source-side structure 2a and the substrate 1b which is closer to the source-side structure 2b.

The IGBT 500A having the short-lifetime region 25 is manufactured by irradiating a shallow drain-side region of one or both of the silicon substrates 1a and 1b with a particle beam to form crystal defects, thereby shortening the carrier lifetime, after the step shown in FIGS. 21 and 22 and before the bonding of the silicon substrates 1a and 1b in the manufacturing method of the IGBT 500 described with reference to FIGS. 17 through 22. This provides the short-lifetime region 25 shown in FIG. 23 after the bonding of the silicon substrates 1a and 1b.

After two crystalline substrates are joined together by the wafer bonding technique, if there is a difference in crystal axis orientation between the substrates, e.g. (100) and (111) planes or (100) and (110) planes, or a difference therebetween in plane orientation due to in-plane rotation of the substrates in spite of the same crystal axis orientation, a short-lifetime amorphous layer is formed at the junction interface of the two crystalline substrates. This short-lifetime amorphous layer may be utilized to provide the short-lifetime region 25 shown in FIG. 23 after the bonding of the silicon substrates 1a and 1b.

The difference in plane orientation due to the in-plane rotation occurs in a simple case when two silicon substrates are joined together with their orientation flat planes shifted from each other.

The use of the arrangement of the IGBT 500A allows the short-lifetime region 25 to suppress the injection of holes to reduce the energy dissipation due to switching when the IGBT 500A performs an IGBT operation.

Specifically, the n-type semiconductor layer having a high resistance is present between the channel and the collector layer of the MOS transistor so that the IGBT in the on state resists a high voltage. Holes are injected from the collector to decrease the resistance of the n-type semiconductor layer. However, when the IGBT is switched from the on state to the off state, it takes much time to turn off the IGBT because of the remaining holes, to cause energy dissipation. Therefore, for the use of the IGBT frequently switched, the rate of an on-to-off transition may be increased by suppressing the injection of holes from the collector, thereby reducing energy dissipation.

<E-6. Second Modification>

Figure 24:
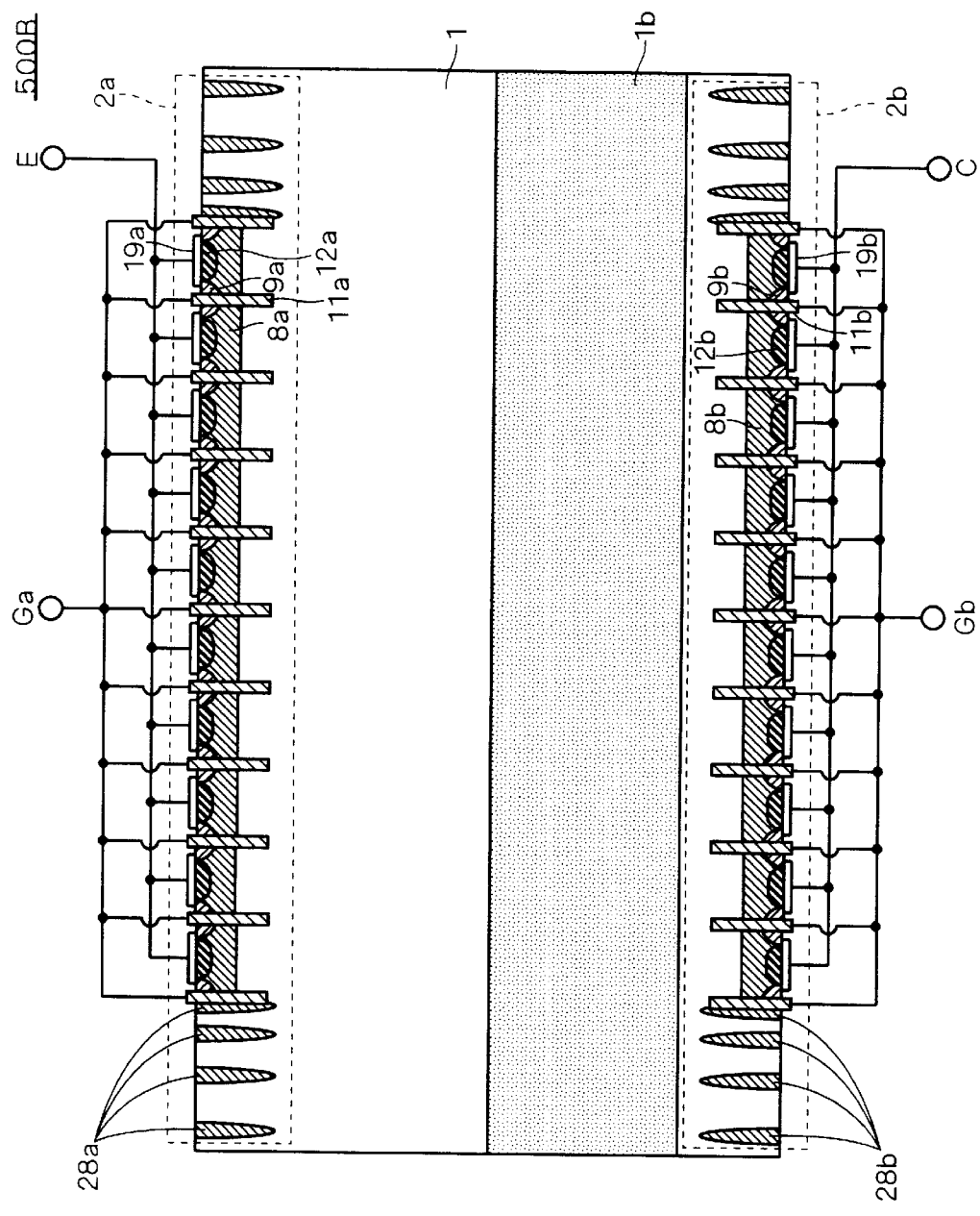

The IGBT 500 may be modified into an IGBT 500B shown in FIG. 24. The IGBT 500B features a difference in lifetime between respective parts the silicon substrate 1 which are closer to the source-side structures 2a and 2b.

Referring to FIG. 24, the silicon substrate 1 shall be divided into two parts: the substrate 1a which is closer to the source-side structure 2a and the substrate 1b which is closer to the source-side structure 2b. The lifetime in the substrate 1b is shorter than that in the substrate 1a.

The IGBT 500A wherein the lifetime in a drain layer closer to one of the two source-side structures is manufactured by irradiating one of the substrates with a particle beam or changing a substrate concentration after the step shown in FIGS. 21 and 22 and before the bonding of the silicon substrates 1a and 1b in the manufacturing method of the IGBT 500 described with reference to FIGS. 17 through 22.

The use of the arrangement of the IGBT 500B allows the silicon substrate 1b to suppress the injection of holes to reduce the energy dissipation due to switching when the IGBT 500B performs an IGBT operation.

The above-mentioned first and second modifications include the short-lifetime region 25 and the short-lifetime substrate 1b, respectively, closer to the source-side structure 2b, i.e., the collector terminal. The provision of injection suppressing means closer to the collector terminal is effective to suppress the injection of holes. Since a decrease in area of the injection suppressing means is more effective, the substrate 1b is thinner than the substrate 1a.

<E-7. Third Modification>

Figure 25:
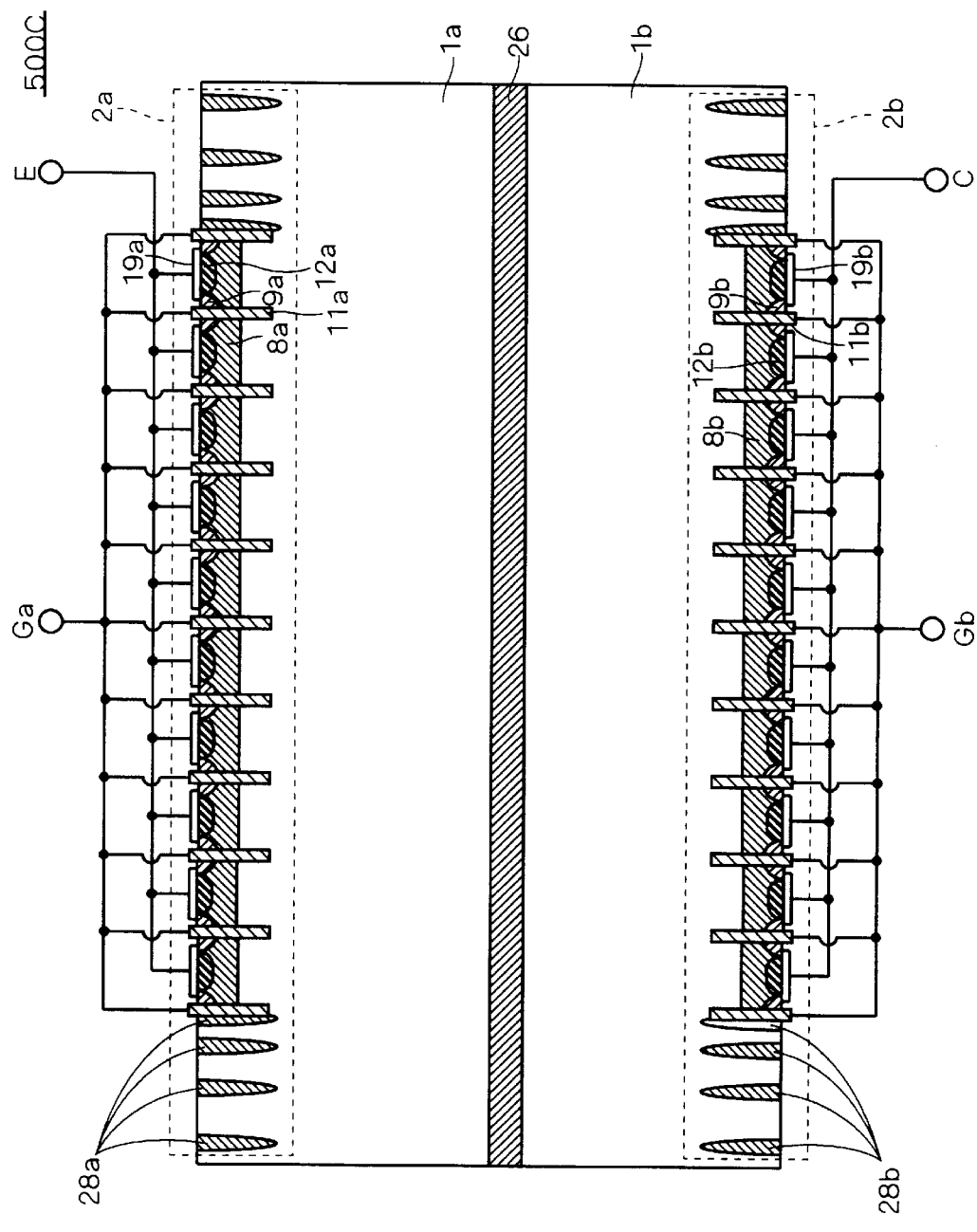

The IGBT 500 may be modified into an IGBT 500C shown in FIG. 25.

Specifically, the IGBT 500C has a metal layer or an n-type semiconductor layer 26 containing an n-type impurity of a high concentration (on the order of $1 \times 10^{16}$ to $1 \times 10^{20}/cm^3$) formed in the silicon substrate 1 and extending parallel to the main surfaces in corresponding relation to at least regions where the p-type base regions 8a and 8b are formed. For purposes of convenience, the metal layer 26 shall divide the silicon substrate 1 into two parts: the substrate 1a which is closer to the source-side structure 2a and the substrate 1b which is closer to the source-side structure 2b. The metal layer may be a single metal layer or an alloy layer.

The IGBT 500C having the metal layer (or high-concentration n-type semiconductor layer) 26 is manufactured by depositing a layer of metal such as aluminum on a drain-side main surface of one or both of the silicon substrates 1a and 1b by sputtering or implanting ions of an n-type impurity such as phosphorus and arsenic into a shallow drain-side region of one or both of the silicon substrates 1a and 1b after the step shown in FIGS. 21 and 22 and before the bonding of the silicon substrates 1a and 1b in the manufacturing method of the IGBT 500 described with reference to FIGS. 17 through 22.

The use of the arrangement of the IGBT 500C decreases the resistance of the metal layer (or high-concentration n-type semiconductor layer) 26 to decrease the on-state voltage.

<F. Sixth Preferred Embodiment>

<F-1. Device Construction>

Figure 26:
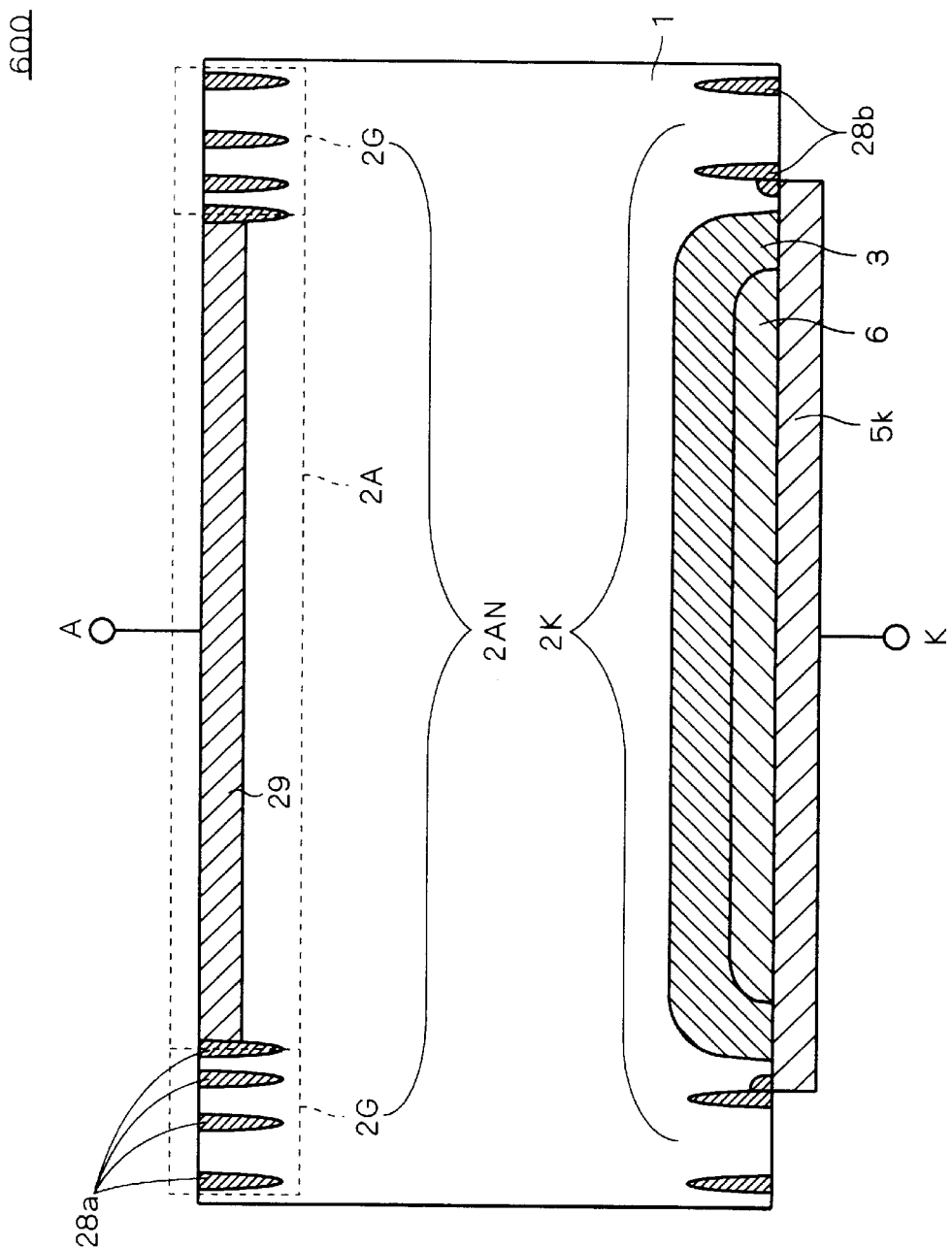
FIG. 26 illustrates the power semiconductor device according to a sixth preferred embodiment of the present invention.

The power semiconductor device according to a sixth preferred embodiment of the present invention will now be described with reference to FIGS. 26 through 37. FIG. 26 is a cross-sectional view of a free wheeling diode 600 in the power semiconductor device including an independent IGBT and the free wheeling diode.

With reference to FIG. 26, the free wheeling diode 600 comprises an anode layer 29 formed in the upper main surface of the n-type silicon substrate 1 and containing a p-type impurity of a concentration on the order of $1 \times 10^{13}$ to $1 \times 10^{18}/cm^3$. An anode electrode not shown is formed on the surface of the anode layer 29. The anode electrode is electrically connected to an anode terminal A. A region in which the anode layer 29 is formed is referred to hereinafter as an anode region 2A.

The plurality of p-type semiconductor regions 28a at a floating potential are arranged concentrically to surround the anode region 2A to define an electric field relieving ring region 2G. The anode region 2A and the electric field relieving ring region 2G are generically referred to hereinafter as an anode-side structure 2AN.

The n-type buffer layer 3 is selectively formed in the lower main surface of the silicon substrate 1. The n-type cathode region 6 containing an n-type impurity of a relatively high concentration is selectively formed in the surface of the n-type buffer layer 3. A cathode electrode 5k of metal is formed in contact with the n-type buffer layer 3, the n-type cathode region 6 and the surface of the silicon substrate 1. The cathode electrode 5k is electrically connected to a cathode terminal K. The plurality of p-type semiconductor regions 28b at a floating potential are arranged concentrically to surround the n-type buffer layer 3. The n-type buffer layer 3, the n-type cathode region 6 and the p-type semiconductor regions 28b are generically referred to hereinafter as a cathode-side structure 2K. Respective ones of the p-type semiconductor regions 28a and 28b which are positioned innermost are at an anode potential and a cathode potential, respectively. The remaining p-type semiconductor regions 28a and 28b are at the floating potential.

The n-type cathode region 6 is provided to make an ohmic contact between the cathode electrode 5k and the n-type buffer layer 3. The silicon substrate 1 corresponds to an "i" layer of the pin diode.

Figure 27:
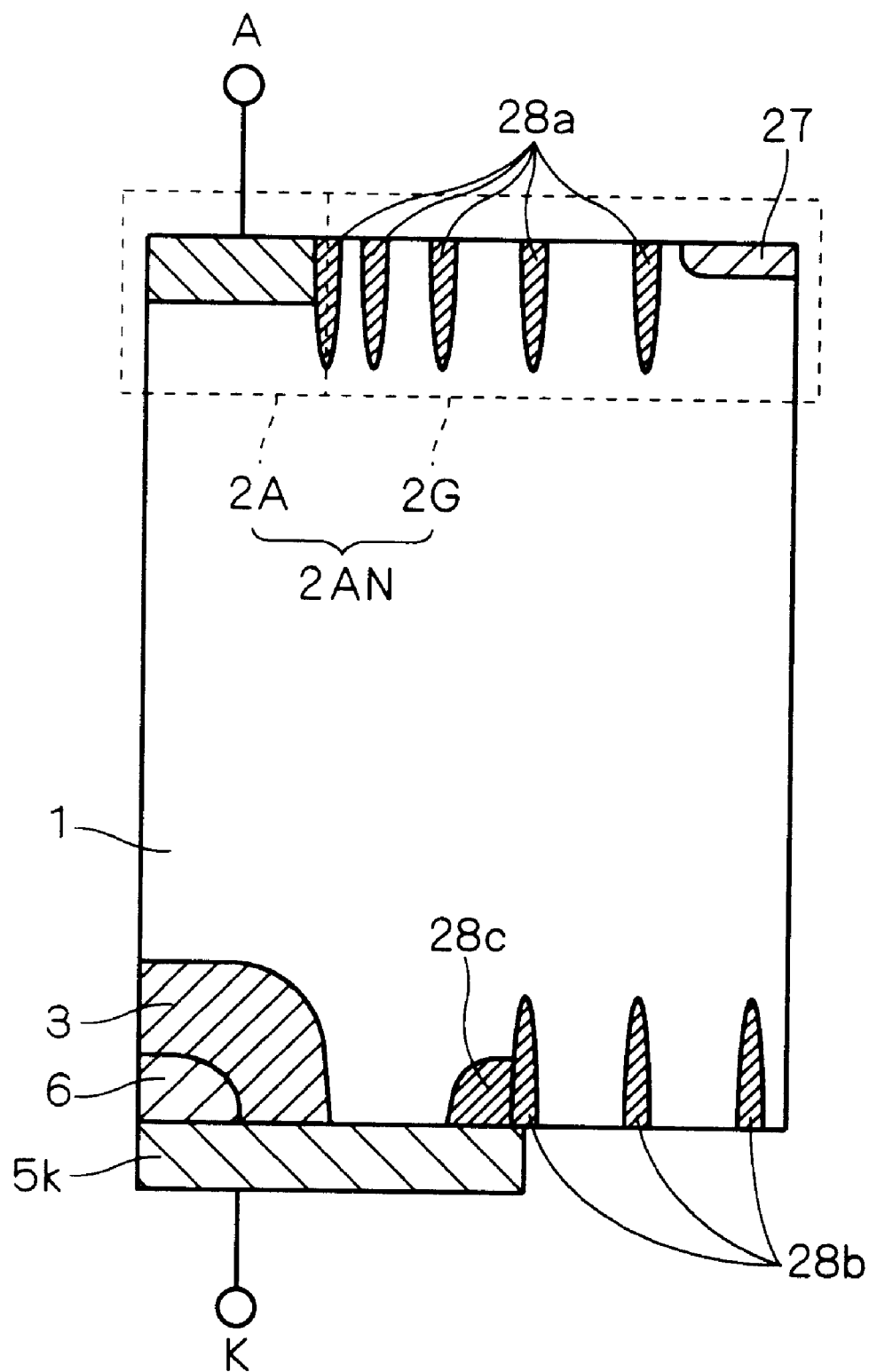
FIG. 27 is a detail view of the power semiconductor device according to the sixth preferred embodiment of the present invention.

FIG. 27 shows the details of a peripheral region of the free wheeling diode 600. Referring to FIG. 27, the p-type semiconductor regions 28a are spaced at outwardly gradually increasing intervals. The p-type semiconductor regions 28b are also spaced at outwardly gradually increasing intervals, but the change in the spacings between the p-type semiconductor regions 28b is more gradual than that in the spacings between the p-type semiconductor regions 28a. Such an arrangement may relieve the electric field most efficiently when a positive voltage is applied to the cathode electrode 5k.

A shallow n-type semiconductor region 27 at a floating potential and containing an n-type impurity of a concentration on the order of $1 \times 10^{18}$ to $1 \times 10^{20}/cm^3$ is formed in a peripheral part of the electric field relieving ring region 2G. The p-type semiconductor region 28b positioned nearest to the n-type buffer layer 3 is connected to a shallow p-type semiconductor region 28c for ensuring the connection to the cathode electrode 5k.

<F-2. Operation>

The p-type semiconductor regions 28a and 28b at the floating potential are provided to relieve the electric field in the peripheral part, and are adapted to hold a fixed electric field by expanding a depletion layer adjacent a pn junction.

Figure 39:
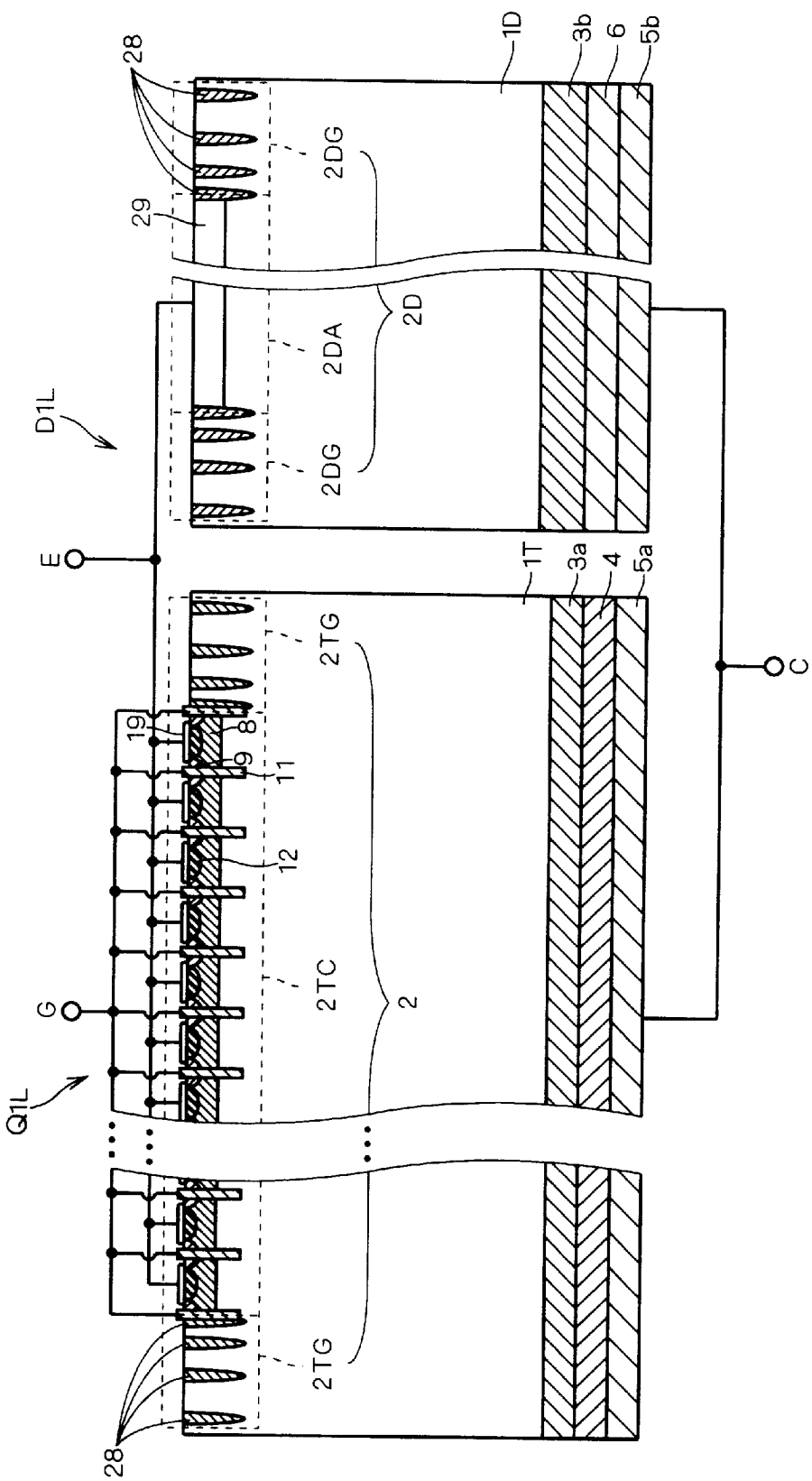
FIG. 39 illustrates a background art power semiconductor device.
Figure 40:
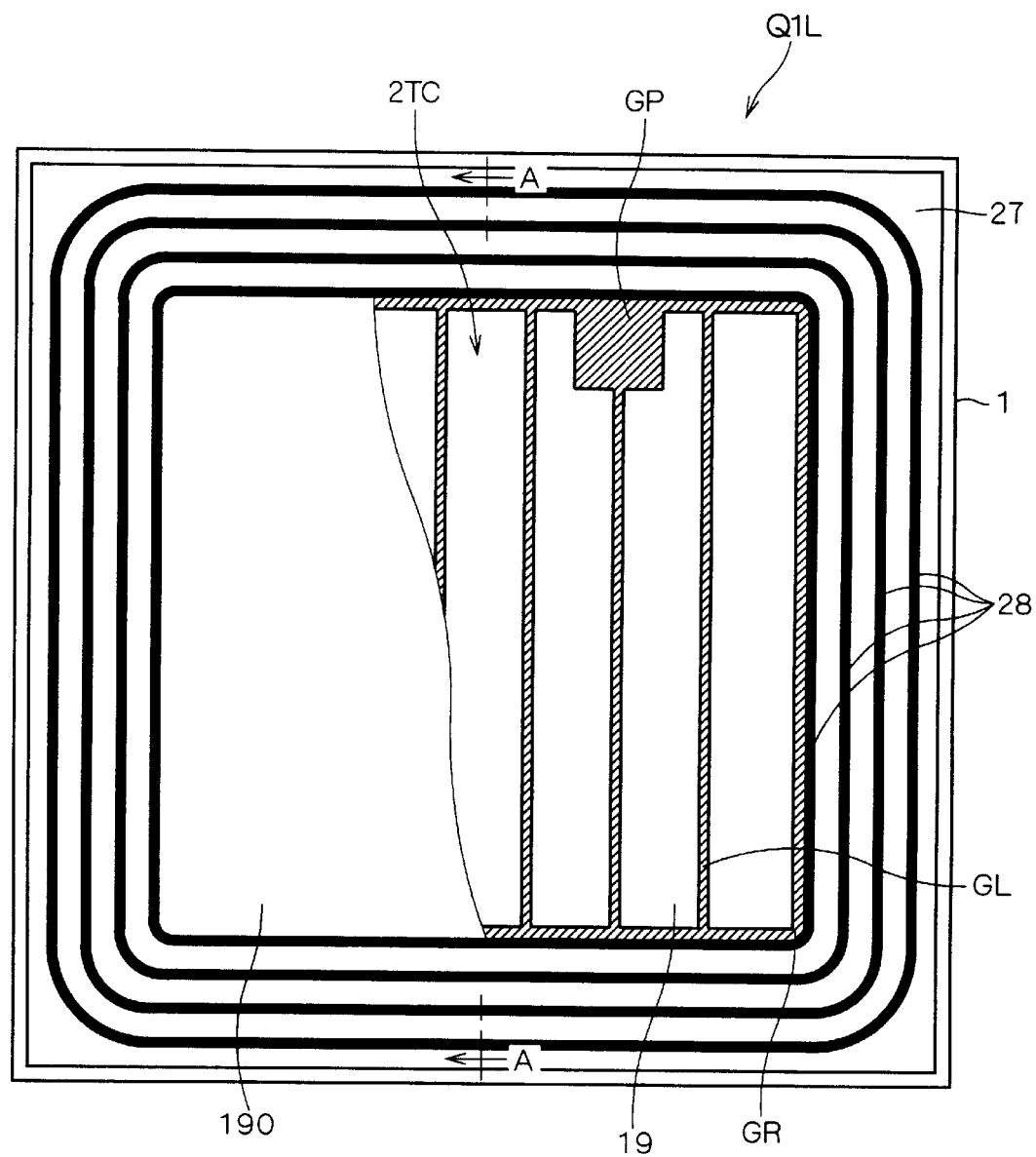
FIGS. 40 and 41 are plan views of the background art power semiconductor device.
Figure 41:
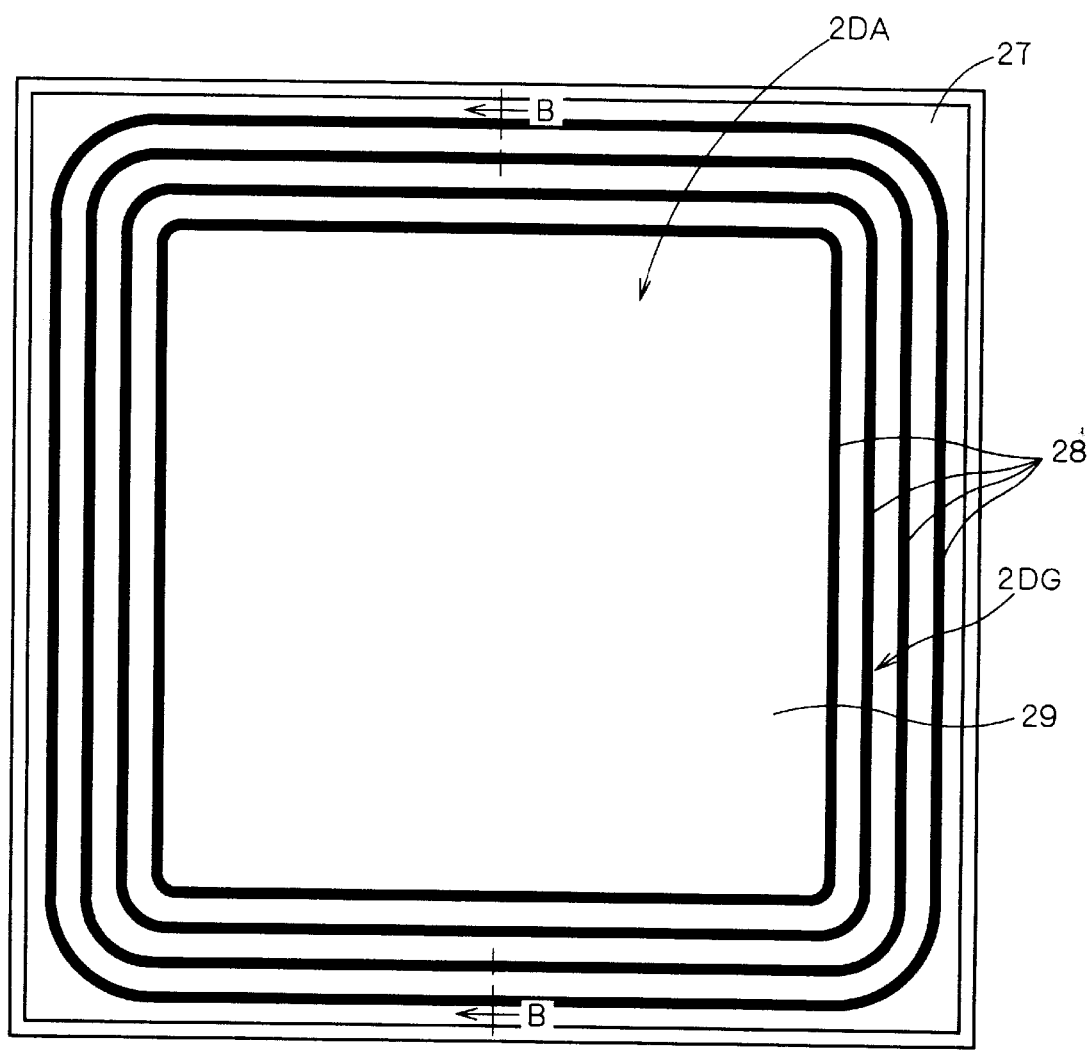
Figure 42:
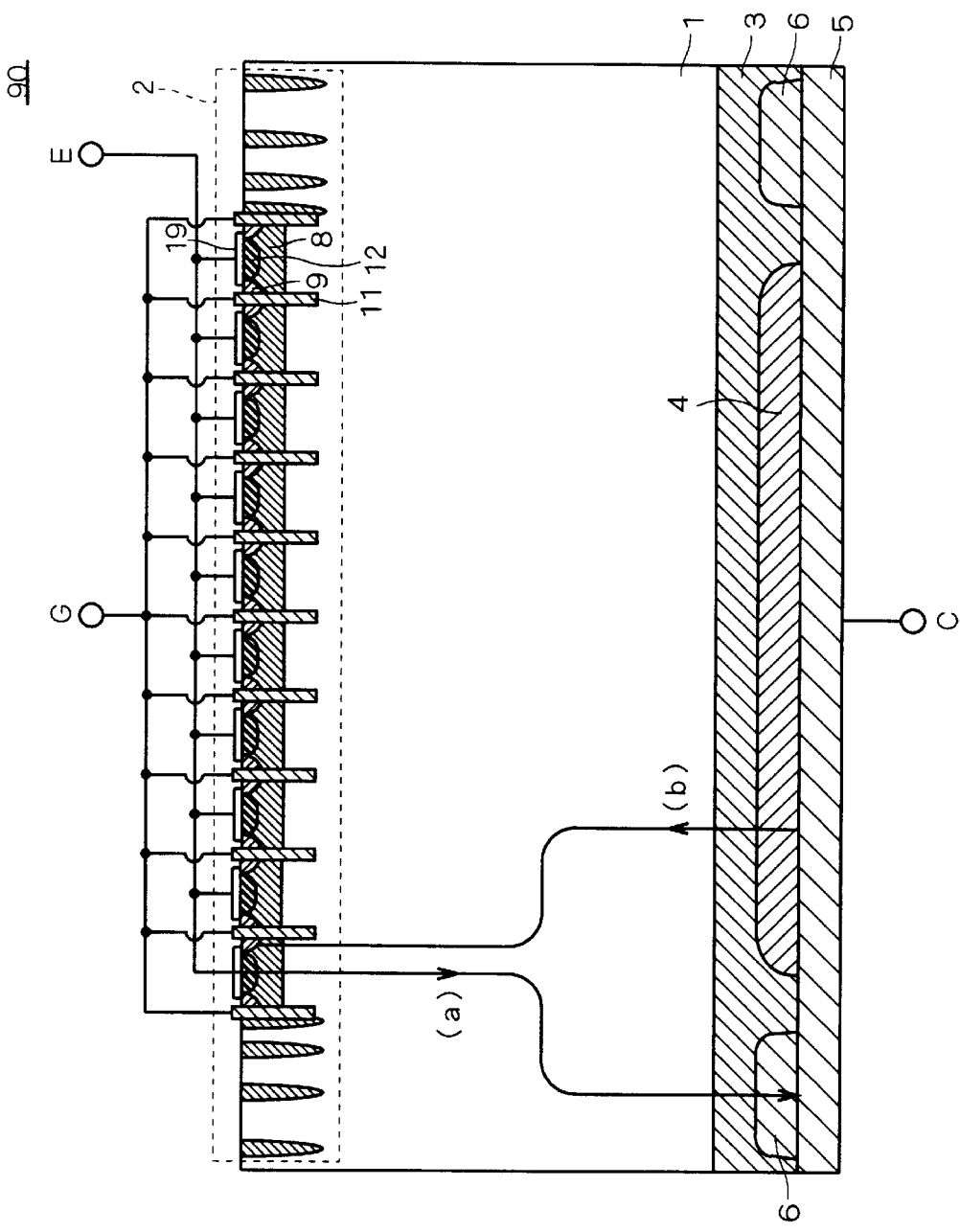
FIG. 42 illustrates the operation of the background art power semiconductor device.

In the diode D1L shown in FIG. 39, when a positive voltage is applied to the cathode electrode 5k, the voltage at the same level as the positive voltage is applied to the peripheral part, i.e., the electric field relieving ring region 2DG. However, the plurality of p-type semiconductor regions 28b at the floating potential and surrounding the n-type buffer layer 3 expands the depletion layer adjacent the pn junction of the p-type semiconductor regions 28b and the n-type silicon substrate 1 to develop a voltage drop. This decreases the voltage applied to the electric field relieving ring region 2G to reduce the number of and spacings between the p-type semiconductor regions 28a.

Although the shallow n-type semiconductor region 27 at the floating potential is formed in the peripheral part of the electric field relieving ring region 2G in the arrangement of FIG. 27, an n-type semiconductor region may be formed in a region wherein the p-type semiconductor regions 28b are formed in the lower main surface of the silicon substrate 1. The n-type semiconductor region can prevent the depletion layer from extending to the end surface of the substrate.

<F-3. Method of Manufacturing>

A method of manufacturing the free wheeling diode 600 will be described with reference to FIGS. 28 through 33 which sequentially show the manufacturing steps.

Figure 28:
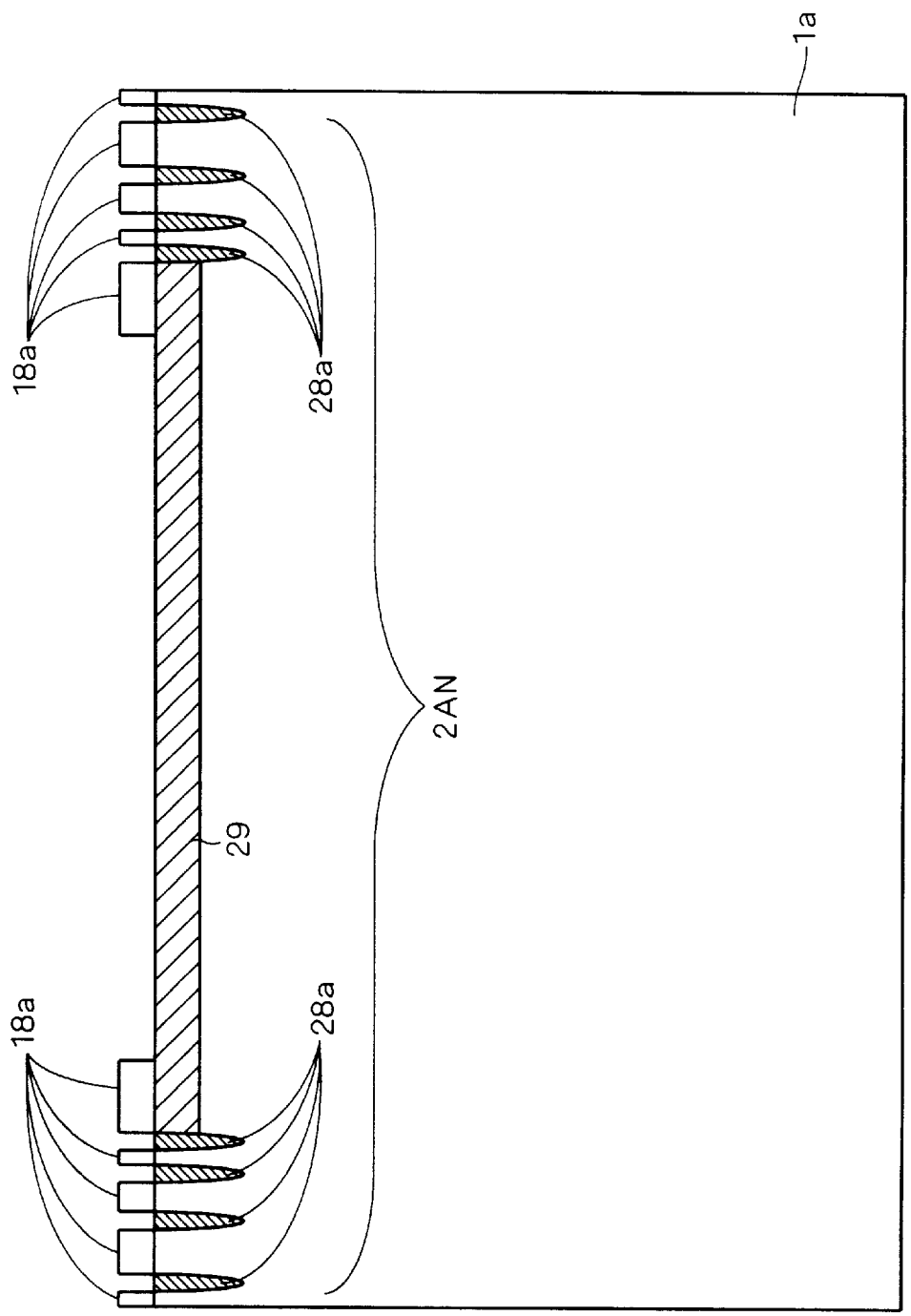
FIGS. 28 through 33 illustrate a method of manufacturing the power semiconductor device according to the sixth preferred embodiment of the present invention.
Figure 29:
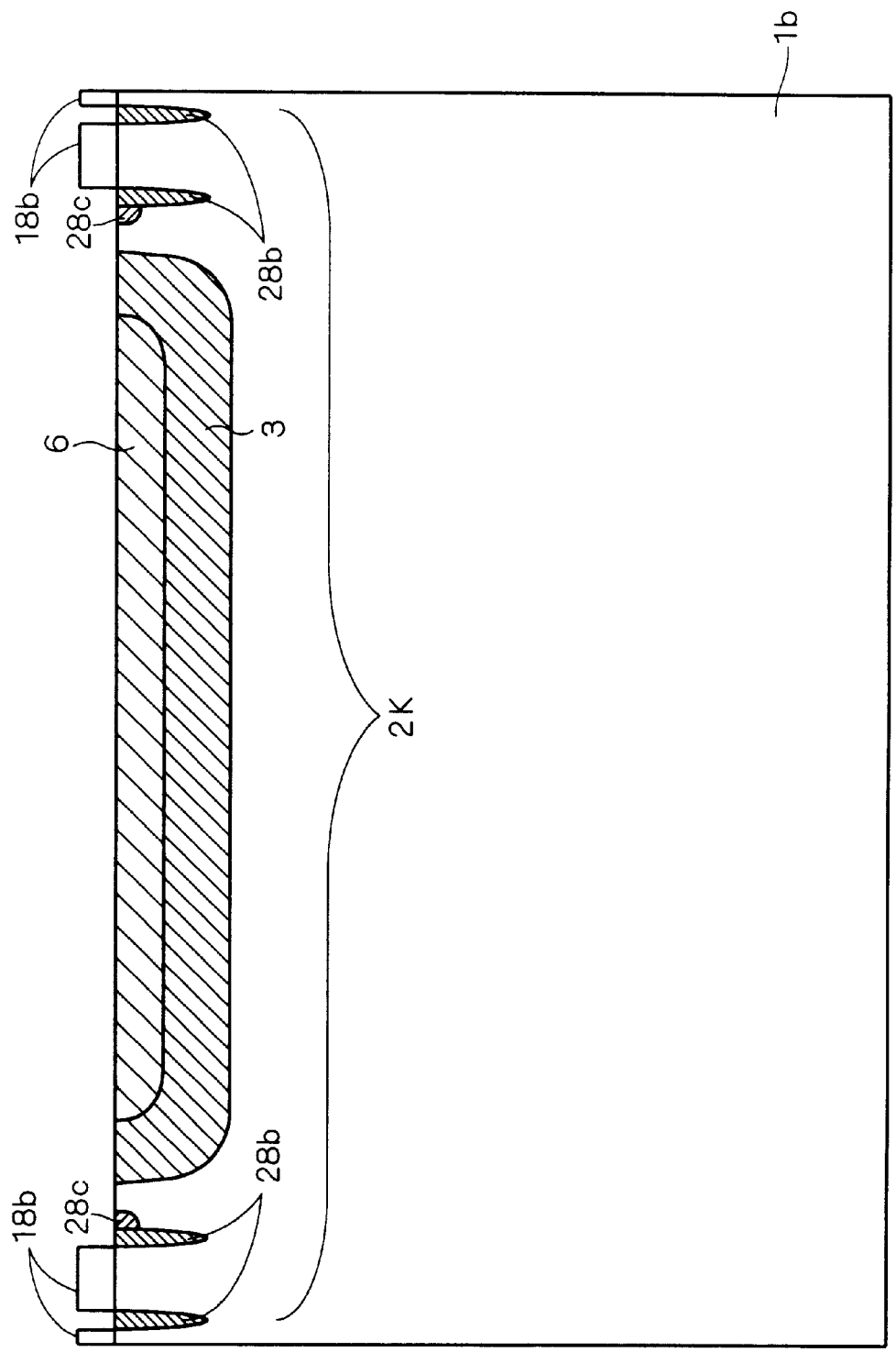

Initially, as illustrated in FIGS. 28 and 29, the n-type silicon substrates 1a and 1b having an impurity concentration on the order of $1 \times 10^{13}$ to $1 \times 10^{15}/cm^3$ are prepared. The anode-side structure 2AN and the cathode-side structure 2K are formed at respective one main surfaces of the n-type silicon substrates 1a and 1b. In this step, the p-type semiconductor regions 28a are less in number and in spacing therebetween than those of the background art free wheeling diode. Thereafter, the interlayer insulation film 18a for providing electrical isolation between the anode electrode to be formed later and the p-type semiconductor regions 28a and the interlayer insulation film 18b for providing electrical isolation between the cathode electrode to be formed later and the p-type semiconductor regions 28b are selectively formed. The p-type semiconductor region 28c is formed when the p-type semiconductor regions 28b are formed. The n-type semiconductor region (not shown) is formed after the p-type semiconductor regions 28a are formed.

A method of manufacturing the anode-side structure 2AN is similar to the background art method of manufacturing the free wheeling diode. The cathode-side structure 2K is provided by selectively forming the n-type buffer layer 3 in the surface of the silicon substrate 1 by the general ion implantation technique, selectively forming the n-type cathode region 6 in the surface of the n-type buffer layer 3, and forming the p-type semiconductor regions 28b so as to surround the n-type buffer layer 3.

Figure 30:
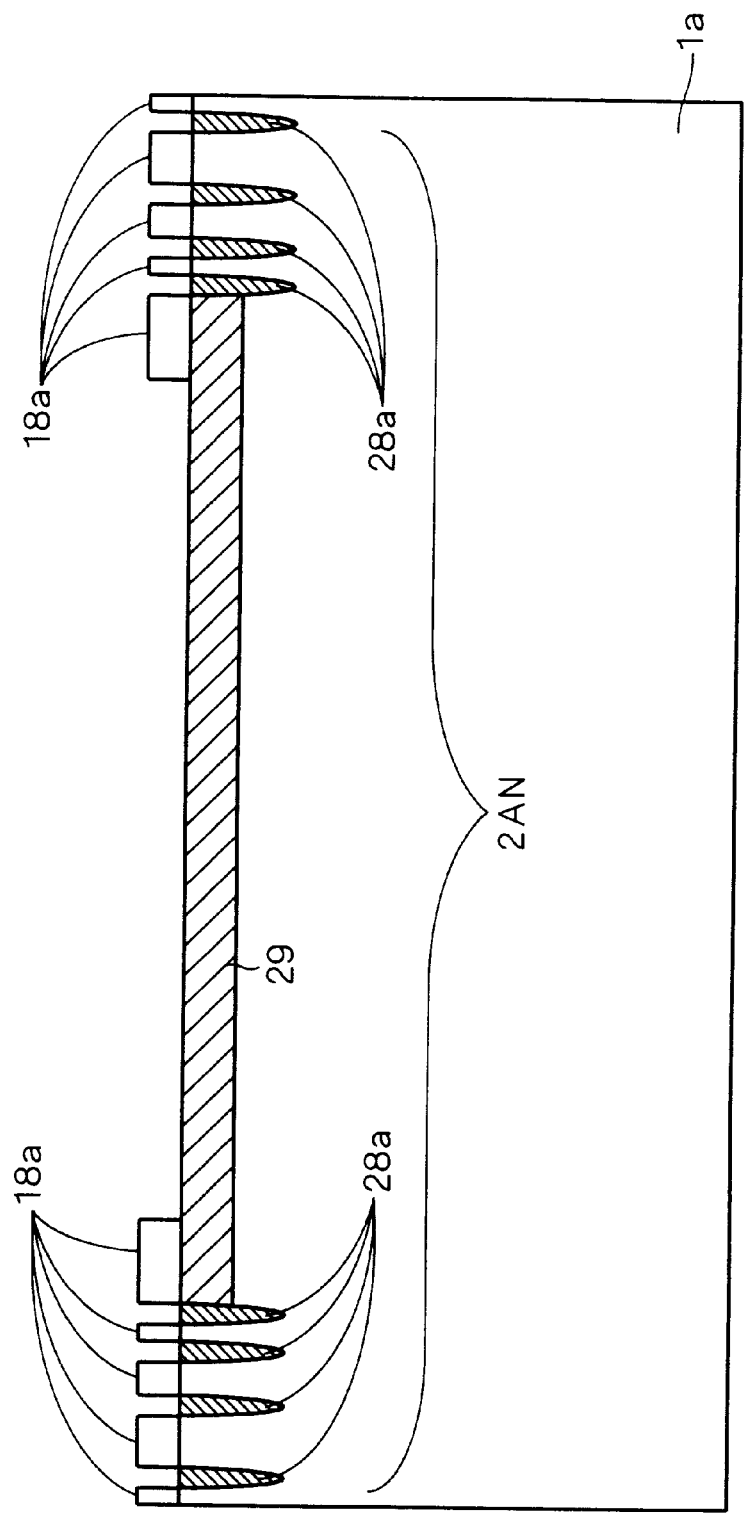
Figure 31:
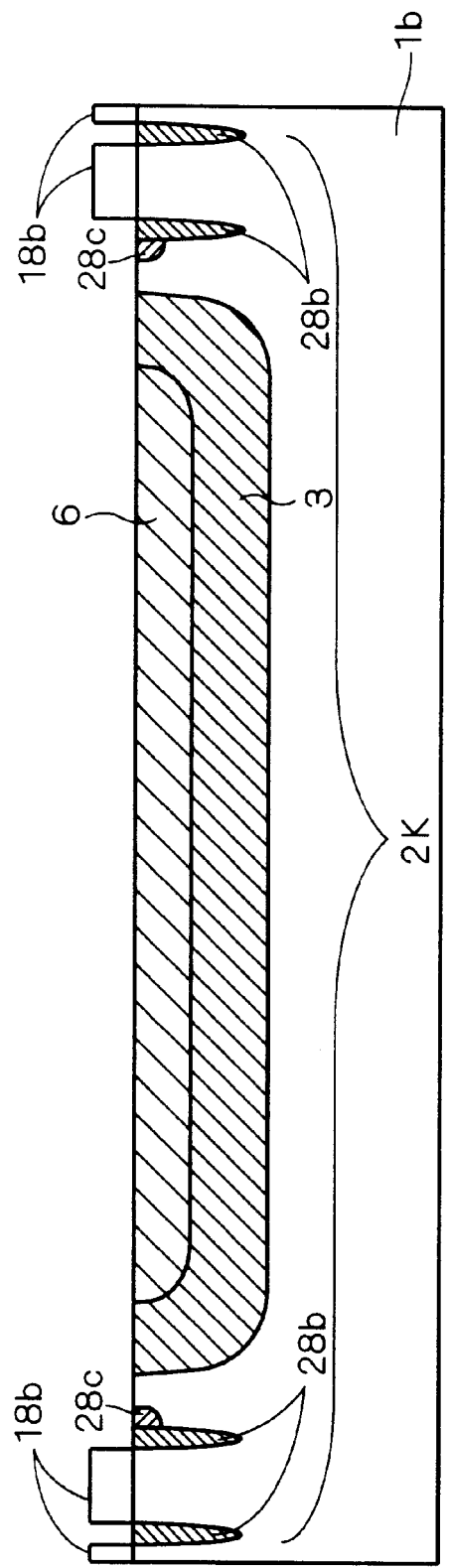

Next, as illustrated in FIGS. 30 and 31, the silicon substrates 1a and 1b are polished to a predetermined thickness until the silicon substrate 1b is thinner than the silicon substrate 1a.

Figure 32:
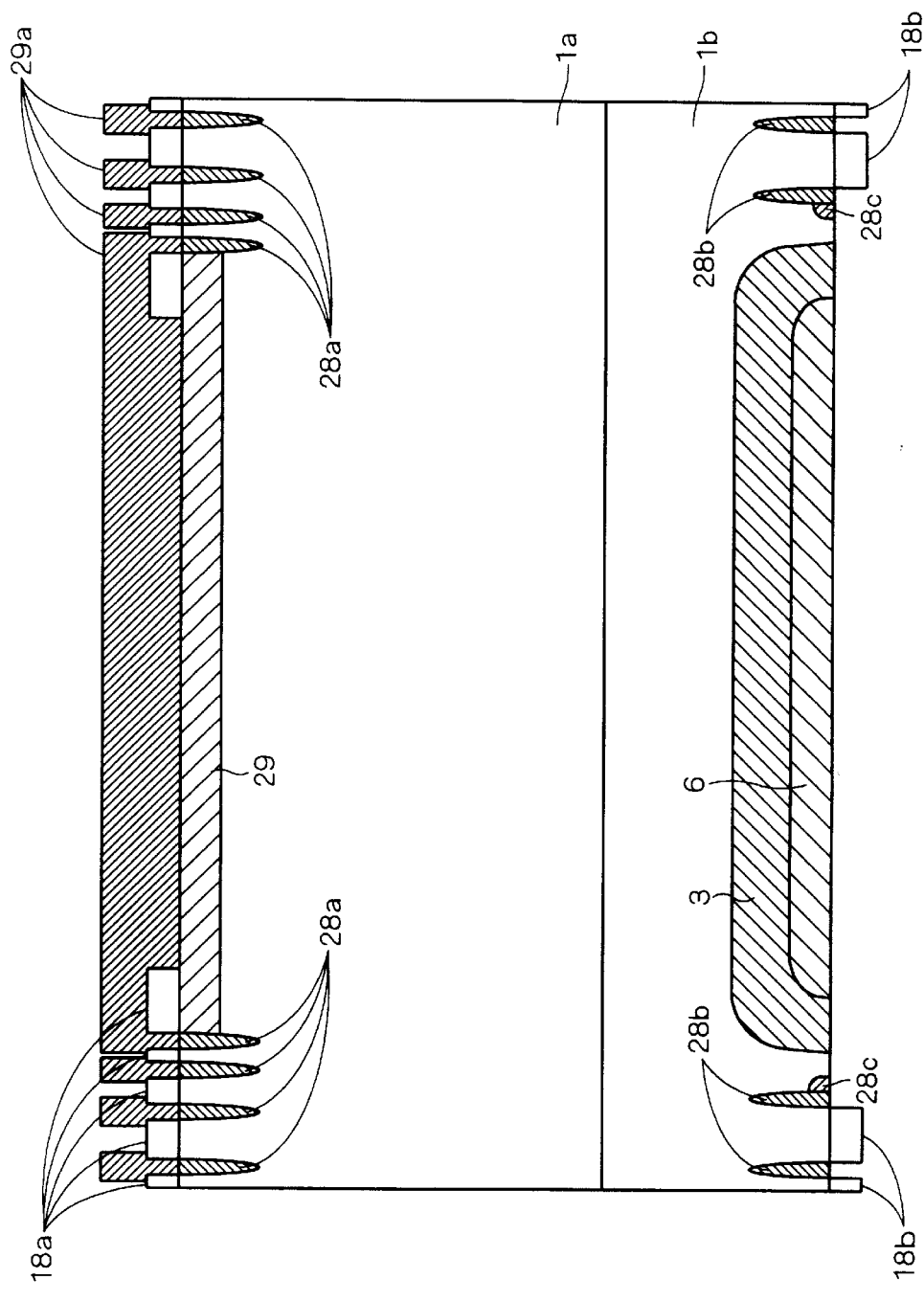

With reference to FIG. 32, the polished silicon substrates 1a and 1b are joined together by the wafer bonding technique. An anode electrode 29a made of, for example, an alloy of aluminum is formed in contact with the surface of the anode layer 29.

Figure 33:
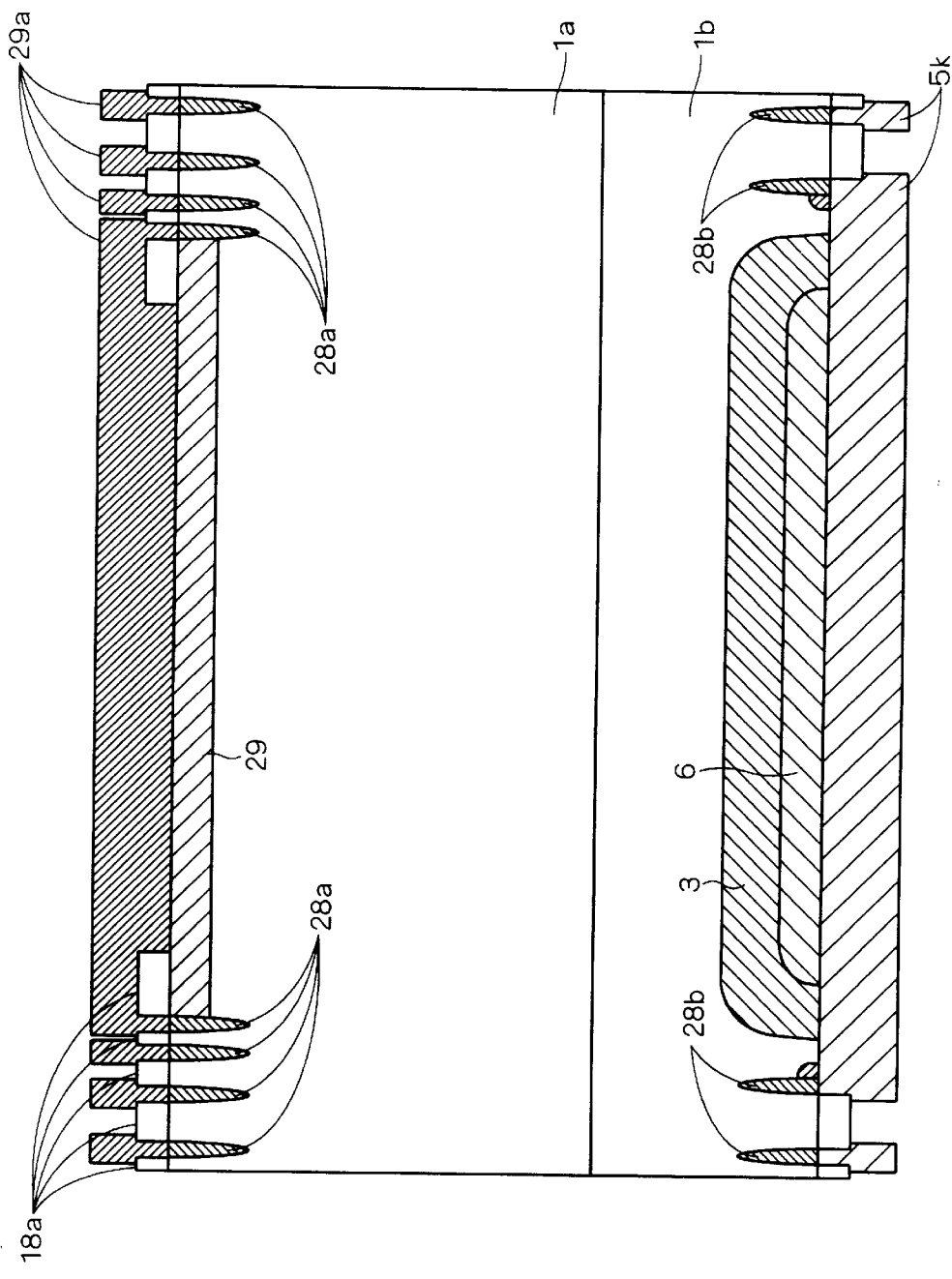

Finally, as illustrated in FIG. 33, the cathode electrode 5k made of, for example, an alloy of aluminum is formed in contact with the n-type buffer layer 3, the n-type cathode region 6 and the surface of the silicon substrate 1. This completes the free wheeling diode 600.

Although the wafer bonding technique is used in the above description, a conventional method of manufacturing a semiconductor device may be used to alternately produce the anode-side structure 2AN and the cathode-side structure 2K at the upper and lower main surfaces of a single silicon substrate.

<F-4. Characteristic Effect>

The above-mentioned free wheeling diode 600 according to the sixth preferred embodiment of the present invention includes the plurality of p-type semiconductor regions 28b at the floating potential and surrounding the n-type buffer layer 3 to decrease the voltage applied to the electric field relieving ring region 2G, thereby reducing the number of and spacings between the p-type semiconductor regions 28a to be provided in the electric field relieving ring region 2G. This reduces the area of the peripheral region and, accordingly, the device area, to achieve the reductions in size and costs of the power semiconductor device including the independent IGBT and free wheeling diode.

Although the sixth preferred embodiment illustrates the electric field relieving ring including the plurality of p-type semiconductor region at the floating potential, the present invention is similarly effective when a field plate including an oxide film formed on the main surface of the substrate and an electrode formed on the oxide film is provided in place of the p-type semiconductor regions. The field plate functions to induce electric charges having a polarity opposite from the polarity of the voltage applied to the electrode thereof to relieve the electric field in the depletion layer.

<F-5. First Modification>

Figure 34:
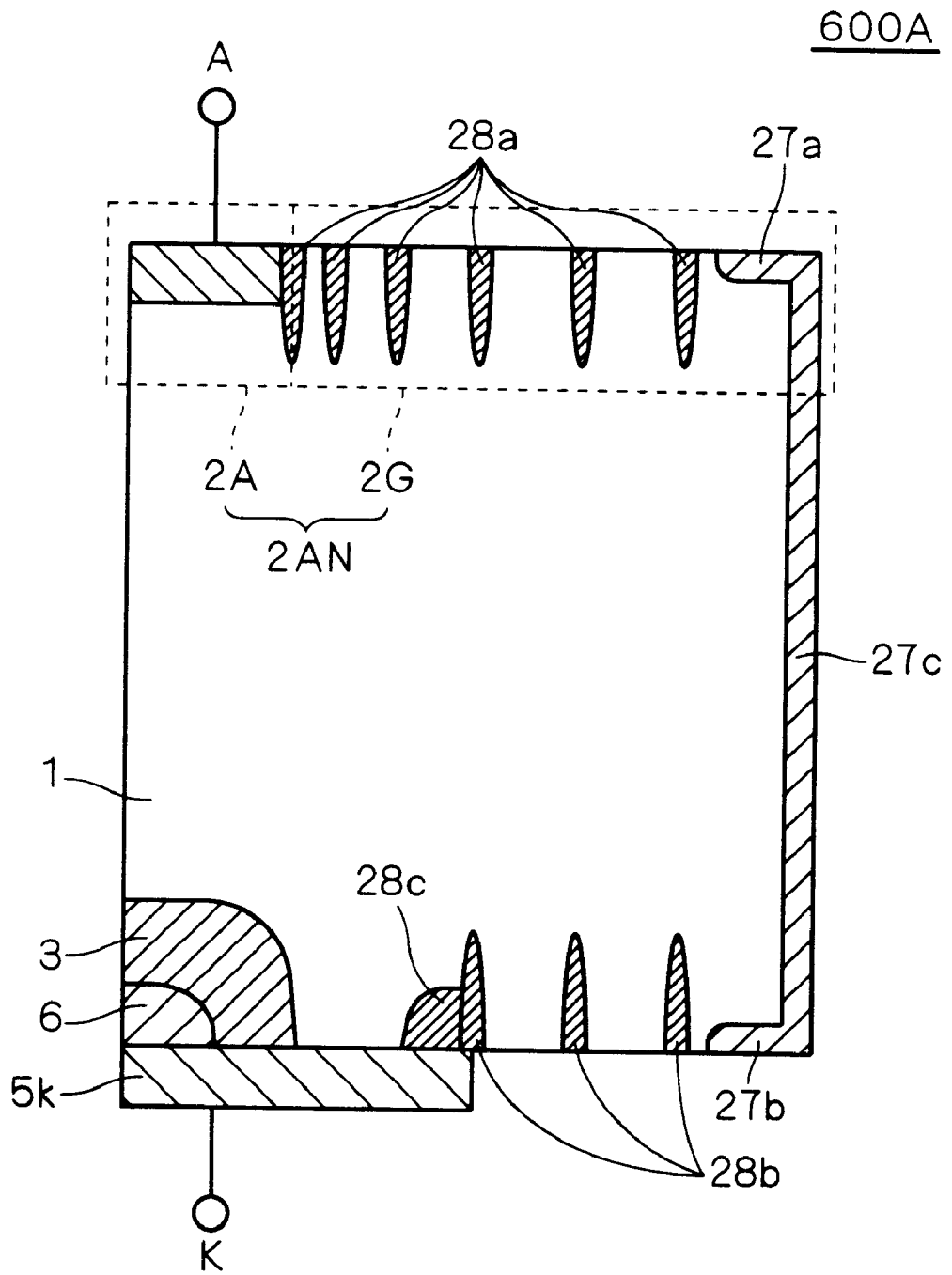
FIGS. 34 through 37 illustrate modifications of the power semiconductor device according to the sixth preferred embodiment of the present invention.

The above-mentioned free wheeling diode 600 may be modified into a free wheeling diode 600A shown in FIG. 34.

FIG. 34 shows the details of a peripheral region of the free wheeling diode 600A. As illustrated in FIG. 34, a shallow n-type semiconductor region 27a at a floating potential is formed in the peripheral part of the electric field relieving ring region 2G, and a shallow n-type semiconductor region 27b at a floating potential is also formed in a peripheral part of a region wherein the p-type semiconductor regions 28b is formed in the lower main surface of the silicon substrate 1.

An n-type semiconductor region 27c at a floating potential is formed on a side surface of the silicon substrate 1.

The n-type semiconductor regions 27a and 27b are manufactured by selectively implanting ions of an n-type impurity into the peripheral part of the respective substrate main surfaces after the step shown in FIGS. 30 and 31 and before the bonding of the silicon substrates 1a and 1b in the manufacturing method of the free wheeling diode 600 described with reference to FIGS. 28 through 33.

The n-type semiconductor region 27c is formed by implanting ions of an n-type impurity in an oblique direction after the bonding of the silicon substrates 1a and 1b or exposing the bonded substrates to an n-type impurity atmosphere.

Thus, the formation of the n-type semiconductor region on the side surface of the substrate prevents the depletion layer from extending to the substrate side surface.

<F-6. Second Modification>

Figure 35:
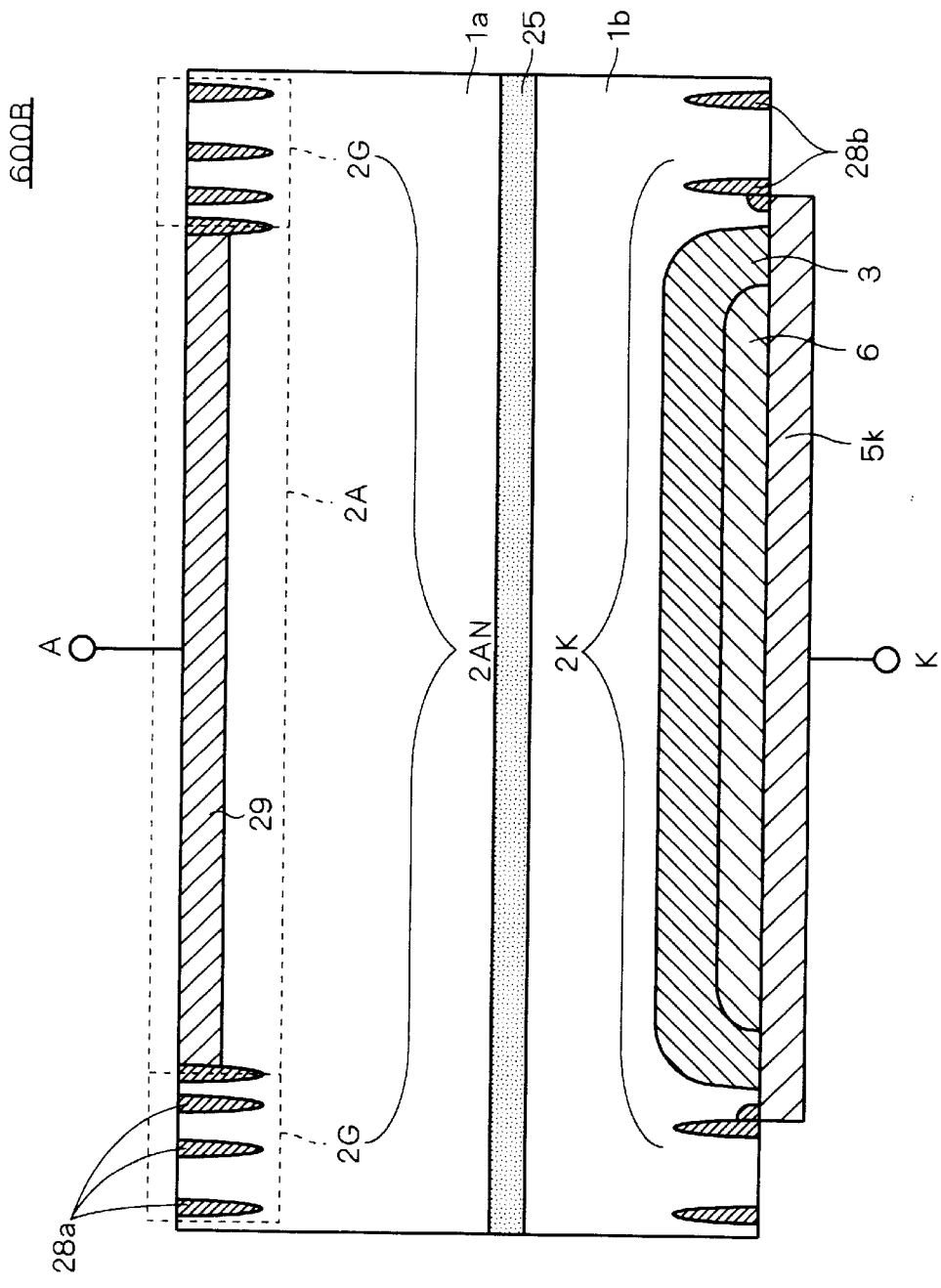

The above-mentioned free wheeling diode 600 may be modified into a free wheeling diode 600B shown in FIG. 35.

Specifically, the free wheeling diode 600B has the short-lifetime region 25 having a short lifetime and positioned closer to the cathode-side structure 2K than the middle of the thickness- of the silicon substrate 1. For purposes of convenience, the short-lifetime region 25 shall divide the silicon substrate 1 into two parts: the substrate 1a which is closer to the anode-side structure 2AN and the substrate 1b which is closer to the cathode-side structure 2K.

The free wheeling diode 600B having the short-lifetime region 25 is manufactured by irradiating a shallow region of one or both of the silicon substrates 1a and 1b with a particle beam to form crystal defects, thereby shortening the carrier lifetime, after the step shown in FIGS. 30 and 31 and before the bonding of the silicon substrates 1a and 1b in the manufacturing method of the free wheeling diode 600 described with reference to FIGS. 28 through 33. This provides the short-lifetime region 25 shown in FIG. 35 after the bonding of the silicon substrates 1a and 1b.

After two crystalline substrates are joined together by the wafer bonding technique, if there is a difference in crystal axis orientation between the substrates, e.g. (100) and (111) planes or (100) and (110) planes, or a difference therebetween in plane orientation due to in-plane rotation of the substrates in spite of the same crystal axis orientation, a short-lifetime amorphous layer is formed at the junction interface of the two crystalline substrates. This shortlifetime amorphous layer may be utilized to provide the short-lifetime region 25 shown in FIG. 35 after the bonding of the silicon substrates 1a and 1b.

The use of the arrangement of the free wheeling diode 600B allows the shortlifetime region 25 to suppress the injection of holes to reduce the energy dissipation due to switching.

<F-7. Third Modification>

Figure 36:
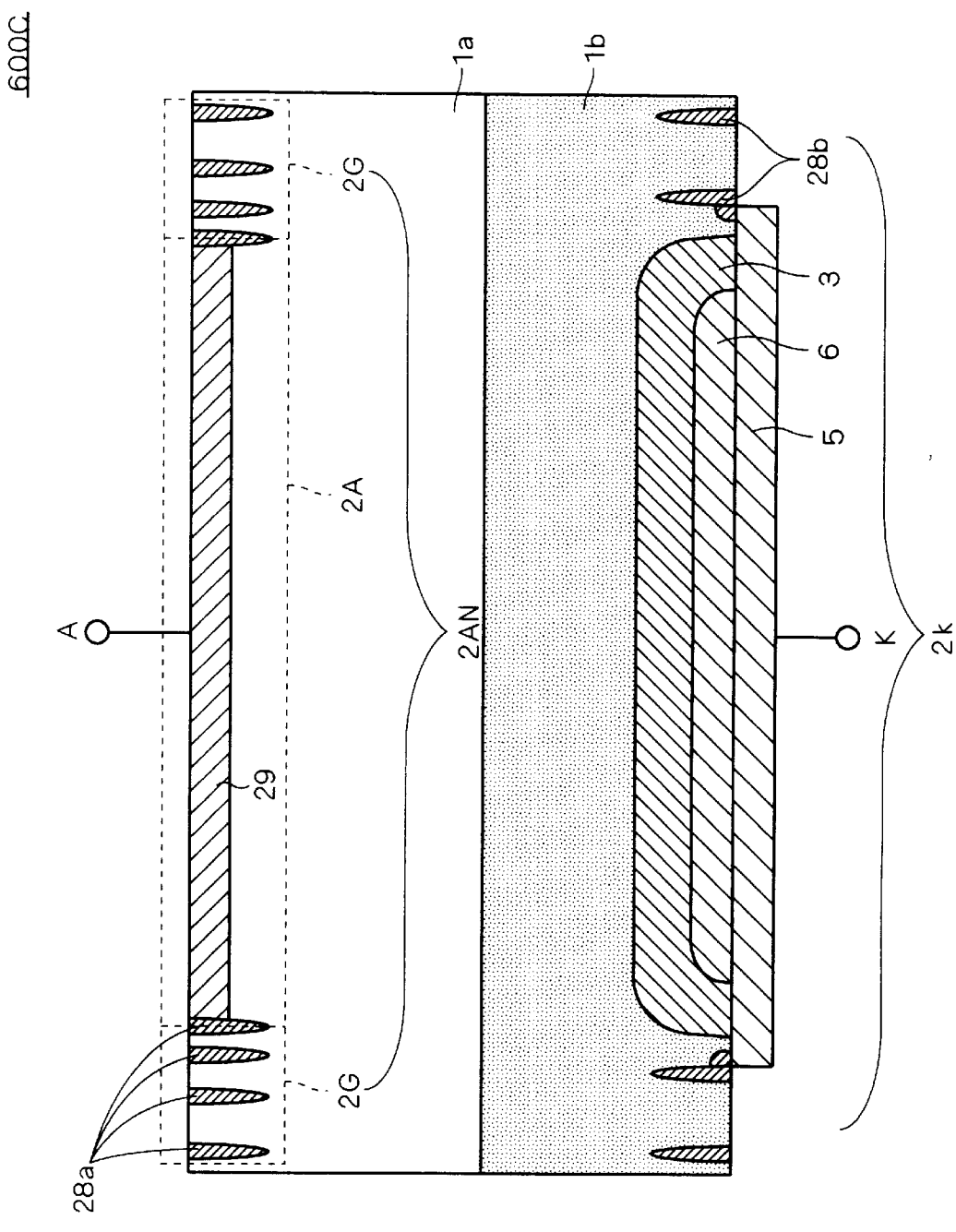

The free wheeling diode 600 may be modified into a free wheeling diode 600C shown in FIG. 36. The free wheeling diode 600C features a difference in lifetime between respective parts the silicon substrate 1 which are closer to the anode-side and cathode-side structures 2AN and 2K.

Referring to FIG. 36, the silicon substrate 1 shall be divided into two parts: the substrate 1a which is closer to the anode-side structure 2AN and the substrate 1b which is closer to the cathode-side structure 2K. The lifetime in the substrate 1b is shorter than that in the substrate 1a.

The free wheeling diode 600C having such a structure is manufactured by irradiating the substrate 1b with a particle beam or changing a substrate concentration after the step shown in FIGS. 30 and 31 and before the bonding of the silicon substrates 1a and 1b in the manufacturing method of the free wheeling diode 600 described with reference to FIGS. 28 through 33.

The use of the arrangement of the free wheeling diode 600C allows the silicon substrate 1b to suppress the injection of holes to reduce the energy dissipation due to switching.

<F-8. Fourth Modification>

Figure 37:
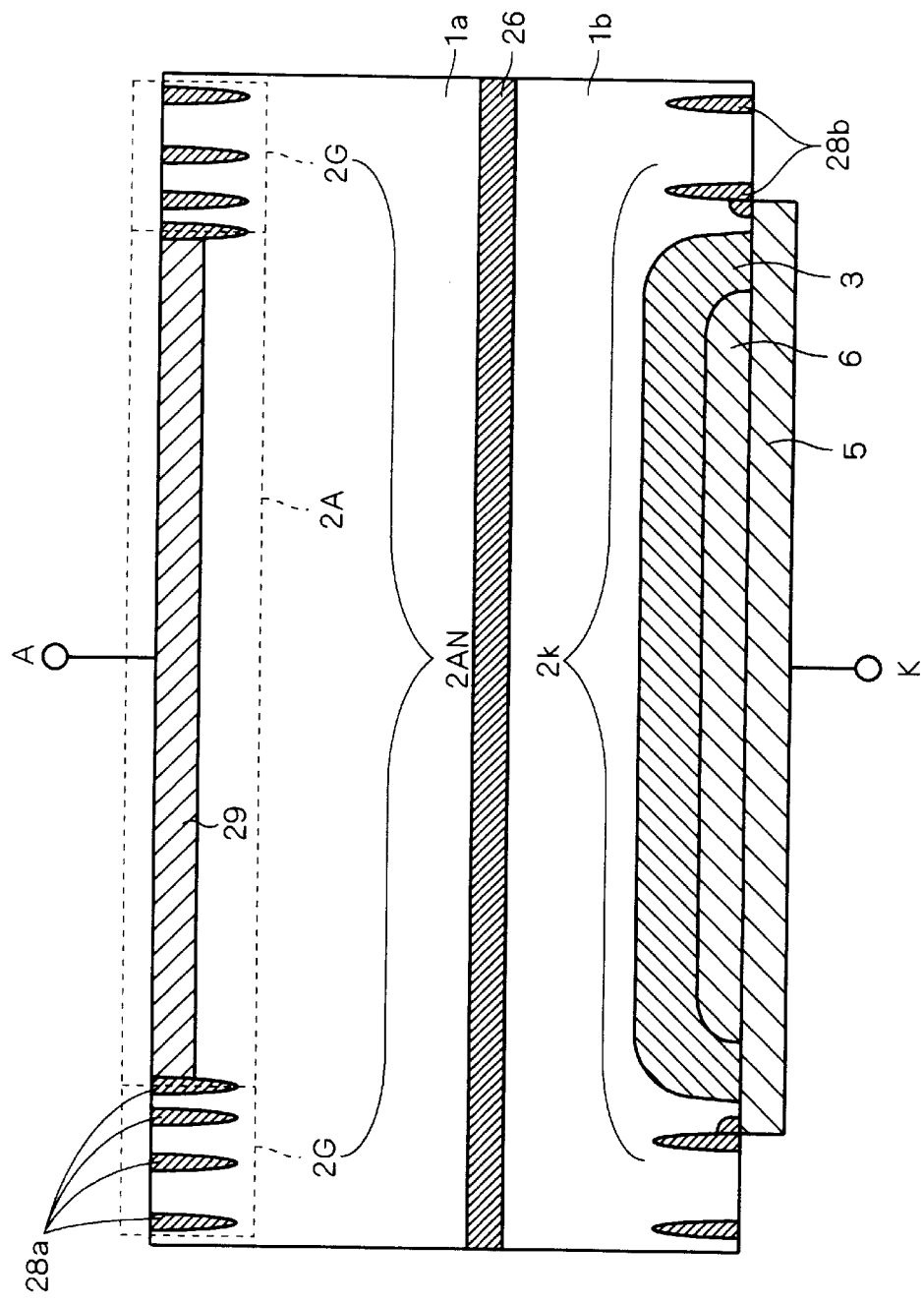
Figure 38:
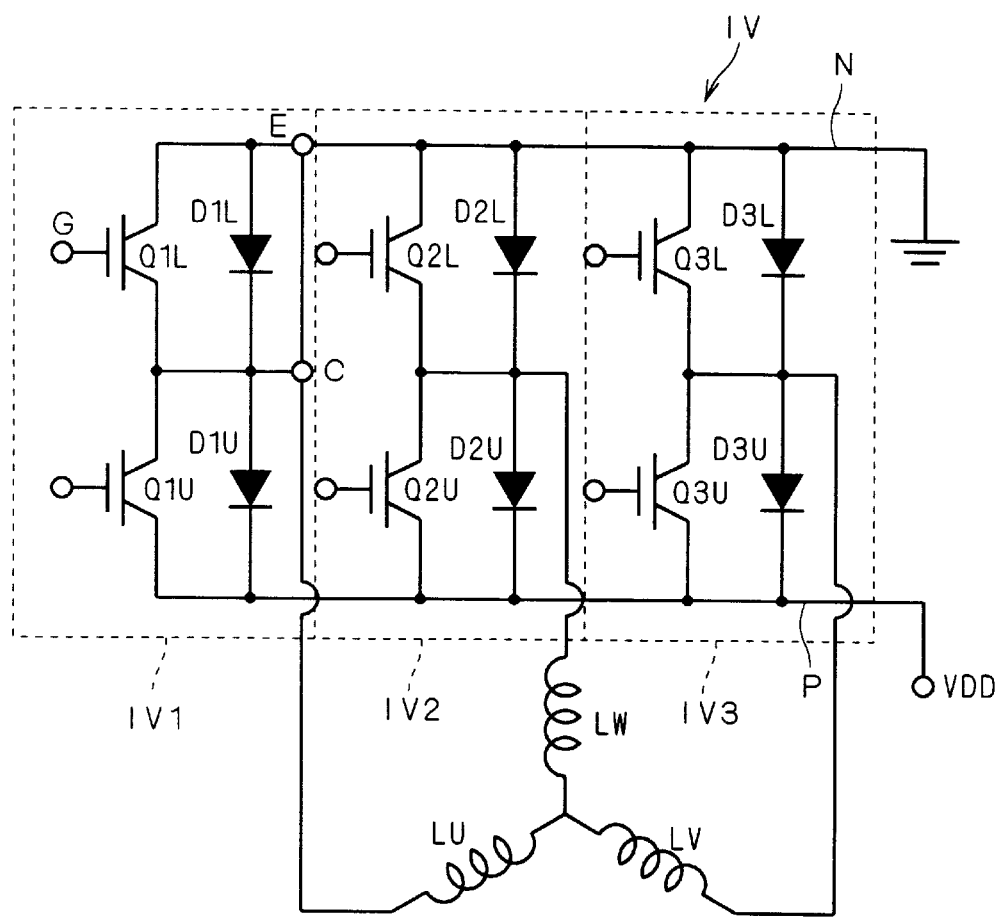
FIG. 38 illustrates a three-phase inverter.

The free wheeling diode 600 may be modified into a free wheeling diode 600D shown in FIG. 37. Specifically, the free wheeling diode 600D has the metal layer (or highconcentration n-type semiconductor layer) 26 positioned closer to the cathode-side structure 2K than the middle of the thickness of the silicon substrate 1. For purposes of convenience, the metal layer 26 shall divide the silicon substrate 1 into two parts: the substrate 1a which is closer to the anode-side structure 2AN and the substrate 1b which is closer to the cathode-side structure 2K. The metal layer may be a single metal layer or an alloy layer.

The free wheeling diode 600D having the metal layer (or high-concentration n-type semiconductor layer) 26 is manufactured by depositing a layer of metal such as aluminum on a shallow region of one or both of the silicon substrates 1a and 1b by sputtering or implanting ions of an n-type impurity such as phosphorus and arsenic into the shallow region of one or both of the silicon substrates 1a and 1b after the step shown in FIGS. 30 and 31 and before the bonding of the silicon substrates 1a and 1b in the manufacturing method of the free wheeling diode 600 described with reference to FIGS. 28 through 33.

The use of the arrangement of the free wheeling diode 600D decreases the resistance of the metal layer (or highconcentration n-type semiconductor layer) 26 to decrease the on-state voltage.

<G. Other Applications of the Invention>

Although the present invention is applied to the trench-type IGBT in the first to fifth preferred embodiments, the present invention may be applied to a planar IGBT to produce similar effects.

Although the present invention is applied to the n-channel IGBT, the n-channel MOS transistor and a $p^+/n$ diode, the present invention may be applied to an n-channel IGBT, an n-channel MOS transistor and a $p^-/n^+$ diode to produce similar effects.

The n-type cathode region 6 and the n-type buffer layer 3 in the first to fourth, and sixth preferred embodiments may be eliminated if a contact resistance with the electrode is sufficiently lowered.

The p-type semiconductor regions 12 in the first to fifth preferred embodiments may be eliminated if a contact resistance with the electrode is sufficiently lowered.

While the invention has been described in detail, the foregoing description is in all aspects illustrative and not restrictive. It is understood that numerous other modifications and variations can be devised without departing from the scope of the invention.

What is claimed is:

1. A power semiconductor device comprising:
a first semiconductor layer of a first conductivity type;
an assembly of units including a first semiconductor region of a second conductivity type selectively formed in a first main surface of said first semiconductor layer, a second semiconductor region of the first conductivity type selectively formed in a surface of said first semiconductor region, a gate insulation film formed in contact with at least the surface of said first semiconductor region between said second semiconductor region and said first semiconductor layer, and a gate electrode formed on said gate insulation film;
a first main electrode formed in contact with at least said second semiconductor region;
a second semiconductor layer of the second conductivity type selectively formed in a second main surface of said first semiconductor layer in corresponding relation to a region in which said assembly of units is formed;
a second main electrode formed in contact with a surface of said second semiconductor layer; and
a current suppressing device for suppressing a main current flowing into said first semiconductor layer around said second semiconductor layer under a predetermined condition when a voltage is applied to said gate electrode so as to form a channel in said first semiconductor region.

2. The power semiconductor device according to claim 1, wherein said current suppressing device includes a pn junction diode,
said pn junction diode including a second conductivity type semiconductor layer electrically connected to said first semiconductor layer around said second semiconductor layer, and a first conductivity type semiconductor layer electrically connected to said second main electrode, and
wherein said predetermined condition includes a condition that a voltage applied to said second main electrode is greater than a voltage applied to said first main electrode.

3. The power semiconductor device according to claim 2, wherein said pn junction diode includes:
- said second conductivity type semiconductor layer formed on a region in which said first semiconductor layer around said second semiconductor layer is formed; and
- said first conductivity type semiconductor layer formed on at least said second conductivity type semiconductor layer.

4. The power semiconductor device according to claim 1, wherein said current suppressing device includes a Schottky diode, said Schottky diode including:
- a third semiconductor layer of the second conductivity type formed on a metal electrode formed on said first semiconductor layer around said second semiconductor layer; and
- a metal layer formed in contact with said second main electrode and said third semiconductor layer,
- said metal layer being made of a material for Schottky connection to said third semiconductor layer, and
- wherein said predetermined condition includes a condition that a voltage applied to said second main electrode is greater than a voltage applied to said first main electrode.

5. The power semiconductor device according to claim 1, wherein said current suppressing device includes a Schottky diode, said Schottky diode including:
- a third semiconductor layer of the second conductivity type formed on a metal electrode formed on said first semiconductor layer around said second semiconductor layer; and
- a metal layer,
- said metal layer being used also as said second main electrode,
- said metal layer being formed in contact with said second semiconductor layer and said third semiconductor layer,
- said metal layer being made of a material for ohmic connection to said second semiconductor layer and for Schottky connection to said third semiconductor layer, and
- wherein said predetermined condition includes a condition that a voltage applied to said second main electrode is greater than a voltage applied to said first main electrode.

6. The power semiconductor device according to claim 5, wherein said third semiconductor layer is made of a semiconductor material having a greater electron affinity than silicon.

7. The power semiconductor device according to claim 1, wherein said current suppressing device includes a MOS transistor,
- said MOS transistor including a gate electrode, a first MOS transistor main electrode electrically connected to said first semiconductor layer around said second semiconductor layer, and a second MOS transistor main electrode electrically connected to said second main electrode, and
- wherein a voltage applied to said gate electrode and a voltage applied to the gate electrode of said MOS transistor complementarily turn on said gate electrode and the gate electrode of said MOS transistor.

8. The power semiconductor device according to claim 1, further comprising:
- a first lifetime setting region formed in a region extending in a direction of the thickness of said first semiconductor layer from a region in which said first semiconductor layer around said second semiconductor layer is formed; and
- a second lifetime setting region formed in said first semiconductor layer adjacent said second semiconductor layer in corresponding relation to a region in which said second semiconductor layer is formed,
- wherein a carrier lifetime in said first and second lifetime setting regions is shorter than a carrier lifetime in said first semiconductor layer.

9. The power semiconductor device according to claim 8, wherein the carrier lifetime in said second lifetime setting region is shorter than that in said first lifetime setting region.

* * * * *